United States Patent
Yamasaki et al.

(10) Patent No.: US 6,873,635 B2
(45) Date of Patent: Mar. 29, 2005

(54) NITRIDE SEMICONDUCTOR LASER DEVICE AND OPTICAL INFORMATION REPRODUCTION APPARATUS USING THE SAME

(75) Inventors: Yukio Yamasaki, Daito (JP); Shigetoshi Ito, Ikoma (JP)

(73) Assignee: Sharp Kabushiki Kaisha, Osaka (JP)

(*) Notice: Subject to any disclaimer, the term of this patent is extended or adjusted under 35 U.S.C. 154(b) by 143 days.

(21) Appl. No.: 10/076,850

(22) Filed: Feb. 14, 2002

(65) Prior Publication Data

US 2002/0141469 A1 Oct. 3, 2002

(30) Foreign Application Priority Data

Feb. 14, 2001 (JP) .......................................... 2001-037759
Feb. 8, 2002 (JP) .......................................... 2002-031791

(51) Int. Cl.[7] .............................................. H01S 5/00
(52) U.S. Cl. .............................. 372/45; 372/43; 372/44
(58) Field of Search .............................. 372/43, 44, 45

(56) References Cited

U.S. PATENT DOCUMENTS 6,215,803 B1 * 4/2001 Hata ........................... 372/46

FOREIGN PATENT DOCUMENTS

JP 10-270792 10/1998

OTHER PUBLICATIONS

Nakamura, S. et al. (1996). "Room–temperature continuous–wave operation of InGaN multi–quantum–well structure laser diodes" *Appl. Phys. Lett.* 69 (26): 4056–4058.

* cited by examiner

*Primary Examiner*—Minsun Oh Harvey
*Assistant Examiner*—Cornelius H Jackson
(74) *Attorney, Agent, or Firm*—Morrison & Foerster LLP

(57) ABSTRACT

A nitride semiconductor laser device includes a first-conductivity-type cladding layer formed of a nitride semiconductor material; an active layer formed of a nitride semiconductor material; and a second-conductivity-type cladding layer formed of a nitride semiconductor material. The first-conductivity-type cladding layer has a first main surface and a second main surface, the first main surfaces being closer to the active layer from the second main surface, and includes a first-conductivity-type first cladding layer and a first-conductivity-type second cladding layer having a different composition from that of the first-conductivity-type first cladding layer, which are provided in this order from the first main surface. The first-conductivity-type first cladding layer has a refractive index lower than that of the first-conductivity-type second cladding layer.

25 Claims, 24 Drawing Sheets

NITRIDE SEMICONDUCTOR LASER DEVICE AND OPTICAL INFORMATION REPRODUCTION APPARATUS USING THE SAME

CROSS-REFERENCE TO RELATED APPLICATIONS

This application claims priority to Japanese Patent Application Number 2001-037759 filed Feb. 14, 2001, and Japanese Patent Application Number 2002-031791 filed Feb. 8, 2002, the content of which is incorporated herein by reference in its entirety.

BACKGROUND OF THE INVENTION

1. Field of the Invention

The present invention relates to a semiconductor laser device using a nitride semiconductor, and an optical information reproduction apparatus including such a semiconductor laser device. In particular, the present invention relates to a nitride semiconductor laser device having a low operating voltage and which generates a light spot having an ellipticity close to 1, and an optical information reproduction apparatus including such a nitride semiconductor laser device.

2. Description of the Related Art

Semiconductor laser devices for generating light in wavelength regions of blue to purple light have been produced for tests using nitride semiconductor materials represented by, for example, GaN, InN, AlN and mixtures thereof. Such semiconductor laser devices are reported in, for example, Shuji NAKAMURA et al., Appl. Phys. Lett. Vol. 69 (1996), pp. 4056–4058.

FIG. 17 is a partial schematic cross-sectional view illustrating a structure of a conventional nitride semiconductor laser device 1700 oscillating at a wavelength of 410 nm. The semiconductor laser device 1700 includes an n-GaN layer 171 (thickness: 3 $\mu$m), an n-$In_{0.05}Ga_{0.95}N$ buffer layer 172 (thickness: 30 nm), an n-$Al_{0.05}Ga_{0.95}N$ cladding layer 173 (thickness: 0.5 $\mu$m), an n-GaN optical waveguide layer 174 (thickness: 0.1 $\mu$m), an $In_{0.2}Ga_{0.8}N/n-In_{0.05}Ga_{0.95}N$ triple quantum well active layer 175 (thickness: 4 nm/8 nm×3MQW), a p-$Al_{0.2}Ga_{0.8}N$ layer 176 (thickness: 20 nm), a p-GaN optical waveguide layer 177 (thickness: 0.1 $\mu$m), a p-$Al_{0.05}Ga_{0.95}N$ cladding layer 178 (thickness: 0.5 $\mu$m), and a p-GaN contact layer 179 (thickness: 0.2 $\mu$m). These layers are sequentially formed. A stripe ridge structure having a width of 2 $\mu$m is provided by partially etching the contact layer 179 and the p-cladding layer 178. Etching is stopped at a level in the p-cladding layer 178. An insulating layer 180 is provided so as to cover the exposed flat surfaces of the p-cladding layer 178 and side surfaces of the stripe ridge structure. An electrode 181 is provided on the insulating layer 180 and the contact layer 179. The semiconductor laser device 1700 has a waveguide structure in which the active layer 175 and the optical waveguide layers 174 and 177 are interposed between the cladding layers 173 and 178. Light generated in the active layer 175 is confined in the waveguide structure, and thus laser oscillation is caused.

The above-described conventional semiconductor laser device 1700 has the following problems.

When the present inventors produced semiconductor laser devices having the above-described structure, the resultant FFP(far field pattern) had an elliptical shape in which the full angle of half maximum (FAHM) in the perpendicular direction $\Theta\perp$ was 18 degrees, the full angle of half maximum in the horizontal direction $\Theta\|$ was 8 degrees, and the ellipticity (ratio between the full angle of half maximum in the perpendicular direction and the full angle of half maximum in the horizontal direction) was equal to or greater than 2. Therefore, the above-mentioned conventional semiconductor laser device has problems of, for example, (i) requiring a higher operating power due to the reduction in the power density and (ii) being unable to read information which is recorded at high density when the semiconductor laser device is used in an optical information reproduction apparatus.

An optical information reproduction apparatus usually includes two triangular prisms as shown in FIG. 18 for converting the elliptical spot of a light beam into a circular spot. FIG. 18 schematically shows a structure of a conventional optical information reproduction apparatus. It should be noted that FIG. 18 excludes parts which are not necessary for this explanation for the sake of simplicity. As shown in FIG. 18, the conventional optical information reproduction apparatus includes a base table 1001, a conventional semiconductor laser device 1002 set on the base table 1001, a coupling lens 1003, a shaping prism 1004, a beam splitter 1005, a disc 1006, and a photodetector 1007. In this apparatus, the shaping prism 1004 converts the elliptical spot of a light beam into a circular spot. The optical information reproduction apparatus including such a semiconductor laser device is inevitably large in scale and high in production cost.

This means that it is necessary to improve the ellipticity without increasing the operating power of the semiconductor laser device. However, it is not easy to separately control the operating power and the full angle of half maximum for the FFP, for the following reasons.

One technique for improving the ellipticity is to reduce the full angle of half maximum in the perpendicular direction $\Theta\perp$. In order to realize this, light confinement in the perpendicular direction needs to be weakened, which can be realized by, most effectively, increasing the Al content of the p- or n-cladding layer to reduce the refractive index. However, when light confinement in the perpendicular direction is weakened, the threshold current for causing laser oscillation is increased, and thus the operating power of the semiconductor laser device is increased.

Another technique for improving the ellipticity is to increase the full angle of half maximum in the horizontal direction $\Theta\|$. In order to realize this, light confinement in the horizontal direction needs to be strengthened, which can be realized by increasing the height of the ridge or reducing the refractive indices of the materials used for the buried layers. However, when light confinement in the horizontal direction is excessively strengthened, the semiconductor laser device suffers from another problem in that a high order lateral mode is likely to be caused. In other words, the degree of light confinement in the horizontal direction is naturally determined based on the contradictory relationship of sufficient suppression of the high order lateral mode and the sufficient strength of light confinement in the horizontal direction. Therefore, the full angle of half maximum in the horizontal direction $\Theta\|$ can only be increased to an upper limit, which is in the range of 6 degrees to 10 degrees.

As described above, the conventional semiconductor laser device cannot allow the full angle of half maximum for the FFP to be improved without increasing the operating power, merely by changing the refractive indices of the nitride semiconductor materials or thicknesses of the layers.

Therefore, an optical information reproduction apparatus including the conventional semiconductor laser device is limited in size reduction and power savings.

SUMMARY OF THE INVENTION

According to one aspect of the invention, a nitride semiconductor laser device includes a first-conductivity-type cladding layer formed of a nitride semiconductor material; an active layer formed of a nitride semiconductor material; and a second-conductivity-type cladding layer formed of a nitride semiconductor material. The first-conductivity-type cladding layer has a first main surface and a second main surface, the first main surface being closer to the active layer than the second main surface, and includes a first-conductivity-type first cladding layer and a first-conductivity-type second cladding layer having a different composition from that of the first-conductivity-type first cladding layer, which are provided in this order from the first main surface. The first-conductivity-type first cladding layer has a refractive index lower than that of the first-conductivity-type second cladding layer.

In one embodiment of the invention, the nitride semiconductor laser device further includes a first-conductivity-type contact layer formed of a nitride semiconductor material provided on the second main surface of the first-conductivity-type cladding layer, wherein the first-conductivity-type contact layer has a refractive index higher than the effective refractive index of the laser oscillation mode and is formed of a material which is transmissive with respect to light having a laser oscillation wavelength of the laser oscillation mode.

In one embodiment of the invention, a distance between the first-conductivity-type second cladding layer and the active layer is 0.34 μm or less in a thickness direction of the nitride semiconductor laser device.

In one embodiment of the invention, a distance between the first-conductivity-type first cladding layer and the active layer is 0.05 μm or more and 0.24 μm or less in a thickness direction of the nitride semiconductor laser device.

In one embodiment of the invention, the first-conductivity-type first cladding layer has a thickness of 0.02 μm or more and 0.15 μm or less.

In one embodiment of the invention, the second-conductivity-type cladding layer has a third main surface and a fourth main surface, the third main surface being closer to the active layer than the fourth main surface, and includes a second-conductivity-type first cladding layer and a second-conductivity-type second cladding layer having a different composition from that of the second-conductivity-type first cladding layer, which are provided in this order from the third main surface of the second-conductivity-type cladding layer. The second-conductivity-type first cladding layer has a refractive index lower than that of the second-conductivity-type second cladding layer.

In one embodiment of the invention, a distance between the second-conductivity-type second cladding layer and the active layer is 0.34 μm or less in a thickness direction of the nitride semiconductor laser device.

In one embodiment of the invention, a distance between the second-conductivity-type first cladding layer and the active layer is 0.05 μm or more and 0.24 μm or less in a thickness direction of the nitride semiconductor laser device.

In one embodiment of the invention, the second-conductivity-type first cladding layer has a thickness of 0.02 μm or more and 0.15 μm or less.

In one embodiment of the invention, the nitride semiconductor laser device includes a horizontal direction light confinement ridge structure on the side of the first-conductivity-type cladding layer with respect to the active layer.

In one embodiment of the invention, the first-conductivity-type first cladding layer has a flat portion and a stripe convex portion, and at least the first-conductivity-type second cladding layer is provided substantially on the entirety of a top surface of the stripe convex portion.

In one embodiment of the invention, the nitride semiconductor laser device further includes a buried layer of a second conductivity type or of a high resistance so as to cover a top surface of the flat portion, side surfaces of the stripe convex portion and side surfaces of the first-conductivity-type second cladding layer, wherein the buried layer has a refractive index which is substantially equal to that of the first-conductivity-type first cladding layer.

In one embodiment of the invention, the buried layer is formed of InGaAlN or AlGaN having substantially an equal composition of that of the first-conductivity-type first cladding layer.

In one embodiment of the invention, the first-conductivity-type first cladding layer and first-conductivity-type second cladding layer each contain at least AlGaN.

In one embodiment of the invention, an Al content of the first-conductivity-type first cladding layer y1, an Al content of the first-conductivity-type second cladding layer y2, and a thickness of the first-conductivity-type first cladding layer d [μm] are in the ranges of:

$0.02 \leq d \leq 0.05;$ $-0.557+11.128 \times y1 - 75.583 \times y1^2 + 224.67 \times y1^3 - 246.67 \times y1^4 \leq y2 \leq 0.0036 + 0.90169 \times y1;$ $y2 < y1 \leq 0.30;$ and $0.04 \leq y2 \leq 0.15,$ or $0.05 \leq d \leq 0.10;$ $y2 \leq 0.0086 + 0.89 \times y1;$ $y2 < y1 \leq 0.30;$ and $0.04 \leq y2 \leq 0.15,$ or $0.10 \leq d \leq 0.15;$ $y2 \leq 0.017974 + 0.90169 \times y1;$ $y2 < y1 \leq 0.30;$ and $0.04 \leq y2 \leq 0.15.$ In one embodiment of the invention, an Al content of the first-conductivity-type first cladding layer y1, an Al content of the first-conductivity-type second cladding layer y2, and a thickness of the first-conductivity-type first cladding layer d [μm] are in the ranges of:

$0.02 \leq d \leq 0.05;$ $0.030851 \times y1^{(-0.27442)} \leq y2;$ $y2 < y1 \leq 0.30;$ and $0.04 \leq y2 \leq 0.15,$ or $0.05 \leq d \leq 0.10$;

$0.016137 \times y1^{(-0.52323)} \leq y2 \leq 0.094234 \times y1^{(-0.35119)}$;

$y2 < y1 \leq 0.30$; and $0.04 \leq y2 \leq 0.15$, or $0.10 \leq d \leq 0.15$;

$y2 \leq 0.031792 \times y1^{(-0.95084)}$;

$y2 < y1 \leq 0.30$; and $0.04 \leq y2 \leq 0.15$.

In one embodiment of the invention, an Al content of the first-conductivity-type first cladding layer y1, an Al content of the first-conductivity-type second cladding layer y2, and a thickness of the first-conductivity-type first cladding layer d [μm] are in the ranges of:

$0.05 \leq d \leq 0.15$;

$0.04 \leq y1 \leq 0.08$; and $0.10 \leq y2 \leq 0.20$.

In one embodiment of the invention, the second-conductivity-type first cladding layer and the second-conductivity-type second cladding layer each contain at least AlGaN.

In one embodiment of the invention, an Al content of the second-conductivity-type first cladding layer x1, an Al content of the second-conductivity-type second cladding layer x2, and a thickness of the second-conductivity-type first cladding layer d' [μm] are in the ranges of:

$0.02 \leq d' \leq 0.05$;

$-0.557 + 11.128 \times x1 - 75.583 \times x1^2$;

$+224.67 \times x1^3 - 246.67 \times x1^4 \leq x2 \leq 0.0036 + 0.90169 \times x1$;

$x2 < x1 \times 0.30$; and $0.04 \leq x2 \leq 0.15$, or $0.05 \leq d' \leq 0.10$;

$x2 \leq 0.0086 + 0.89 \times x1$;

$x2 < x1 \leq 0.30$; and $0.04 \leq x2 \leq 0.15$, or $0.10 \leq d' \leq 0.15$;

$x2 \leq 0.017974 + 0.90169 \times x1$;

$x2 < x1 \leq 0.30$; and $0.04 \leq x2 \leq 0.15$.

In one embodiment of the invention, an Al content of the second-conductivity-type first cladding layer x1, an Al content of the second-conductivity-type second cladding layer x2, and a thickness of the second-conductivity-type first cladding layer d' [μm] are in the ranges of:

$0.02 \leq d' \leq 0.05$;

$0.030851 \times x1^{(-0.27442)} \times x2$;

$x2 < x1 \leq 0.30$; and $0.04 \leq x2 \leq 0.15$, or $0.05 \leq d' \leq 0.10$;

$0.016137 \times x1^{(-0.52323)} \leq x2 \leq 0.094234 \times x1^{(-0.35119)}$ and $x2 < x1 \leq 0.30$; and $0.04 \leq x2 \leq 0.15$, or $0.10 \leq d' \leq 0.15$;

$x2 \leq 0.031792 \times x1^{(-0.95084)}$;

$x2 < x1 \leq 0.30$; and $0.04 \leq x2 \leq 0.15$.

In one embodiment of the invention, an Al content of the second-conductivity-type first cladding layer x1, an Al content of the second-conductivity-type second cladding layer x2, and a thickness of the second-conductivity-type first cladding layer d' [μm] are in the ranges of:

$0.05 \leq d' \leq 0.15$;

$0.04 \leq x1 \leq 0.08$; and $0.10 \leq x2 \leq 0.20$.

In one embodiment of the invention, the first-conductivity-type second cladding layer has an Al content which is 0.03 or more and 0.10 or less.

According to another aspect of the invention, a nitride semiconductor laser device includes a first-conductivity-type cladding layer formed of a nitride semiconductor material; an active layer formed of a nitride semiconductor material; and a second-conductivity-type cladding layer formed of a nitride semiconductor material. The first-conductivity-type cladding layer and the second-conductivity-type cladding layer each include a layer having a total thickness of 0.4 μm or more and formed of a material having a refractive index lower than at least an effective refractive index of a laser oscillation mode. The layer having a total thickness of 0.4 μm in the first-conductivity-type cladding layer includes at least a first-conductivity-type first cladding layer and a first-conductivity-type second cladding layer which have different compositions from each other. The first-conductivity-type first cladding layer has a refractive index lower than the refractive index of the first-conductivity-type second cladding layer.

According to still another aspect of the invention, an optical information reproduction apparatus for reproducing information recorded on an optical disc having an information recording surface, by converting light which is emitted by a light source to the optical disc and then reflected by the optical disc, includes the above-described nitride semiconductor laser device as a light source.

Thus, the invention described herein makes possible the advantages of providing a nitride semiconductor laser device for improving the ellipticity without increasing the operating power and an optical information reproduction apparatus including such a nitride semiconductor laser device, which optical information reproduction apparatus is more compact and consumes less power.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

In this specification, the term "perpendicular direction" is defined to represent a thickness direction of the nitride semiconductor laser device, and the term "horizontal direction" is defined to represent a direction parallel to main surfaces of the nitride semiconductor layers and also parallel to the width direction of the stripe ridge.

In this specification, various distances between various layers are distances in the thickness direction.

Figure 1:
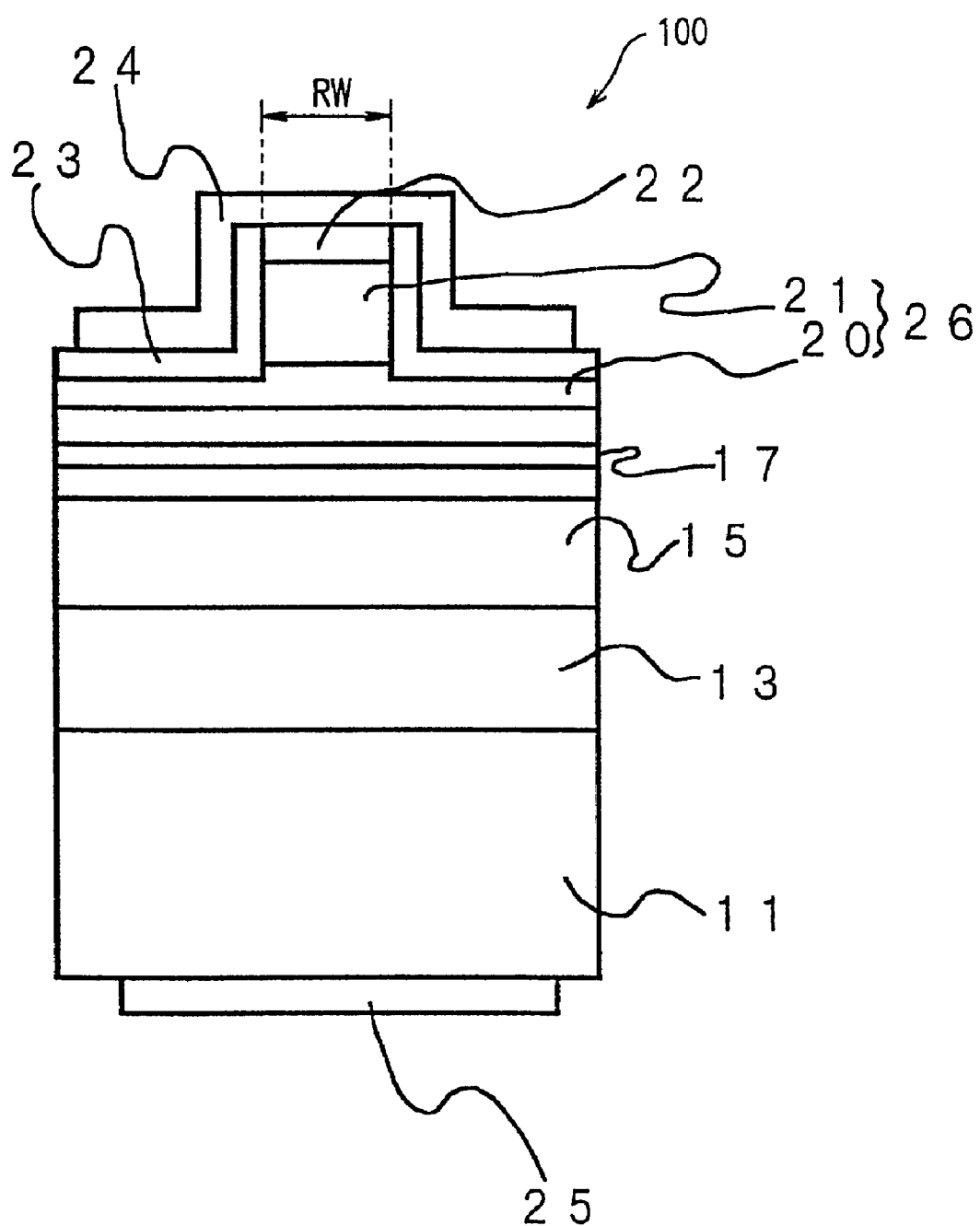
FIG. 1 is a schematic cross-sectional view illustrating a structure of a nitride semiconductor laser device according to one example of the present invention.

FIG. 1 is a schematic cross-sectional view illustrating a nitride semiconductor laser device 100 according to one example of the present invention. The nitride semiconductor laser device 100 includes an active layer 17 which is interposed between an n-cladding layer 15 formed of an n-type nitride semiconductor material and a p-cladding layer 26 formed of a p-type nitride semiconductor material. The p-cladding layer 26 includes at least two layers having different refractive indices from each other. (Such a p-cladding layer including at least two p-cladding layers will also be referred to as a "p-cladding layer assembly".) In this example, the p-cladding layer 26 includes a first p-cladding layer 20 and a second p-cladding layer 21, and the refractive index of the first p-cladding layer 20 closer to the active layer than the second p-cladding layer 21 is lower than the refractive index of the second p-cladding layer 21.

The p-cladding layer 26 has two main surfaces. In this specification, the main surface of the p-cladding layer 26, which is closer to the active layer 17 than the other main surface, will be referred to as a "first main surface", and the other main surface will be referred to as a "second main surface". The n-cladding layer 15 has two main surfaces. In this specification, the main surface of the p-cladding layer 15, which is closer to the active layer 17 than the other main surface, will be referred to as a "third main surface", and the other main surface will be referred to as a "fourth main surface".

A ridge structure acting as a stripe waveguide of the nitride semiconductor laser device 100 is provided by partially etching the second p-cladding layer 21 and the first p-cladding layer 20. Etching is stopped at a level in the first p-cladding layer 20.

In the nitride semiconductor laser device 100, the second p-cladding layer 21 mainly acts to confine light of the laser oscillation mode in the perpendicular direction. The first p-cladding layer 20 having a refractive index lower than that of the second p-cladding layer 21 provides the following effects. In the following description, the first p-cladding layer 20, which has a refractive index lower than the refractive index of the other p-cladding layer(s) will be referred to as the "lower refractive index layer".

Improvement of the ellipticity can be realized by increasing a FAHM (full angle of half maximum) value for the horizontal FFP Θ∥. However, since the FAHM value for the horizontal FFP Θ∥ and the confinement factor for the active layer in the horizontal direction Γ∥ have a relationship in which when one is determined, the other is automatically determined. Therefore, when the FAHM value for the horizontal FFP Θ∥ is increased, the confinement factor for the active layer in the horizontal direction Γ∥ is also increased. (Hereinafter, the FAHM value for the horizontal FFP will also be referred to as the "Θ∥".) and the confinement factor for the active layer in the horizontal direction will also be referred to as the "Γ∥".) When the Γ∥ is excessively large, the high order lateral mode is likely to occur. In order to prevent this, a nitride semiconductor laser device is usually designed so that the Γ∥ is about 0.90 and the Θ∥ is about 8 degrees. Accordingly, the nitride semiconductor laser device is generally designed by adjusting the thickness d of the lower refractive index layer ("d" is the thickness of an area in the lower refractive index layer corresponding to the ridge) and the width of the ridge (represented by "RW" in FIG. 1), so that the Γ∥ is in the range of 0.85 to 0.95 and the Θ∥ is in the range of 6 degrees to 10 degrees, more preferably, so that the Γ∥ is in the range of 0.85 to 0.90 and the Θ∥ is in the range of 6 degrees to 8 degrees. The Γ∥ and the Θ∥ can be designed independently from the confinement factor for the active layer in the perpendicular direction Γ⊥ and the full angle of half maximum in the perpendicular direction Θ⊥. (Hereinafter, the confinement factor for the active layer in the perpendicular direction will be referred to as the "Γ⊥", and the full angle of half maximum in the perpendicular direction will be referred to as the "Θ⊥".) One object of the present invention is to decrease the Θ⊥ without decreasing the Γ⊥.

In order to achieve this objective, according to the present invention, the p-cladding layer 26 includes the lower refractive index layer. Hereinafter, the effects given to the light intensity distribution of the laser oscillation mode in the perpendicular direction by providing the lower refractive index layer will be described. (1) The provision of the lower refractive index layer increases the difference between the refractive index of the p-cladding layer and the refractive index of the active layer. This increases the relative light intensity of the laser oscillation mode in the active layer. (2) The provision of the lower refractive index layer decreases the average refractive index in the entirety of the region where the laser light expands in the perpendicular direction. Therefore, the refractive index influencing the laser oscillation light ($n_{eq}$) is decreased, and thus the difference of such a refractive index from the refractive index of the p-cladding layer 26 excluding the lower refractive index layer ($n_{clad}$) is reduced. The degree K at which the light intensity decreases in a thickness direction (x direction) in the cladding layer is represented by:

$$k = exp(-2\alpha x)$$

$$\alpha = \frac{2\pi}{\lambda} \sqrt{n_{eq}^2 - n_{clad}^2}$$

where λ represents the wavelength. These expressions are derived by calculating the electric field in a slab waveguide. Since the difference between the $n_{eq}$ and $n_{clad}$ is decreased, α is reduced. Therefore, the relative light intensity in a region, and a vicinity thereof, including the p-cladding layer 26 excluding the lower refractive index layer (i.e., the bottom of the region of distribution of the light intensity of the laser oscillation mode in the perpendicular direction) increases. As a result, the relative light intensity of the laser oscillation mode in the active layer decreases.

As described above, the provision of the lower refractive index layer causes functions described in (1) and (2) which counteract each other. Therefore, even when the p-cladding layer includes a lower refractive index layer, the relative light intensity of the laser oscillation mode in the active layer in the perpendicular direction does not significantly change.

The provision of the lower refractive index layer also causes the light intensity distribution of the laser oscillation mode in the perpendicular direction to rapidly increase from the active layer toward the lower refractive index layer. Therefore, the full width of half maximum in the perpendicular direction increases. Since the FFP is a Fourier transform pattern of the light intensity distribution, the Θ⊥ decreases.

Accordingly, by providing the lower refractive index layer, the $\Theta\perp$ can be decreased while restricting the decrease in the relative light intensity of the laser oscillation mode in the perpendicular direction, i.e., the change in the threshold current density. As a result, the ellipticity of the light spot generated by the nitride semiconductor laser device can be improved.

In this example, the refractive index of the second p-cladding layer 21 is larger than the refractive index of the first p-cladding layer 20. The Al content of the second p-cladding layer 21 is smaller than the Al content of the first p-cladding layer 20. One problem with a general nitride semiconductor laser device is that as the Al content is larger in a p-cladding layer, the resistance of the p-cladding layer is larger. Especially in a nitride semiconductor laser device, the ridge acting as an optical waveguide has a smaller width than the width of a semiconductor laser device formed of other materials. Therefore, the problem of the rise in the driving voltage is more serious than in the semiconductor laser device formed of other materials. The nitride semiconductor laser device 100 in this example has an advantage of having a reduced driving voltage since the second p-cladding layer 21 has a small Al content and thus a small resistance.

In a nitride semiconductor laser device according to the present invention, at least either a p-cladding layer or an n-cladding layer includes a layer having a refractive index lower than an effective refractive index of the laser oscillation mode, the layer having a thickness of 0.4 $\mu$m or more. At least either a p-cladding layer or an n-cladding layer including the above-mentioned layer having such a low refractive index may further include a layer having a refractive index higher than the effective refractive index of the laser oscillation mode (referred to as a "high refractive index layer"). The high refractive index layer may include two or more layers which are sequentially provided. It should be noted, though, that the high refractive index layer has a total thickness of 0.02 $\mu$m or less.

The reason that the layer having a refractive index lower than the effective refractive index of the laser oscillation mode is provided in a thickness of 0.4 $\mu$m or more is because the minimum thickness required to confine the light of the laser oscillation mode in the perpendicular direction is 0.4 $\mu$m. The reason that the thickness of the high refractive index layer is limited to a maximum of 0.02 $\mu$m is because such a thickness is sufficiently small with respect to the total thickness of the p-cladding layer or the n-cladding layer so as not to have an influence on the electric field distribution of the laser oscillation mode in the perpendicular direction.

Preferably, neither the p-cladding layer 26 nor the n-cladding layer 15 includes a layer having a refractive index higher than the effective refractive index of the laser oscillation mode (for example, a layer formed of $In_jGa_{1-j}N$, $0 \leq j$). The reason is that the light of the laser oscillation mode is absorbed into such a layer and is likely to cause a ripple in the vertical FFP.

In this example, the first p-cladding layer 20 and the second p-cladding layer 21 are both a part of the p-cladding layer 26 and both have a refractive index lower than an effective refractive index of the laser oscillation mode.

In order to allow a semiconductor laser device to act properly, it is indispensable to confine light in the laser oscillation mode in the perpendicular direction. For this purpose, the second p-cladding layer 21 needs to have a refractive index lower than the effective refractive index of the laser oscillation mode.

A nitride semiconductor laser device including a first p-cladding layer having a refractive index higher than the effective refractive index of the laser oscillation mode has the following problems.

In the case where the first p-cladding layer is on the first main surface of the p-cladding layer assembly, the $\Gamma\perp$ is smaller and the $\Theta\perp$ is larger than those of the nitride conventional semiconductor laser. Thus, the objective of the present invention cannot be achieved.

In the case where the first cladding layer is distanced from the main surface of the p-cladding layer assembly by 0.05 $\mu$m or less, light is confined in the first p-cladding layer. As a result, the perpendicular FFP of the laser oscillation mode is of a shape having a plurality of peaks. When such a nitride semiconductor laser device is used in an optical information reproduction apparatus, two or more light spots are formed after the light is transmitted through the lens, which causes a serious problem.

For these reasons, the first p-cladding layer 20 needs to have a refractive index lower than the effective refractive index of the laser oscillation mode.

The effective refractive index of a laser oscillation mode can be obtained by calculating the electric field distribution in a slab waveguide in a usual manner. For example, see M. J. Bergmann and H. C. Casey, Jr., J. Appl. Phys. Vol. 84 (1998), pp. 1196–1203. The refractive index n of each material of each layer in an oscillation wavelength $\lambda$ [nm], which is a parameter for calculating the electric field distribution, is obtained as follows. Here, the oscillation wavelength $\lambda$ is in the range of 300 nm to 800 nm.

First, a parameter Eg [eV] of each material is given by the following expression.

For $In_sGa_{1-s}N$ ($0 \leq s \leq 1$), $$Eg = Eg_1[s] = 3.42(1-s) + 2.65s - 3.94s(1-s).$$

For $Al_tGa_{1-t}N$ ($0 \leq t \leq 1$), $$Eg = Eg_2[t] = 3.42(1-t) + 6.2t - 1.057t(1-t).$$

$In_sAl_tGa_{1-s-t}N$ ($0<s<1$, $0<t<1$), $$Eg = \{sEg_1[s+t] + tEg_2[s+t]\}/(s+t).$$

From the above, the refractive index is:

$$p[\lambda] = 1/[1/\lambda - (Eg-3.42)/1239.852].$$

When $p[\lambda] > 360.7$, $$n(p[\lambda]) = [4.3663801 + p^2/(p^2 - 295.2^2)]^{0.5}.$$

When $p[\lambda] \leq 360.7$, $$n(p[\lambda]) = c_0 + c_1 q + c_2 q^2 + c_3 q^3 + c_4 q^4$$

$$q = p[\lambda] - 360$$

$$c_0 = 2.718$$

$$c_1 = 9.976e-3$$

$$c_2 = 3.005e-4$$

$$c_3 = 4.584e-6$$

$$c_4 = 2.596e-8.$$

In this specification, the effective refractive index and the light intensity distribution in the perpendicular direction I(x) of the laser oscillation mode are obtained for each layer provided in the perpendicular direction by calculating the usual electric field distribution using the parameters defined above.

In this specification, the confinement factor for the active layer in the perpendicular direction $\Gamma\bot$ is defined as an amount which is defined by the following expression.

$$\Gamma_\bot = \frac{\int_c I(x)dx}{\int_{-\infty}^{+\infty} I(x)dx}$$

where I(x) is the light intensity distribution of the laser oscillation mode in the perpendicular direction, which is obtained for each layer provided in the perpendicular direction by calculating the electric field distribution, and c is an area occupied by the well layer of the semiconductor layer device in the x (i.e., perpendicular) direction.

In this specification, the confinement factor for the active layer in the horizontal direction $\Gamma\|$ is defined as an amount which is defined by the following expression.

$$\Gamma_\| = \frac{\int_{-W/2}^{W/2} I(y)dy}{\int_{-\infty}^{+\infty} I(y)dy}$$

where I(y) is the light intensity distribution of the laser oscillation mode in the horizontal direction, and $|y| \leq W/2$ is an area occupied by the stripe ridge of the semiconductor layer device in the y (i.e., horizontal) direction. The area occupied by the stripe ridge is represented by the average width W of the width of the top surface of the ridge and the bottom surface of the ridge.

The light intensity distribution of the laser oscillation mode in the horizontal direction, i.e., I(y), is obtained by calculating the electric field distribution in the horizontal direction in the slab waveguide in the following three layer structure, using the above-defined parameters. The three layer structure has a refractive index corresponding to (the effective refractive index calculated from the perpendicular structure in the stripe ridge +0.002). The three layer structure includes a layer having a thickness corresponding to the width of the stripe ridge, and two layers interposing this layer. The two layer each have a refractive index equal to the effective refractive index calculated from the perpendicular structure outside the stripe ridge. The value of 0.002 is a correcting coefficient which is added so that the calculation result of the light intensity distribution of the laser oscillation mode in the horizontal direction matches the actual light intensity distribution of the laser oscillation mode in the horizontal direction.

In this example, a p-contact layer 22 formed of a material transmissive of laser oscillation wavelength and having a refractive index higher than the effective refractive index of the laser oscillation mode may be provided on the second main surface of the p-cladding layer 26.

In a semiconductor laser device containing nitride semiconductor materials, a p-contact layer formed of p-GaN is provided in contact with a positive electrode conventionally in order to restrict the contact resistance between the positive electrode and a nitride semiconductor layer. When the p-contact layer is too thin, the laser oscillation mode is subjected to absorption loss by the positive electrode due to the transmissiveness of the p-contact layer with respect to the laser oscillation wavelength, and thus the threshold current density is increased, resulting in an increase in the operating power. When the p-contact layer is too thick, the laser oscillation mode is leaked toward the p-contact layer since the refractive index of the p-contact layer is higher than the effective refractive index of the laser oscillation mode, which, in turn, causes an increase in the threshold current density or a ripple in the far viewing field image. By contrast, in the present invention, the second p-cladding layer 21 confines the light of the laser oscillation mode in the active layer 17, Therefore, the above-described problem can be solved.

In this example, the first p-cladding layer 20 (i.e., the lower refractive index layer) may be provided anywhere in the p-cladding layer 26. The first p-cladding layer 20 may be, for example, on the first main surface of the p-cladding layer 26 or may be distanced from the first main surface. The distance between the second p-cladding layer 21 and the active layer 17 is 0.34 µm or less, for the following reason. In the case where the distance between the second p-cladding layer 21, which confines the light of the laser oscillation mode in the perpendicular direction, and the active layer 17 is too large, the first p-cladding layer 20 having the lower refractive index acts to confine the light in the perpendicular direction. In such a case, the effect of the present invention is not provided.

The distance between the first p-cladding layer 20 and the active layer 17 is preferably 0.24 µm or less in a thickness direction of the nitride semiconductor laser device 100, for the following reason. In the case where the distance between the first p-cladding layer 20 and the active layer 17 is more than 0.24 µm, the following problems occur. In a structure in which the first p-cladding layer 20 is distanced from the first main surface of the p-cladding layer 26, the influence of the first p-cladding layer 20 on the laser oscillation mode is weak, and thus the effect of the present invention is not sufficiently provided. In a structure in which the first p-cladding layer 20 is on the main surface of the p-cladding layer 26, the thickness of the optical waveguide layer is larger than 0.24 µm and therefore the confinement factor for the active layer of the laser oscillation mode is decreased.

The distance between the first p-cladding layer 20 and the active layer 17 is preferably 0.05 µm or more in a thickness direction of the nitride semiconductor laser device 100. In the case where the first p-cladding layer 20 is too close to the active layer 17, the laser oscillation mode is too strongly influenced by the first p-cladding layer 20. As a result, leakage of light of the laser oscillation mode toward the n-type semiconductor layers is increased. In this case, the effect of the present invention, in which the $\Theta\bot$ is decreased without decreasing the confinement factor for the active layer in the perpendicular direction $\Gamma\bot$, is weakened.

The thickness of the first p-cladding layer 20 is preferably 0.02 µm or more and 0.15 µm or less. In the case where the thickness of the first p-cladding layer 20 is less than 0.02 µm, the influence of the first p-cladding layer 20 on the laser oscillation mode is weakened. In the case where the thickness of the first p-cladding layer 20 is more than 0.15 µm, the first p-cladding layer 20 acts to confine the light of the laser oscillation mode in the perpendicular direction, and thus the influence of the second p-cladding layer 21 on the laser oscillation mode is weakened. The effect of the present invention provided by the two-layer structure of the p-cladding layer 26 is weakened.

The first p-cladding layer 20 is most preferably provided on the main surface of the p-cladding layer 26. At this position, the first p-cladding layer 20 provides the maximum possible influence on the laser oscillation mode.

In this example, the p-cladding layer 26 may include, on the first main surface thereof, a layer having a thickness of 0.02 µm or less and having a refractive index higher than the effective refractive index of the laser oscillation mode. The n-cladding layer 15 may also include a layer having a thickness of 0.02 μm or less and having a refractive index higher than the effective refractive index of the laser oscillation mode, on the third main surface of the n-cladding layer 15. Alternatively, the p-cladding layer 26 may include a buffer layer formed of GaN, AlGaN or InGaN by low temperature growth. The n-cladding layer 15 may also include a buffer layer formed of GaN, AlGaN or InGaN by low temperature growth. Such a buffer layer has a thickness of 0.02 μm or less and thus has very little influence on the laser oscillation mode.

The Al content in the p-cladding layer 26 may be generally continuously changed. The Al content in the p-cladding layer 26 in the n-cladding layer 15 may be generally continuously changed. A nitride semiconductor laser device, having such a structure and including an area in which the refractive index is gradually decreased toward the active layer, is encompassed in the scope of the present invention and provides the effect of the present invention. The thickness of such an area is preferably 0.02 μm or more and 0.2 μm or less, and more preferably 0.05 μm or more and 0.1 μm or less.

The p-cladding layer 26 and the n-cladding layer 15 may each have a superlattice structure which has two or more types of thin layers (thickness: less than 0.02 μm) having different compositions from each other alternately provided, as long as the superlattice structure fulfills the following conditions. Alternatively, the p-cladding layer 26 and the n-cladding layer 15 may each have two superlattice structures which have different Al contents from each other. In this case, the average refractive index of the superlattice structure farther from the active layer is higher than the average refractive index of the superlattice structure closer to the active layer. The average refractive index is obtained from the refractive indices of the layers included in each of the p-cladding layer 26 and the n-cladding layer 15.

In this example, the stripe ridge for confining light in the horizontal direction is provided on the side of the p-semiconductor layers with respect to the active layer 17. Alternatively, the stripe ridge for confining light in the horizontal direction is provided on the side of the n-semiconductor layers with respect to the active layer 17. Substantially the same effect is provided. It should be noted, though, that it is preferable to provide the stripe ridge on the side of the p-semiconductor layers with respect to the active layer 17 in order to improve the crystallinity.

A nitride semiconductor laser device according to the present invention may include another n-cladding layer having a refractive index lower than the refractive index of the n-cladding layer 15. The n-cladding layer having a lower refractive index is provided closer to the active layer 17 than the n-cladding layer 15. Alternatively, both a p-cladding layer and an n-cladding layer may include a layer having a lower refractive index. In this case, the effect of the present invention that the $\Theta\perp$ is decreased without decreasing the $\Gamma\perp$ is strengthened.

In this example, the stripe structure for confining light in the horizontal direction is preferably provided as a ridge and obtained by etching layers from the top surface of the nitride semiconductor laser device down to a level in the first p-cladding layer 20. In this case, the first p-cladding layer 20 includes a flat portion and a stripe convex portion. The second p-cladding layer 21 is substantially provided on the entirety of the top surface of the stripe convex portion. FIG. 1 shows a general position of the ridge for providing the $\Theta\|$ of 6 degrees to 10 degrees.

In this example, the nitride semiconductor laser device 100 may include a buried layer having a refractive index of the first p-cladding layer 20 (i.e., the lower refractive index layer). In this case, the buried layer is of an n-type or having a high resistance, and is provided so as to cover a top surface of the flat portion of the first p-cladding layer 20, side surfaces of the first p-cladding layer 20, and side surface of the second p-cladding layer 21. In such a structure, the influence of the variance in etching depth on the characteristics of the nitride semiconductor laser device is almost zero. This raises the production yield of the nitride semiconductor laser devices. The buried layer is preferably formed of an InGaAlN-based semiconductor material having the same composition as that of the first p-cladding layer 20. However, In does not uniformly exp and throughout the buried layer and is likely to segregate. Therefore, more preferably, the buried layer and the first p-cladding layer 20 are both formed of AlGaN, and the difference in the Al content between the buried layer and the first p-cladding layer 20 is 0.04 or less.

Instead of a layer having a refractive index higher than the refractive index of the p-cladding layer 26 and/or the n-cladding layer 15, a p-contact layer, an n-contact layer or a buffer layer may be provided outside the n-cladding layer 26 or the n-cladding layer 15. These layers are each formed of a material having a refractive index higher than the effective refractive index of the laser oscillation mode and each have a thickness of 0.02 μm or more. These layers are each distanced from the main surface of the p-cladding layer 26 or the third main surface of the n-cladding layer 15 by 0.4 μm or more, and therefore have very little influence on the laser oscillation mode.

An optical information reproduction apparatus according to the present invention includes a nitride semiconductor laser device according to the present invention having the above-described structure. The ellipticity of the light spot generated by the nitride semiconductor laser device according to the present invention is closer to 1 than the light spot in the conventional nitride semiconductor laser device. Therefore, the optical information reproduction apparatus according to the present invention can eliminate optical components, such as a triangular prism, which are indispensable in the conventional optical information reproduction apparatus. As a result, the optical information reproduction apparatus according to the present invention can be more compact in size and realize power savings.

Hereinafter, specific examples of the present invention will be described. The present invention is not limited to these examples.

EXAMPLE 1

Figure 2:
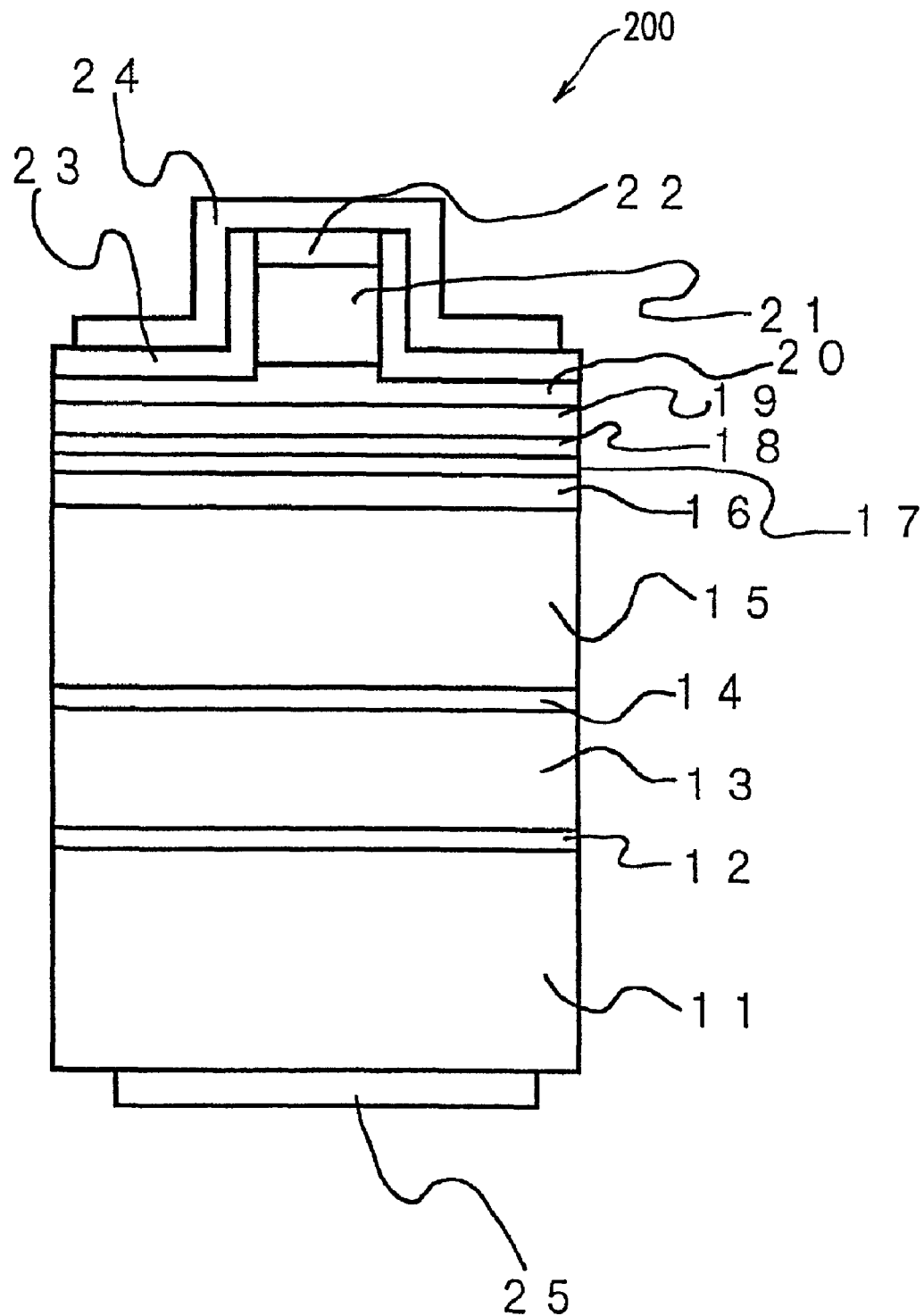
FIG. 2 is a schematic cross-sectional view illustrating a structure of a nitride semiconductor laser device according to a first example of the present invention.

FIG. 2 is a schematic cross-sectional view illustrating a structure of a nitride semiconductor laser device 200 according to a first example of the present invention. The nitride semiconductor laser device 200 includes two p-cladding layers, and the layer closer to the active layer has a lower refractive index than that of the other layer. A resonator in the waveguide of the nitride semiconductor laser device 200 has vertical faces.

As shown in FIG. 2, the nitride semiconductor laser device 200 includes the following layers each formed of a nitride semiconductor material: a substrate 11 (thickness: 30 μm to 300 μm) formed of n-GaN, a low temperature growth buffer layer 12 (thickness: 0 to 10 μm) formed of GaN, an n-GaN layer 13 (thickness: 0.1 μm to 10 μm), an n-buffer layer 14 (thickness: 0 to 200 nm) formed of n-In$_r$Ga$_{1-r}$N ($0 \leq r \leq 0.2$), an n-cladding layer 15 (thickness: 0.4 μm or more) formed of n-Al$_x$Ga$_{1-x}$N ($0.05 \leq x \leq 0.2$), an n-optical waveguide layer 16 (thickness: 0 to 0.15 μm) formed of n-GaN, an active layer 17 having a multiple quantum well structure (oscillation wavelength: 370 nm to 430 nm; total thickness: 5 nm to 60 nm) including $In_wGa_{1-w}N$ (v<w≦0.2) well layers and $n-In_vGa_{1-v}N$ (0≦v<w) barrier layers which are alternately laminated, a p-carrier block layer 18 (thickness: 0 to 0.04 μm, preferably 0 to 0.02 μm) formed of $p-Al_zGa_{1-z}N$ (0<z≦0.3), a p-optical waveguide layer 19 (thickness: 0.05 μm to 0.15 μm) formed of p-GaN, a first p-cladding layer 20 (thickness: 0.02 μm to 0.15 μm) formed of $p-Al_{y1}Ga_{1-y1}N$ (y2<y1<0.2), a second p-cladding layer 21 (thickness: equal to or greater than the thickness of the first p-cladding layer 20; for example, 0.4 μm) formed of $p-Al_{y2}Ga_{1-y2}N$ (0<y2<y1), and a p-contact layer 22 (thickness: 0.01 μm to 10 μm) formed of p-GaN.

A ridge structure acting as a stripe waveguide of the nitride semiconductor laser device 200 is provided by partially etching the p-contact layer 22, the second p-cladding layer 21 and the first p-cladding layer 20. Etching is stopped at a level in the second p-cladding layer 21. An insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i. e., surfaces parallel to the sheet of FIG. 2) act as mirrors, and thus form an optical resonator.

The nitride semiconductor laser device 200 in the first example can be produced, for example, as follows.

First, the substrate 11 (thickness: 30 μm to 300 μm) formed of n-GaN having (0001) C plane as a crystal growth surface is washed and introduced into an MOCVD apparatus. In the MOCVD apparatus, the substrate 11 is cleaned at a high temperature of about 1100° C. in an $H_2$ atmosphere.

Then, the temperature is lowered. While causing hydrogen ($H_2$) to flow as a carrier gas at a flow rate of 10 l/min, $SiH_4$ is introduced at a flow rate of 10 nmol/min. At 600° C., $NH_3$ and trimethyl gallium (TMG) are introduced respectively at a flow rate of 5 l/min. and at a flow rate of 20 mol/min. Thus, the low temperature growth buffer layer 12 formed of n-GaN is grown to a thickness of 0 to 10 μm (for example, 100 nm). In this example, n-GaN is used for the low temperature growth buffer layer 12. Alternatively, the buffer layer 12 may be formed of GaN by introducing $SiH_4$ at a flow rate of 0 mol/min., or can be formed of a layer including at least AlGaInN containing Al or In. For forming a layer containing Al, trimethyl aluminum (TMA) is introduced in an appropriate amount during the layer formation. For forming a layer containing In, trimethyl indium (TMI) is introduced in an appropriate amount during the layer formation.

Next, the temperature is raised to about 1050° C., and the carrier gas is changed from $H_2$ to $N_2$. $NH_3$ is caused to flow at a flow rate of 5 l/min. After the temperature is raised, the carrier gas is changed from $N_2$ to $H_2$, and TMG and $SiH_4$ are introduced respectively at a flow rate of 100 μmol/min. and at a flow rate of 10 nmol/min. Thus, the n-GaN layer 13 is grown to a thickness of 0.1 μm to 10 μm (for example, about 4 μm).

Then, the supply of TMG and $SiH_4$ is stopped, and the carrier gas is changed from $H_2$ to $N_2$. After the temperature is lowered to about 800° C., TMG and $SiH_4$ are introduced respectively at a flow rate of 15 μmol/min. and at a flow rate of 10 nmol/min. While causing TMI to flow at a certain flow rate, the n-buffer layer 14 formed of $n-In_rGa_{1-r}N$ (for example, r=0.07) is grown to a thickness of 0 nm to 200 nm (for example, about 50 nm).

Then, the supply of TMI, TMG and $SiH_4$ is stopped, and the temperature is again raised to 1050° C. The carrier gas is again changed from $N_2$ to $H_2$. TMG and $SiH_4$ are introduced respectively at a flow rate of 50 μmol/min. and at a flow rate of 10 nmol/min. While causing TMA to flow at a certain flow rate, the n-cladding layer 15 formed of $n-Al_xGa_{1-x}N$ (for example, x=0.1) is grown to a thickness of 0.4 μm or more (for example, 1 μm).

Then, the supply of TMA is stopped, and the flow rate of TMG is adjusted to be 100 μmol/min. Thus, the n-optical waveguide layer 16 formed of n-GaN is grown to a thickness of 0 to 0.15 μm (for example, 100 nm). The n-optical waveguide layer 16 may be a non-doped layer.

Thereafter, the supply of TMG is stopped, and the carrier gas is changed from $H_2$ to $N_2$. The temperature is lowered to 700° C. TMI is introduced at a certain flow rate, and TMG is also introduced at a flow rate of 15 μmol/min. Thus, the $n-In_vGa_{1-v}N$ (for example, v=0.023) barrier layer is grown. Then, the flow rate of TMI is increased. Thus, the $In_wGa_{1-w}N$ (for example, w=0.070) well layer is grown. By repeating this process, the multiple quantum well layer (or active layer) 17 including the barrier layers and the well layers alternately laminated is formed. The ratios of In and Ga in the barrier layers and the well layers and the thicknesses of the barrier layers and the well layers are designed so that the emission wavelength is in the range of 370 nm to 430 nm. The flow rate of TMI introduced for forming the barrier and well layers is adjusted so that the layers have an In content equal to the designed value. The number of well layers is preferably 2 to 6, and more preferably 3. The well layers and the barrier layers may be non-doped or of an n-type layers containing a dopant such as Si or the like.

Next, the supply of TMI and TMG is stopped, and the temperature is again raised to 1050° C. The carrier gas is again changed from $N_2$ to $H_2$. TMG is introduced at a flow rate of 50 μmol/min., and TMA is also introduced at an appropriate flow rate. Bicyclopentadienyl magnesium ($Cp_2Mg$) as a p-doping material is caused to flow at a flow rate of 10 nmol/min. Thus, the carrier block layer 18 formed of $p-Al_zGa_{1-z}N$ (for example, z=0.2) is grown to a thickness of 0 to 40 nm (for example, 18 nm). The carrier block layer 18 may be a non-doped layer. When a voltage is applied to drive the nitride semiconductor laser device 200, the carrier block layer 18 prevents overshoot of electrons injected into the active layer 17 toward the p-type semiconductor layers. The carrier block layer 18 also acts as a vaporization preventing layer for preventing III-group elements from vaporizing from the active layer 17.

Next, the supply of TMA is stopped, and the flow rate of the TMG is adjusted to be 100 μmol/min. Thus, the p-optical waveguide layer 19 formed of p-GaN is grown to a thickness of 0.05 μm to 0.15 μm (for example, 0.1 μm). The p-optical waveguide layer 19 may be a non-doped layer.

Then, the flow rate of TMG is adjusted to 50 μmol/min., and TMA is introduced at a certain flow rate. Thus, the first p-cladding layer 20 formed of $p-Al_{y1}Ga_{1-y1}N$ (for example, y1=0.20) is grown to a thickness of 0.02 μm to 0.15 μm (for example, 0.1 μm).

Next, the flow rate of TMA is changed. Thus, the second p-cladding layer 21 formed of $p-Al_{y2}Ga_{1-y2}N$ (for example, y2=0.05) is grown to such a thickness that the total thickness of the first and second p-cladding layers 20 and 21 is 0.4 μm or more (for example, to a thickness of 1.0 μm).

Thereafter, the flow rate of TMG is adjusted to 100 μmol/min., and the supply of TMA is stopped. Thus, the p-contact layer 22 formed of GaN is grown to a thickness of 0.01 μm to 10 μm (for example, 0.2 μm). Thus, the light emission structure of the nitride semiconductor laser device 200 is completed. After that, the supply of TMG and Cp₂Mg is stopped, and the temperature is lowered. At room temperature, the completed light emission structure is removed from the MOCVD apparatus.

Then, photolithography and reactive ion etching are used to partially etch the p-GaN contact layer 22, the second p-cladding layer 21 and the first p-cladding layer 20, leaving a middle part thereof so as to have a width of 1 μm to 4 μm (for example, 2 μm). Etching is stopped to a level in the first p-cladding layer 20. Thus, the stripe ridge structure acting as an optical waveguide is formed. The thickness of the first p-cladding layer 20 which is left unetched is adjusted so that the FAHM value for the horizontal FFP Θ∥ is in the range of 6 to 10 degrees (for example, 8 degrees).

Then, photolithography is used to form the insulating layer 23 on the surface exposed by etching except for a portion of the p-contact layer 22 which is to contact the positive electrode 24.

Thereafter, the positive electrode 24 is formed substantially on the entirety of the insulating layer 23 and also on the p-contact layer 22. As a material for the positive electrode 24, Au/Ni or Au/Pd, for example, is usable. The negative electrode 25 is formed substantially on the entirety of the n-substrate 11. As a material for the negative electrode 25, Al/Ti or Au/W, for example, is usable.

Then, the wafer is cleaved so as to form end surfaces acting as mirrors of the resonator. Thus, the nitride semiconductor laser device 200 shown in FIG. 2 is completed. As can be appreciated, the nitride semiconductor laser device 200 can be produced in the same manner as that of a generally known semiconductor laser, except that two p-cladding layers having different Al contents are included.

Figure 3:
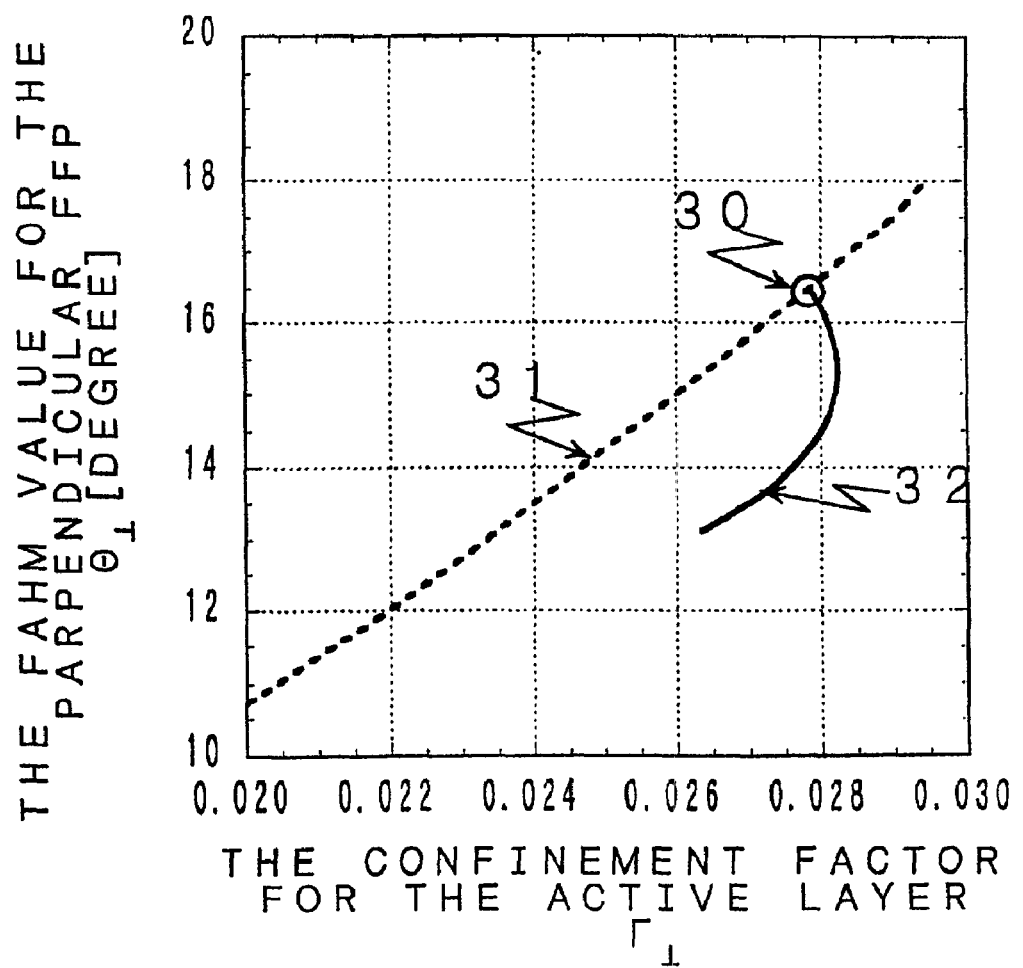
FIG. 3 is a graph illustrating the relationship between the full angle value for the perpendicular FFP $\Theta\perp$ and the confinement factor for the active layer $\Gamma\perp$ in nitride semiconductor laser devices with various structural parameters.
Figure 4:
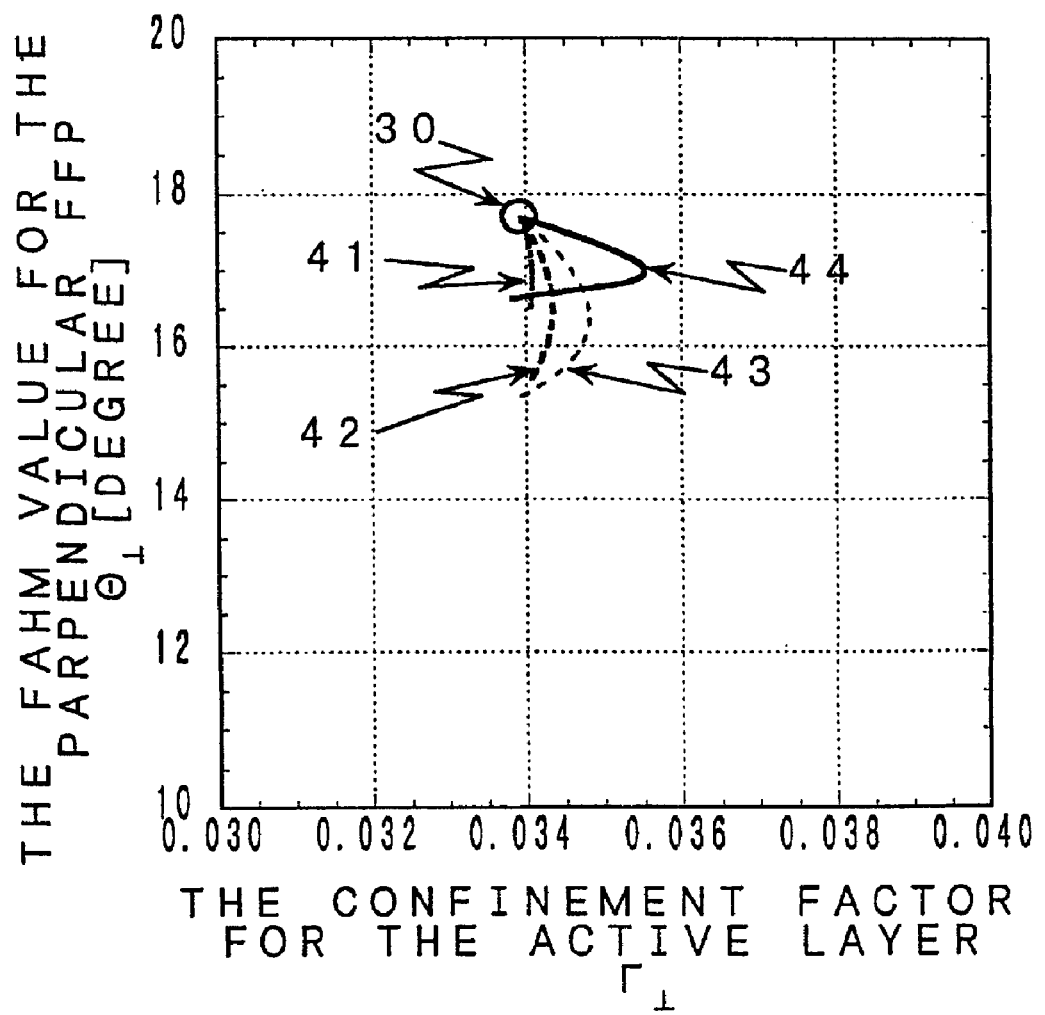
FIG. 4 is a graph illustrating the relationship between the full angle value for the perpendicular FFP $\Theta\perp$ and the confinement factor for the active layer $\Gamma\perp$ in the nitride semiconductor laser device according to the first example of the present invention when the Al content of the lower refractive index layer is changed from 0.05 to 0.30 with the thickness of the lower refractive index layer being 0.02 µm, 0.05 µm, 0.1 µm and 0.2 µm.
Figure 5:
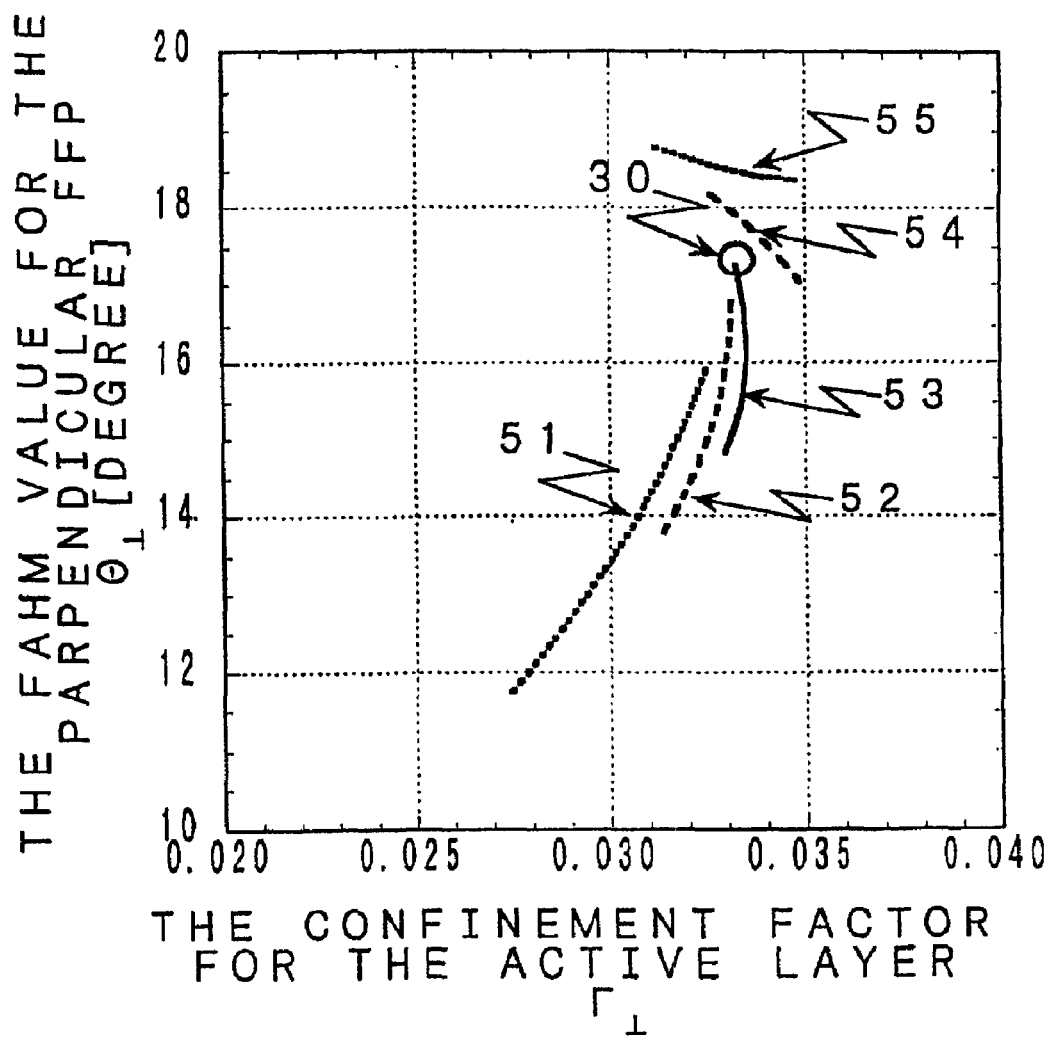
FIG. 5 is a graph illustrating the relationship between the full angle value for the perpendicular FFP $\Theta\perp$ and the confinement factor for the active layer $\Gamma\perp$ in the nitride semiconductor laser device according to the first example of the present invention when the Al content of the lower refractive index layer is changed from 0.05 to 0.30 with the distance between the lower refractive index layer and the active layer being 0.1 µm, 0.08 µm and 0.05 µm.
Figure 17:
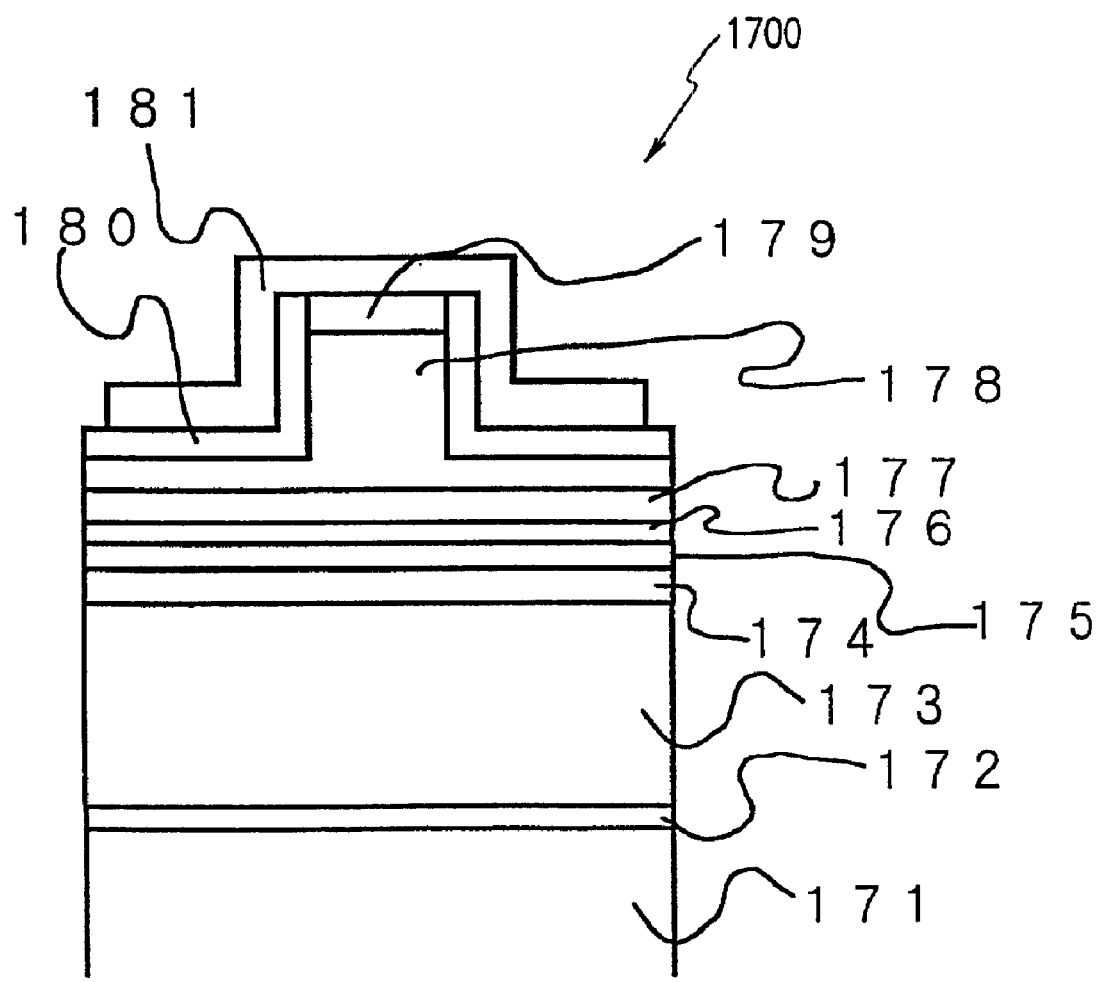
FIG. 17 is a partial cross-sectional view illustrating a structure of a conventional nitride semiconductor laser device.
Figure 18:
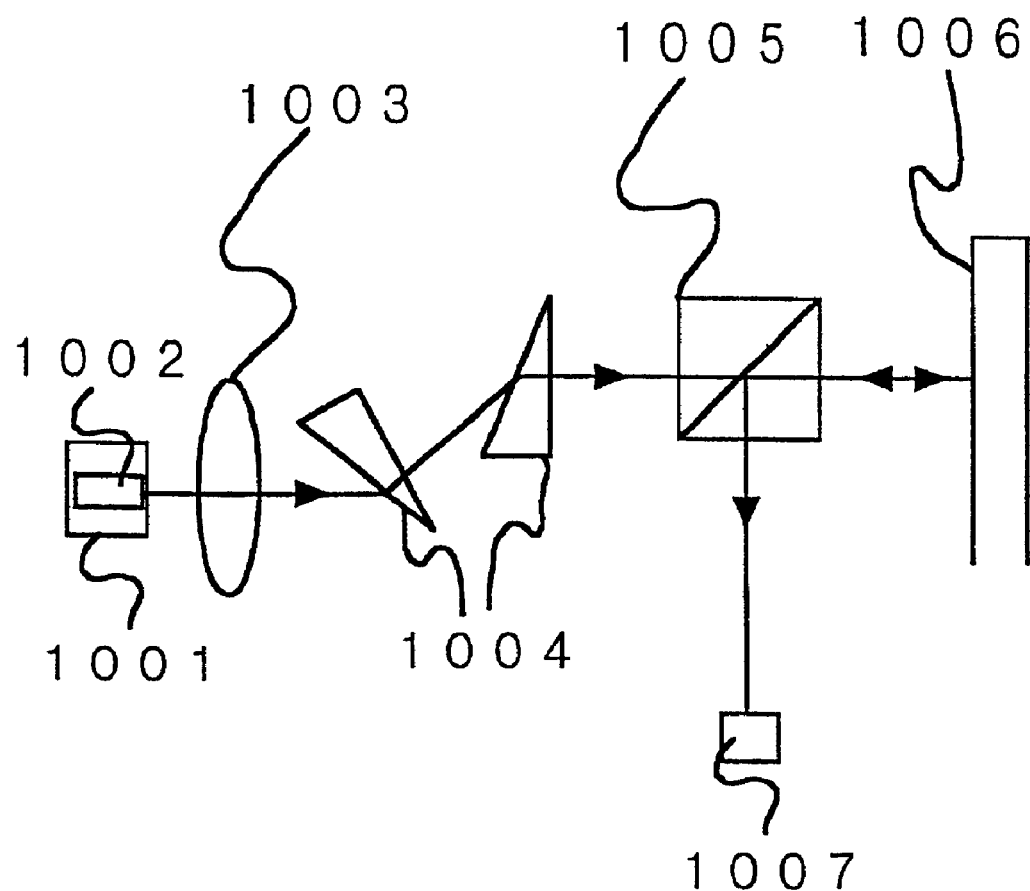
FIG. 18 is a schematic view illustrating a structure of a conventional optical information reproduction apparatus.

FIGS. 3 through 5 show the relationship between the FAHM value for the perpendicular FFP Θ⊥ (vertical axis; also referred to as the "Θ⊥") and the confinement factor for the active layer Γ⊥ (horizontal axis; also referred to as the "Γ⊥") of semiconductor laser devices with various structural parameters which are changed from those of the conventional nitride semiconductor laser device 1700 shown in FIG. 17.

In FIG. 3, point 30 represents the above-described relationship of the conventional nitride semiconductor laser device 1700. Curve 31 shows the change of the above-described relationship as the Al content in the p-cladding layer of the conventional nitride semiconductor laser device 1700 is varied from 0.02 to 0.3. As shown in FIG. 3, curve 31 extends from a lower left position to an upper right position. In the conventional nitride semiconductor laser device 1700, the Al content of the p-cladding layer is 0.05. Curve 31 indicates that when the Al content of the p-cladding layer is reduced and thus the Θ⊥ is reduced, the Γ⊥ is also reduced. This increases the threshold current density, i.e., increases the operating power Wop.

Curve 32 shows the change of the above-described relationship as the Al content in the first p-cladding layer 20 (having a refractive index lower than that of the second p-cladding layer 21) of the nitride semiconductor laser device 200 in the first example is varied from 0.05 to 0.30. As shown in FIG. 3, curve 32 curves downward from point 30. Curve 32 indicates that when the first p-cladding layer 20 (having the lower refractive index) is provided together with the second p-cladding layer 21, the Θ⊥ can be reduced without reducing the Γ⊥. Accordingly, the nitride semiconductor laser device 200 in the first example can improve the ellipticity without increasing the threshold current density or the operating power.

In FIG. 4 also, point 30 represents the above-described relationship of the conventional nitride semiconductor laser device 1700. Curves 41 through 44 each show the change of the above-described relationship as the Al content in the first p-cladding layer 20 (having the lower refractive index) of the nitride semiconductor laser device 200 in the first example is varied from 0.05 to 0.30. As shown in FIG. 4, curves 41 through 44 curve downward from point 30. Curve 41 shows the change when the first p-cladding layer 20 has a thickness of 0.02 μm, curve 42 shows the change when the first p-cladding layer 20 has a thickness of 0.05 μm, curve 43 shows the change when the first p-cladding layer 20 has a thickness of 0.1 μm, and curve 44 shows the change when the first p-cladding layer 20 has a thickness of 0.15 μm.

When the thickness of the first p-cladding layer 20 (having the lower refractive index) is more than 0.15 μm, i.e., when the distance between the second p-cladding layer 21 and the active layer 17 is more than 0.34 μm, the laser oscillation mode is insensitive to the second p-cladding layer 21. As a result, the effect of the present invention is not provided. Therefore, the distance between the second p-cladding layer 21 and the active layer 17 is preferably 0.34 μm or less. The distance of 0.34 μm is obtained by the following expression. thickness of the first p-cladding layer (≦0.15 μm)+thickness of the p-optical waveguide layer (≦0.15 μm)+thickness of p-carrier block layer (≦0.04 μm)

When the thickness of the first p-cladding layer 20 (having the lower refractive index) is less than 0.02 μm, the influence of the first p-cladding layer 20 on the laser oscillation mode is excessively small. Even when the Al content of the first p-cladding layer 20 increases, such an increase does not have a sufficient influence on the Θ⊥ or the Γ⊥. Therefore, the effect of the present invention is not sufficiently provided. Accordingly, the thickness of the first p-cladding layer 20 (having the lower refractive index) is preferably 0.02 μm or more and 0.15 μm or less, and more preferably 0.05 μm or more and 0.1 μm or less.

In FIG. 5 also, point 30 represents the above-described relationship of the conventional nitride semiconductor laser device 1700. Curves 51 through 55 each show the change of the above-described relationship as the Al content in the first p-cladding layer 20 (having the lower refractive index) of the nitride semiconductor laser device 200 in the first example is varied from 0.05 to 0.30. As shown in FIG. 5, curves 51 through 5 curve downward from point 30. Curve 51 shows the change when the first p-cladding layer 20 is distanced from the active layer 17 by 0.05 μm, curve 52 shows the change when the first p-cladding layer 20 is distanced from the active layer 17 by 0.08 μm, curve 53 shows the change when the first p-cladding layer 20 is distanced from the active layer 17 by 0.10 μm, curve 54 shows the change when the first p-cladding layer 20 is distanced from the active layer 17 by 0.15 μm, and curve 55 shows the change when the first p-cladding layer 20 is distanced from the active layer 17 by 0.20 μm. The distance between the first p-cladding layer 20 and the active layer 17 is changed by varying the thickness of the p-optical waveguide layer 16 in the nitride semiconductor laser device 200 shown in FIG. 2.

In FIG. 5, the distance between the first p-cladding layer 20 and the active layer 17 does not include the thickness of the carrier block layer 18. The results are not significantly changed as long as the thickness of the carrier block layer 18 is 0.04 μm or less.

When the distance between the first p-cladding layer 20 (having the lower refractive index) and the active layer 17 is less than 0.05 μm (see curve 51), as the Al content of the first p-cladding layer 20 increases, the Γ⊥ is significantly reduced. The reason for this is because when the first p-cladding layer 20 is too close to the active layer 17, the laser oscillation mode is strongly influenced by the p-first cladding layer 20; i.e., leakage of light of the laser oscillation mode toward the n-type semiconductor layers is increased due to the existence of the first p-cladding layer 20. As a result, the effect of the present invention of reducing the Θ⊥ without reducing the Γ⊥ is not sufficiently provided. Therefore, the distance between the first p-cladding layer 20 and the active layer 17 is preferably 0.05 μm or more.

When the distance between the first p-cladding layer 20 (having the lower refractive index) and the active layer 17 is more than 0.20 μm (see curve 55), even though the Al content of the first p-cladding layer 20 increases, the Θ⊥ does not change significantly at all. The reason for this is because when the distance between the first p-cladding layer 20 and the active layer 17 is large, the laser oscillation mode is little influenced by the p-first cladding layer 20. As a result, the effect of the present invention of reducing the Θ⊥ without reducing the Γ⊥ is not sufficiently provided. Therefore, in also consideration of the thickness of the p-carrier block layer 18, the distance between the first p-cladding layer 20 and the active layer 17 is preferably 0.24 μm or less.

Figure 19:
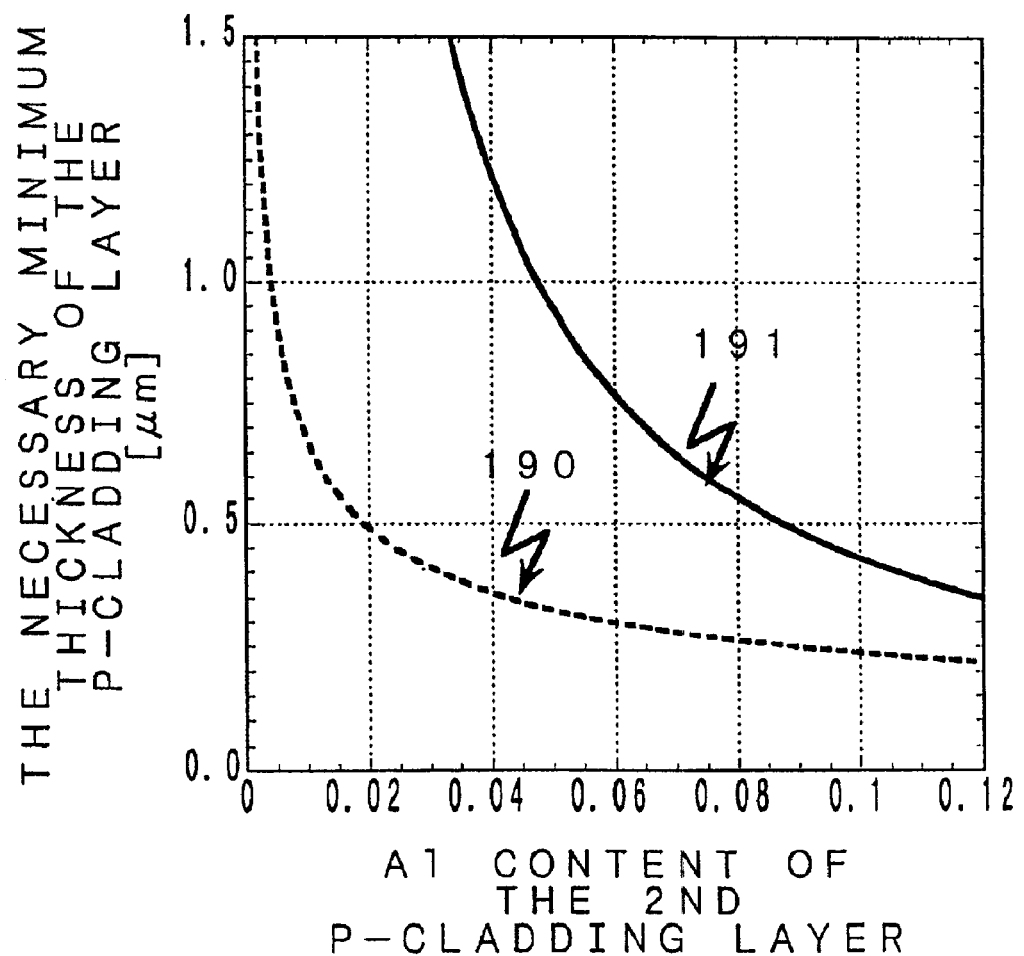
FIG. 19 is a graph illustrating the relationship between the Al content of the second p-cladding layer and the minimum necessary thickness of the p-cladding layer.

FIG. 19 shows the minimum necessary thickness of a p-cladding layer with respect to the Al content. The horizontal axis represents the Al content of the second p-cladding layer 21, and the vertical axis represents the minimum necessary total thickness of the first p-cladding layer 20 and the second p-cladding layer 21. In FIG. 19, an area below curve 190 defines the condition under which the oscillated laser light absorbed by a positive electrode is 10 $cm^{-1}$ or more. For a semiconductor laser device to normally function, the condition represented by an area above curve 190 is required. Since the Al content of the second p-cladding layer 21 is designed to be 0.05 or more, the total thickness of the first p-cladding layer 20 and the second p-cladding layer 21 should be at least 0.4 μm. With the condition represented by an area below curve 191, oscillated laser light is restricted in expansion by a positive electrode and thus full angle of half maximum in the perpendicular direction Θ⊥ is increased as compared to the case where the thickness of a p-cladding layer is infinite. In order to provide the effect of the present invention to the maximum degree, the condition represented by an area above curve 191 is preferable. In this example, the second p-cladding layer 21 has a thickness of 1 μm and has an Al content of 0.05, and thus is in a preferable state.

As shown in FIG. 19, when the Al content of the second p-cladding layer 21 is as small as less than 0.03, the minimum necessary thickness of the second p-cladding layer 21 rapidly increases. Therefore, the second p-cladding layer 21 needs to have an Al content of at least 0.03.

Figure 24:
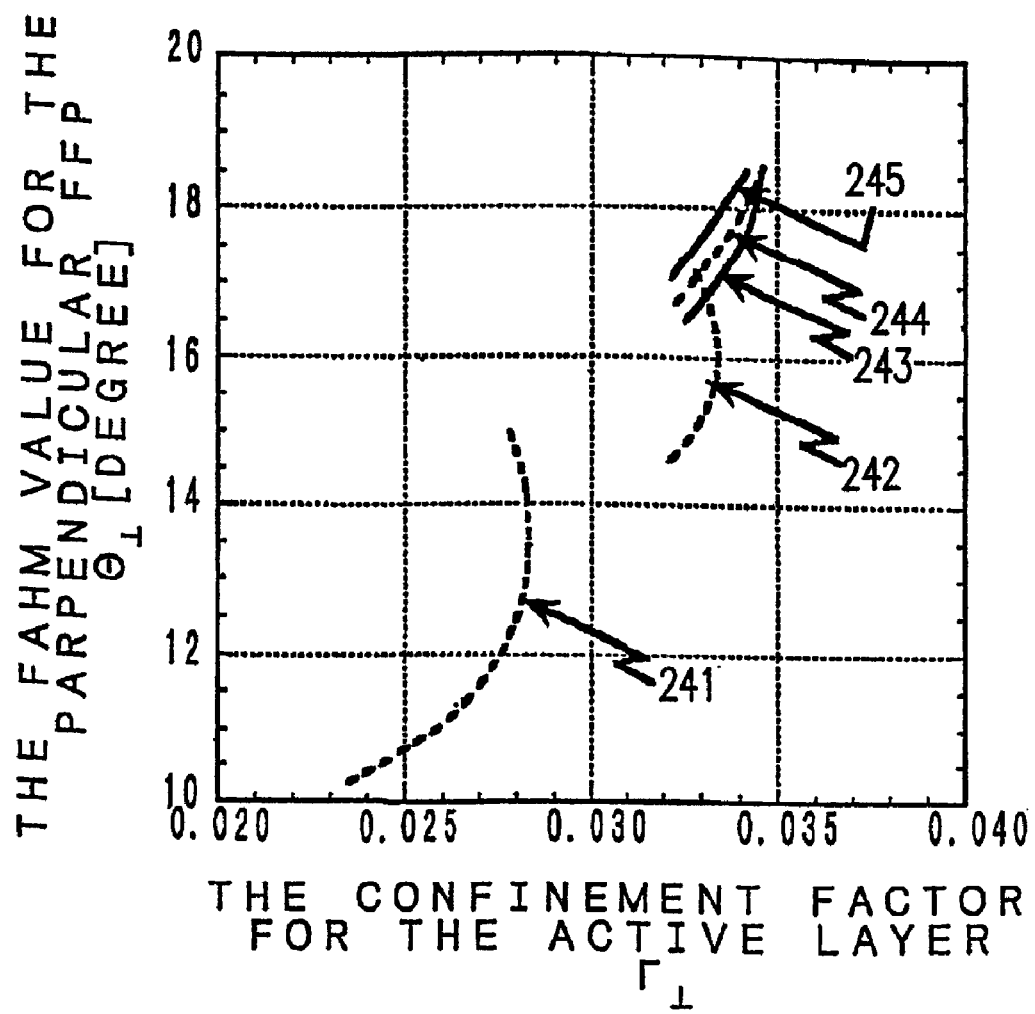
FIG. 24 is a graph illustrating the relationship between the full angle value for the perpendicular FFP $\Theta\perp$ and the confinement factor for the active layer in the perpendicular direction $\Gamma\perp$ of a nitride semiconductor laser device in the first example when the Al content of the first p-cladding layer changes from a value equal to that of the second p-cladding layer to 0.30.

FIG. 24 shows the relationship between the FAHM value for the perpendicular FFP Θ⊥ (vertical axis; also referred to as the "Θ⊥") and the confinement factor for the active layer Γ⊥ (horizontal axis; also referred to as the "Γ⊥") of a semiconductor laser device in the first example, which is obtained while the Al content of the first p-cladding layer 20 (having a lower refractive index) changes from a value equal to that of the second p-cladding layer 21 to 0.30. In FIG. 24, curves 241 through 245 curve downward. Curve 241 shows the change when the Al content of the second p-cladding layer 21 is 0.03. Curve 242 shows the change when the Al content of the second p-cladding layer 21 is 0.05. Curve 243 shows the change when the Al content of the second p-cladding layer 21 is 0.08. Curve 244 shows the change when the Al content of the second p-cladding layer 21 is 0.10. Curve 245 shows the change when the Al content of the second p-cladding layer 21 is 0.15.

As can be appreciated from FIG. 24, when the Al content of the second p-cladding layer 21 exceeds 0.10, the plotted points on the Γ⊥–Θ⊥ coordinate system move from the upper right to the lower left, which is similar to the behavior of the conventional semiconductor laser (FIG. 3). This means that the effect of the present invention is not provided. Therefore, the Al content of the second p-cladding layer 21 needs to be 0.10 or less in order to provide the effect of the present invention.

The results described with reference to FIGS. 3, 4, 5, 19 and 24 do not significantly change even when structural parameters, for example, the oscillation wavelength, which are not indispensable to the present invention vary.

In a nitride semiconductor laser device according to the present invention, the Al content of the n-cladding layer 15 is preferably of a value between the Al contents in the first and second p-cladding layers 20 and 21 in light of the symmetry of the optical waveguide structure. In this example, the Al content of the first p-cladding layer 20 is 0.20, the Al content of the second p-cladding layer 21 is 0.05, and the Al content of the n-cladding layer 15 is 0.10, which is preferable.

In this example, the first p-cladding layer 20 and the second p-cladding layer 21 are both a part of a p-cladding layer and both have a refractive index lower than an effective refractive index of the laser oscillation mode.

The nitride semiconductor laser device 200 in the first example having the above-described structure oscillates at a threshold current density of 1.2 $kA/cm^2$. The FAHM for the perpendicular FFP Θ⊥=13.5 degrees, and the FAHM for the horizontal FFP Θ∥=8.2 degrees. The ellipticity Θ⊥/Θ∥=1.6. This represents a significant improvement over that of the conventional semiconductor laser device, and show that the effect of the present invention is provided.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

EXAMPLE 2

Figure 7:
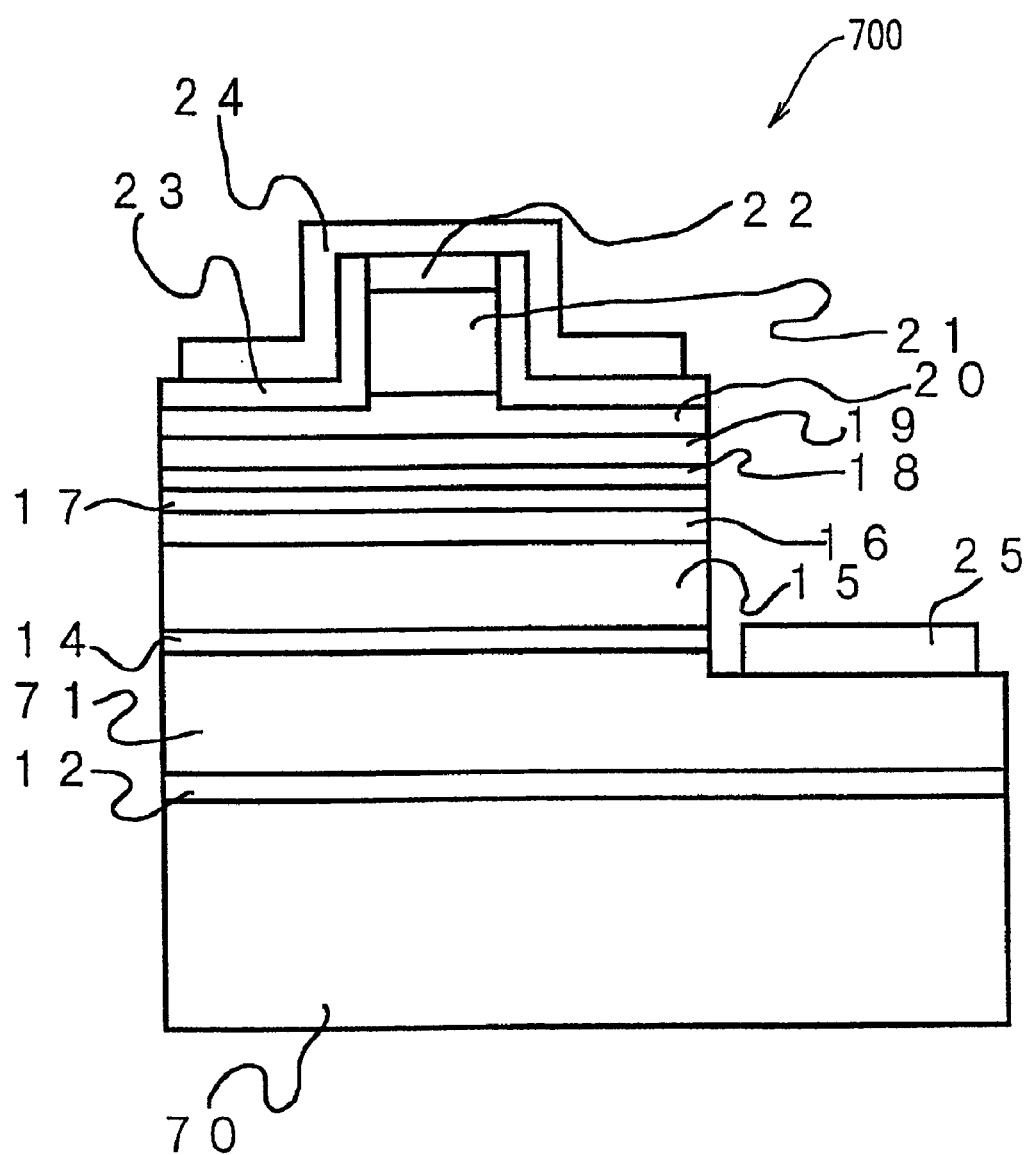
FIG. 7 is a schematic cross-sectional view illustrating a structure of a nitride semiconductor laser device according to a second example of the present invention.

FIG. 7 is a schematic cross-sectional view illustrating a structure of a nitride semiconductor laser device 700 according to a second example of the present invention. The nitride semiconductor laser device 700 includes a sapphire substrate. A resonator in the waveguide of the nitride semiconductor laser device 700 has vertical faces.

As shown in FIG. 7, the nitride semiconductor laser device 700 includes the following layers each formed of a nitride semiconductor material on a substrate 70 (thickness: 30 μm to 300 μm) formed of a sapphire (0001) plane: a low temperature growth buffer layer 12 (thickness: 0 to 10 μm) formed of GaN, an n-GaN contact layer 71 (thickness: 0.1 μm to 10 μm), an n-buffer layer 14 (thickness: 0 to 200 nm) formed of n-$In_rGa_{1-r}N$ ($0 \leq r \leq 0.2$), an n-cladding layer 15 (thickness: 0.4 μm or more) formed of n-$Al_xGa_{1-x}N$ (0.05≦x≦0.2), an n-optical waveguide layer 16 (thickness: 0 to 0.15 µm) formed of n-GaN, an active layer 17 having a multiple quantum well structure (oscillation wavelength: 370 nm to 430 nm; total thickness: 5 nm to 60 nm) including $In_wGa_{1-w}N$ (v<w≦0.2) well layers and $n-In_vGa_{1-v}N$ (0≦v<w) barrier layers which are alternately laminated, a p-carrier block layer 8 (thickness: 0 to 0.04 µm, preferably 0 to 0.02 µm) formed of $p-Al_zGa_{1-z}N$ (0<z≦0.3), a p-optical waveguide layer 19 (thickness: 0.05 µm to 0.15 µm) formed of p-GaN, a first p-cladding layer 20 (thickness: 0.02 µm to 0.15 µm) formed of $p-Al_{y1}Ga_{1-y1}N$ (y2<y1<0.2), a second p-cladding layer 21 (thickness: equal to or greater than the thickness of the first p-cladding layer 20; for example, 0.4 µm) formed of $p-Al_{y2}Ga_{1-y2}N$ (0<y2<y1), and a p-contact layer 22 (thickness: 0.01 µm to 10 µm) formed of p-GaN.

A ridge structure acting as a stripe waveguide of the nitride semiconductor laser device 700 is provided by partially etching the p-contact layer 22, the second p-cladding layer 21 and the first p-cladding layer 20. Etching is stopped at a level in the second p-cladding layer 21. An insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22.

A stripe mesa structure including the ridge structure is provided by etching the layers from the p-contact layer 22 to the n-contact layer 71 are etched in a different part. Etching is stopped at a level in the n-contact layer 71. The stripe mesa structure has a width of several ten to several hundred micrometers. A negative electrode 25 is provided on the exposed surface of the n-contact layer 71. End surfaces of the ridge (i.e., surfaces parallel to the sheet of FIG. 7) act as mirrors, and thus form an optical resonator.

The nitride semiconductor laser device 700 in the second example has substantially the same structure as that of the nitride semiconductor laser device 200 in the first example except that (i) the sapphire substrate 70 is used, (ii) the mesa structure is provided, and (iii) the negative electrode 25 is provided on the same side as the positive electrode 24.

The nitride semiconductor laser device 700 in the second example can be produced by substantially the same method as that of the nitride semiconductor laser device 200 except that (i) the substrate 70 is formed of sapphire and (ii) after the stripe ridge structure is formed for forming an optical waveguide, known photolithography and reactive ion etching are used to form the stripe mesa structure.

The nitride semiconductor laser device 700 having the above-described structure has substantially the same characteristics and effect of the nitride semiconductor laser device 200 in the first example.

EXAMPLE 3

Figure 8:
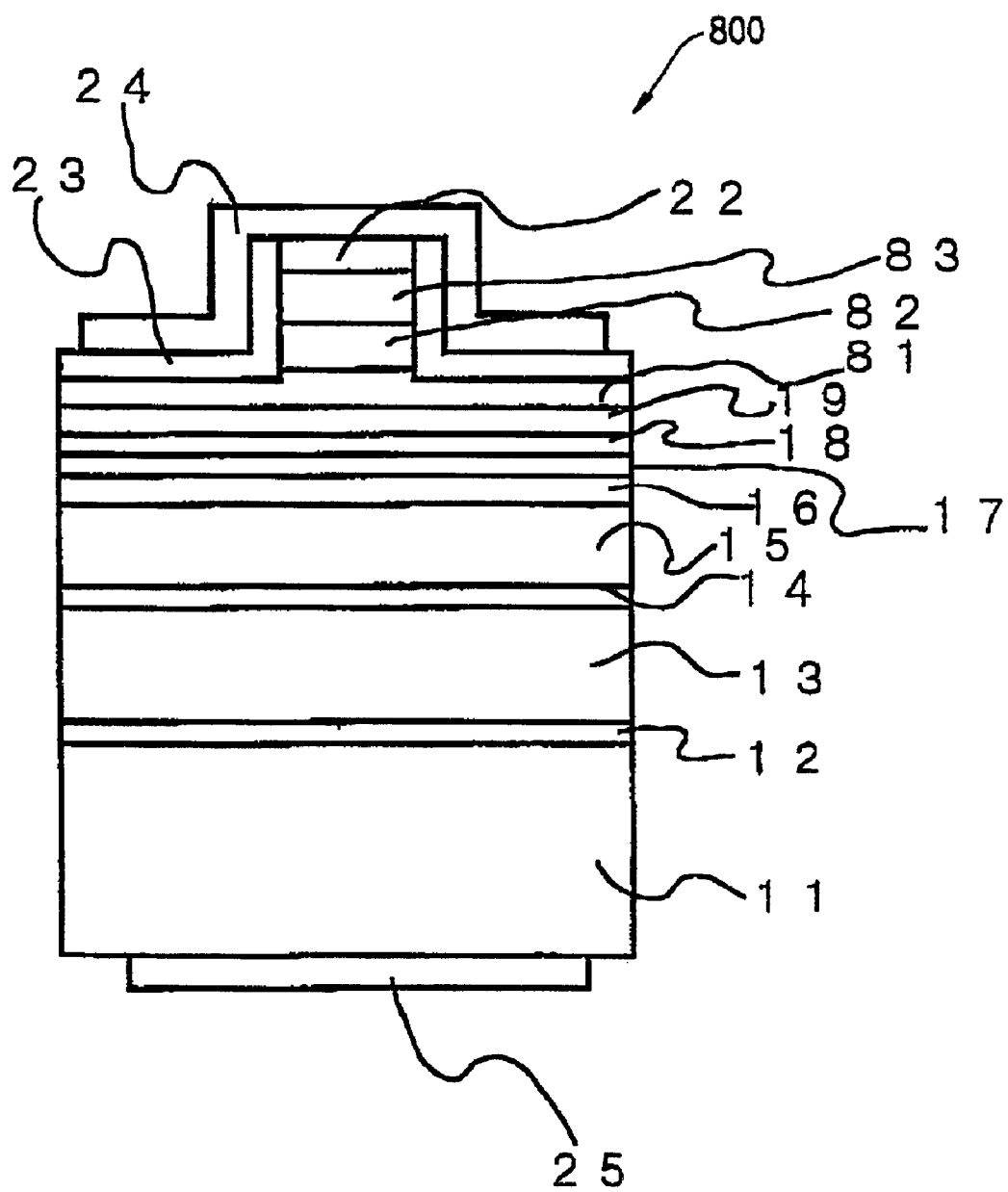
FIG. 8 is a schematic cross-sectional view illustrating a structure of the nitride semiconductor laser device according to the third example of the present invention.

FIG. 8 is a schematic cross-sectional view illustrating a structure of a nitride semiconductor laser device 800 according to a third example of the present invention. In the nitride semiconductor laser device 800, a low refractive index layer is provided as a part of a p-cladding layer assembly and is distanced from the first main surface of the p-cladding layer assembly. A resonator in the waveguide of the nitride semiconductor laser device 800 has vertical faces.

As shown in FIG. 8, the nitride semiconductor laser device 800 includes the following layers each formed of a nitride semiconductor material: a substrate 11 (thickness: 30 µm to 300 µm) formed of n-GaN, a low temperature growth buffer layer 12 (thickness: 0 to 10 µm) formed of GaN, an n-GaN layer 13 (thickness: 0.1 µm to 10 µm), an n-buffer layer 14 (thickness: 0 to 200 nm) formed of $n-In_rGa_{1-r}N$ (0≦r≦0.2), an n-cladding layer 15 (thickness: 0.4 µm or more) formed of $n-Al_xGa_{1-x}N$ (0.05≦x≦0.2), an n-optical waveguide layer 16 (thickness: 0 to 0.15 µm) formed of n-GaN, an active layer 17 having a multiple quantum well structure (oscillation wavelength: 370 nm to 430 nm; total thickness: 5 nm to 60 nm) including $In_wGa_{1-w}N$ (v<w≦0.2) well layers and $n-In_vGa_{1-v}N$ (0≦v<w) barrier layers which are alternately laminated, a p-carrier block layer 18 (thickness: 0 to 0.04 µm, preferably 0 to 0.02 µm) formed of $p-Al_zGa_{1-z}N$ (0<z≦0.3), a p-optical waveguide layer 19 (thickness: 0.05 µm to 0.15 µm) formed of p-GaN, a third p-cladding layer 81 (thickness: 0.02 µm to 0.15 µm) formed of $p-Al_{y3}Ga_{1-y3}N$ (0<y3<y1), a first p-cladding layer 82 (thickness: 0.02 µm to 0.15 µm) formed of $p-Al_{y1}Ga_{1-y1}N$ (y3<y1), a second p-cladding layer 83 (thickness: equal to or greater than each of the thickness of the first p-cladding layer 82 and the thickness of the third p-cladding layer 81; for example, 0.4 µm) formed of $p-Al_{y2}Ga_{1-y2}N$ (y2≈y3<y1), and a p-contact layer 22 (thickness: 0.01 µm to 10 µm) formed of p-GaN. The third p-cladding layer 81, the first p-cladding layer 82 and the second p-cladding layer 83 will be collectively referred to as the "p-cladding layer assembly".

A ridge structure acting as a stripe waveguide of the nitride semiconductor laser device 800 is provided by partially etching the p-contact layer 22, the second p-cladding layer 83, the first p-cladding layer 82 and the third p-cladding layer 81. Etching is stopped at a level in the third p-cladding layer 81. An insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 8) act as mirrors, and thus form an optical resonator.

The nitride semiconductor laser device 800 in the third example can be produced by substantially the same method as that of the nitride semiconductor laser device 200 in the first example except that the step of forming the three different p-cladding layers 81, 82 and 83 is included instead of the step of forming the first and second p-cladding layers 20 and 21.

The third p-cladding layer 81 and the second p-cladding layer 83 have generally the same Al content, and the first p-cladding layer 82 has a higher Al content than that of the third and second p-cladding layers 81 and 83. The first p-cladding layer 82, which is interposed between the third p-cladding layer 81 and the second p-cladding layer 83 and thus is distanced from the main surface of the p-cladding layer assembly, has a lower refractive index than that of the p-cladding layers 81 and 82.

Figure 6:
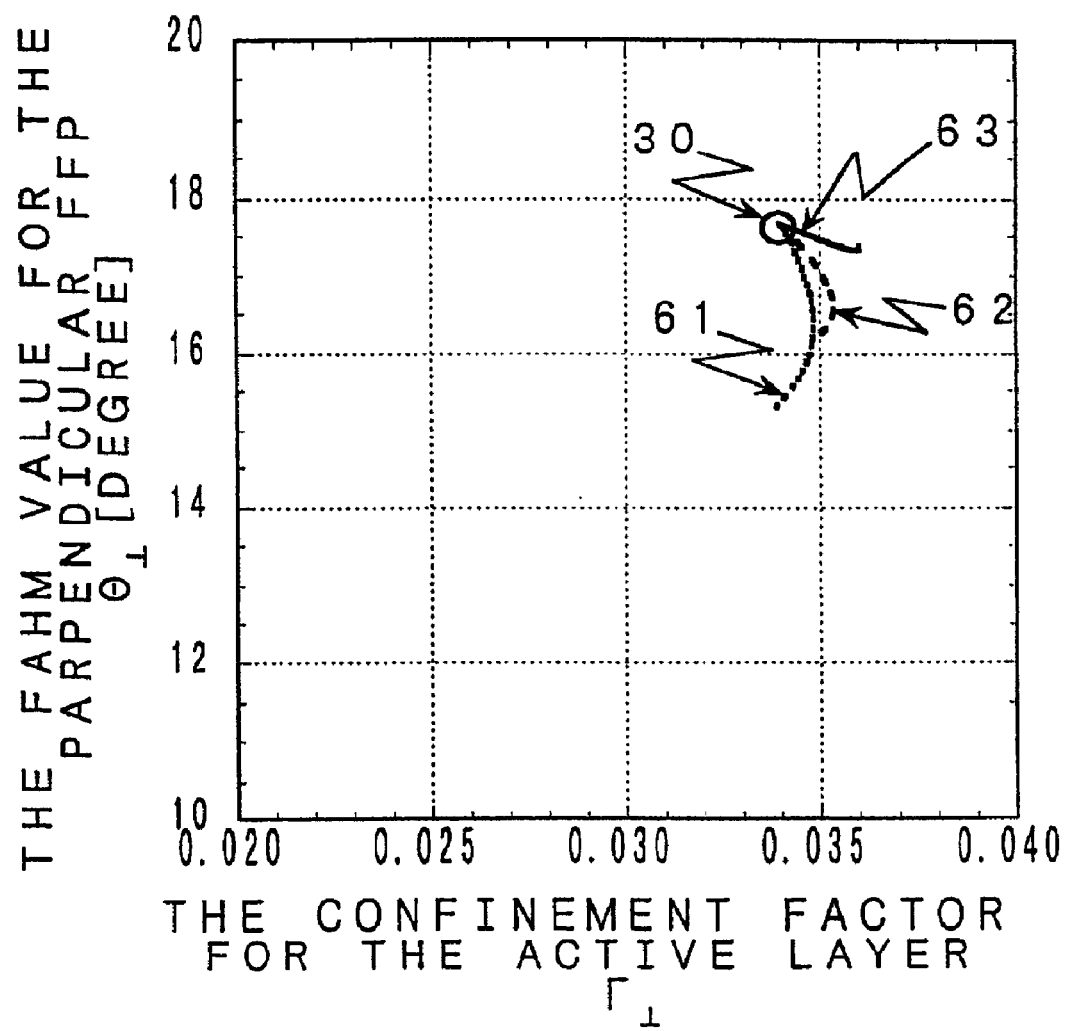
FIG. 6 is a graph illustrating the relationship between the full angle value for the perpendicular FFP $\Theta\perp$ and the confinement factor for the active layer $\Gamma\perp$ in a nitride semiconductor laser device according to a third example of the present invention when the Al content of the lower refractive index layer is changed from 0.05 to 0.30 with the distance between the lower refractive index layer and the first main surface of the p-cladding layer assembly being 0, 0.02 µm and 0.05 µm.

FIG. 6 shows the relationship between the FAHM value for the perpendicular FFP Θ⊥ (vertical axis; also referred to as the "Θ⊥") and the confinement factor for the active layer Γ⊥ (horizontal axis; also referred to as the "Γ⊥") of semiconductor laser device 800, which is obtained while the Al content is varied from 0.05 to 0.30.

In FIG. 6, point 30 represents the above-described relationship of the conventional nitride semiconductor laser device 1700. As shown in FIG. 6, curves 61 through 63 curve downward from point 30. Curve 61 shows the change when the first p-cladding layer 82 (having the lower refractive index) is provided as a part of the p-cladding layer assembly with a distance of 0 from the first main surface of the p-cladding layer assembly. Curve 62 shows the change when the first p-cladding layer 82 is provided as a part of the p-cladding layer assembly with a distance of 0.02 µm from the first main surface of the p-cladding layer assembly. Curve 63 shows the change when the first p-cladding layer 82 is a part of the p-cladding layer assembly with a distance of 0.05 µm from the first main surface of the p-cladding layer assembly. The distance between the active layer 17 and the first main surface of the p-cladding layer assembly is fixed at 0.1 µm. The results described with reference to FIG. 6 do not significantly change even when the distance between the active layer 17 and the first main surface of the p-cladding layer assembly varies.

As the distance between the first p-cladding layer 82 and the first main surface of the p-cladding layer assembly increases, the influence of the first p-cladding layer 82 on the $\Theta\perp$ decreases. Especially when the distance is more than 0.05 µm (see curve 63), the $\Theta\perp$ does not change significantly at all even though the first p-cladding layer 82 is provided between the third and second p-cladding layer 81 and 83. As a result, the effect of the present invention of improving the ellipticity is not sufficiently provided. Therefore, the distance between the first p-cladding layer 82 and the first main surface of the p-cladding layer assembly is preferably 0.05 µm or less, i.e., the distance between the first p-cladding layer 82 and the active layer 17 is preferably 0.24 µm or less. More preferably, the first p-cladding layer 82 is in contact with the first main surface of the p-cladding layer assembly. The distance of 0.24 µm is obtained by the following expression.

thickness of the second p-cladding layer (i.e., distance between the first p-cladding layer and the first main surface of the p-cladding layer assembly; $\leq 0.05$ µm)+thickness of the p-optical waveguide layer ($\leq 0.15$ µm)+thickness of p-carrier block layer ($\leq 0.04$ µm)

In this example, the first p-cladding layer 82 (having the lower refractive index) may be provided anywhere in the p-cladding layer assembly. The distance between the second p-cladding layer 83 and the active layer 17 is 0.34 µm or less. The first p-cladding layer 82 is preferably provided as close as possible to the first main surface of the p-cladding layer assembly. More preferably, the first p-cladding layer 82 is distanced from the first main surface of the p-cladding layer assembly by 0.05 µm or less, i.e., is distanced from the active layer 17 by 0.24 µm or less. Still more preferably, the first p-cladding layer 82 is distanced from the active layer 17 by 0.05 µm or less. The thickness of the first p-cladding layer 82 is preferably in the range of 0.02 µm or more and 0.15 µm or less.

In this example, the third p-cladding layer 81, the first p-cladding layer 82 and the second p-cladding layer 83 are all a part of a p-cladding layer assembly and all have a refractive index lower than an effective refractive index of the laser oscillation mode.

The nitride semiconductor laser device 800 having the above-described structure has substantially the same characteristics and effect of the nitride semiconductor laser device 200 in the first example.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

EXAMPLE 4

Figure 9:
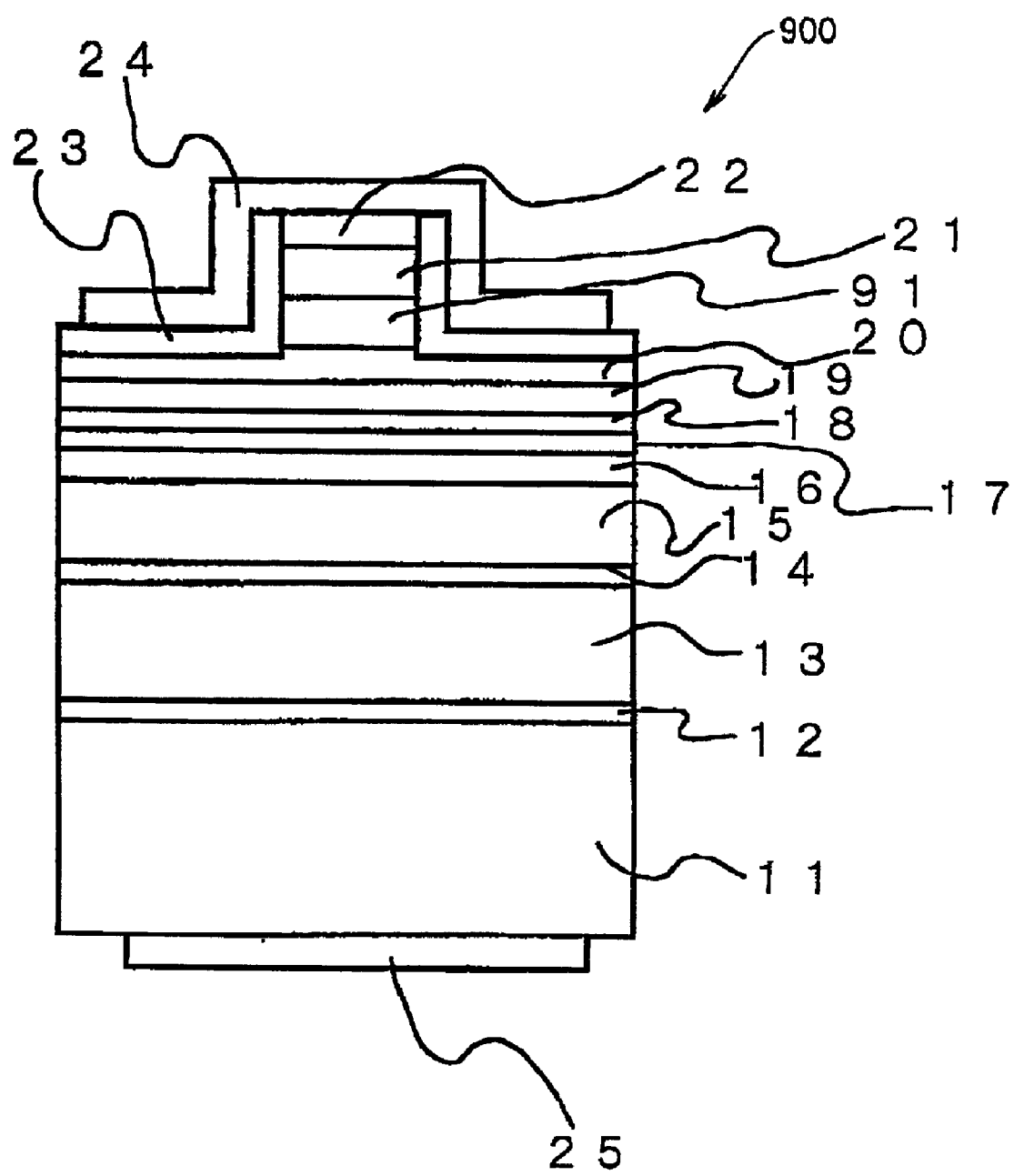
FIG. 9 is a schematic cross-sectional view illustrating a structure of a nitride semiconductor laser device according to a fourth example of the present invention.

FIG. 9 is a schematic cross-sectional view illustrating a structure of a nitride semiconductor laser device 900 according to a fourth example of the present invention. In the nitride semiconductor laser device 900, a layer containing InGaN or GaN and having a thickness of 0.02 µm or less is provided as a part of a p-cladding layer assembly. A resonator in the waveguide of the nitride semiconductor laser device 900 has vertical faces.

As shown in FIG. 9, the nitride semiconductor laser device 900 includes the following layers each formed of a nitride semiconductor material: a substrate 11 (thickness: 30 µm to 300 µm) formed of n-GaN, a low temperature growth buffer layer 12 (thickness: 0 to 10 µm) formed of GaN, an n-GaN layer 13 (thickness: 0.1 µm to 10 µm), an n-buffer layer 14 (thickness: 0 to 200 nm) formed of n-$In_rGa_{1-r}N$ ($0\leq r\leq 0.2$), an n-cladding layer 15 (thickness: 0.4 µm or more) formed of n-$Al_xGa_{1-x}N$ ($0.05\leq x\leq 0.2$), an n-optical waveguide layer 16 (thickness: 0 to 0.15 µm) formed of n-GaN, an active layer 17 having a multiple quantum well structure (oscillation wavelength: 370 nm to 430 nm; total thickness: 5 nm to 60 nm) including $In_wGa_{1-w}N$ ($v<w\leq 0.2$) well layers and n-$In_vGa_{1-v}N$ ($0\leq v<w$) barrier layers which are alternately laminated, a p-carrier block layer 18 (thickness: 0 to 0.04 µm, preferably 0 to 0.02 µm) formed of p-$Al_zGa_{1-z}N$ ($0<z\leq 0.3$), a p-optical waveguide layer 19 (thickness: 0.05 µm to 0.15 µm) formed of p-GaN, a first p-cladding layer 20 (thickness: 0.02 µm to 0.15 µm) formed of p-$Al_{y1}Ga_{1-y1}N$ (y2<y1), a p-GaN layer 91 (thickness: 0 to 0.02 µm), a second p-cladding layer 21 (thickness: equal to or greater than the thickness of the first p-cladding layer 20; for example, 0.4 µm) formed of p-$Al_{y2}Ga_{1-y2}N$ (0<y2<y1), and a p-contact layer 22 (thickness: 0.01 µm to 10 µm) formed of p-GaN. The first p-cladding layer 20, the p-GaN layer 91 and the second p-cladding layer 21 will be collectively referred to as the "p-cladding layer assembly".

A ridge structure acting as a stripe waveguide of the nitride semiconductor laser device 900 is provided by partially etching the p-contact layer 22, the second p-cladding layer 21, the p-GaN layer 91, and the first p-cladding layer 20. Etching is stopped at a level in the first p-cladding layer 20. An insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 9) act as mirrors, and thus form an optical resonator.

The nitride semiconductor laser device 900 in the fourth example can be produced by substantially the same method as that of the nitride semiconductor laser device 200 in the first example except that the step of forming the p-GaN layer 91 during the growth of the p-cladding layers assembly is added.

In the nitride semiconductor laser device 900, the p-GaN layer 91 is inserted between the first p-cladding layer 20 and the second p-cladding layer 21 so as to form a p-cladding layer assembly. Since the p-GaN layer 91 has a thickness of only 0.02 µm or less, the influence of the p-GaN layer 91 on the electric field in the perpendicular direction of the laser oscillation mode is insignificant. Thus, the effect of the present invention is sufficiently provided.

In this example, the first p-cladding layer 20 (having the lower refractive index) may be provided anywhere in the p-cladding layer assembly. The distance between the second p-cladding layer 21 and the active layer 17 is 0.34 μm or less. In this example, the first p-cladding layer 20 is preferably provided as far as possible from the active layer 17. The reason for this is because, as can be appreciated from FIG. 5, when the distance between the first p-cladding layer 20 (having the lower refractive index) and the active layer 17 is relatively small as in this example, the Γ⊥ is reduced by inserting the first p-cladding layer 20. More preferably, the first p-cladding layer 20 is distanced from the active layer 17 by 0.05 μm or more and 0.24 μm or less. The thickness of the first p-cladding layer 20 is preferably in the range of 0.02 μm or more and 0.15 μm or less.

The nitride semiconductor laser device 900 having the above-described structure has substantially the same characteristics and effect of the nitride semiconductor laser device 200 in the first example.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

EXAMPLE 5

Figure 10:
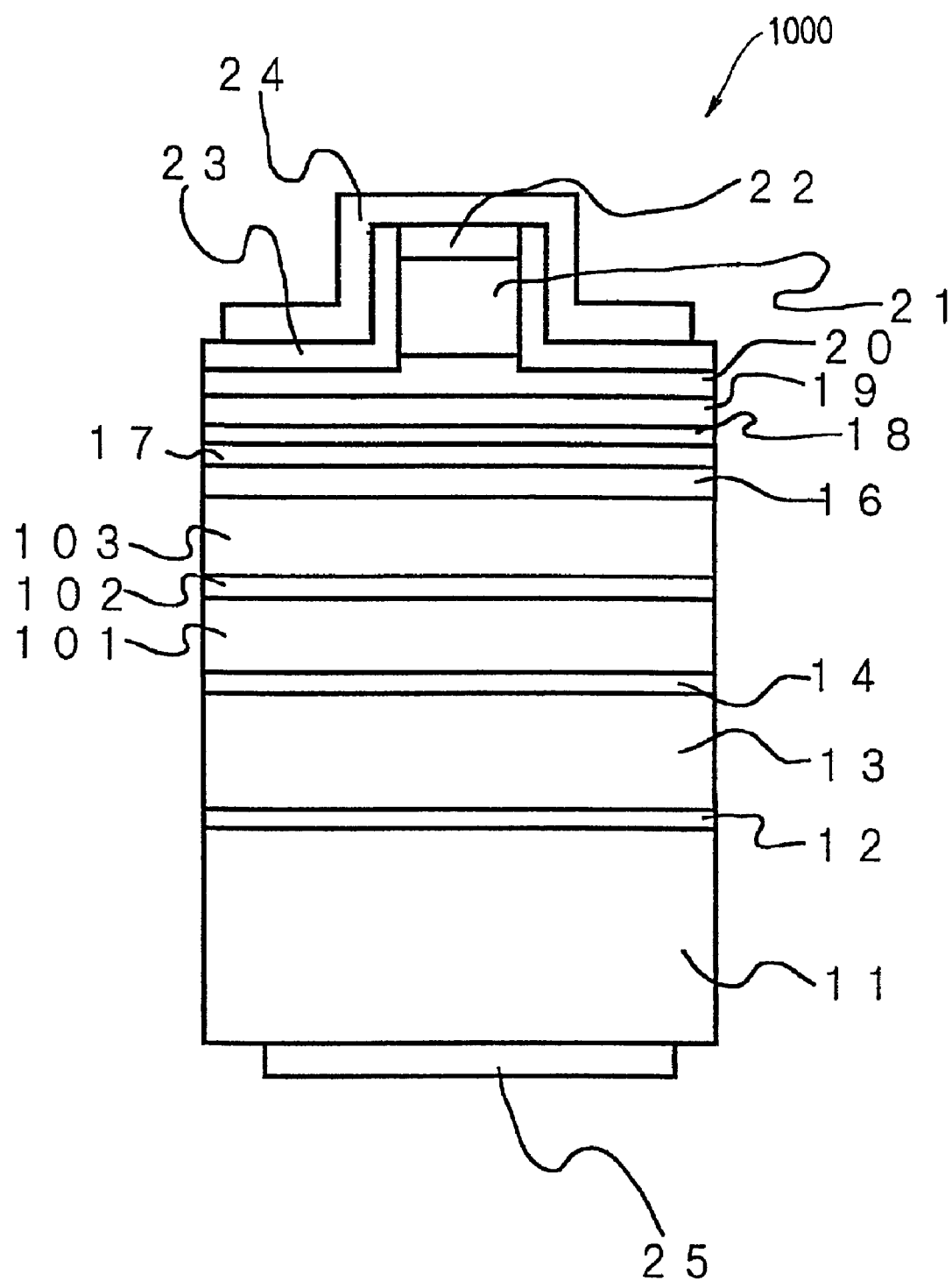
FIG. 10 is a schematic cross-sectional view illustrating a structure of a nitride semiconductor laser device according to a fifth example of the present invention.

FIG. 10 is a schematic cross-sectional view illustrating a structure of a nitride semiconductor laser device 1000 according to a fifth example of the present invention. In the nitride semiconductor laser device 1000, a layer containing InGaN or GaN and having a thickness of 0.02 μm or less is provided as a part of an n-cladding layer assembly. A resonator in the waveguide of the nitride semiconductor laser device 1000 has vertical faces.

As shown in FIG. 10, the nitride semiconductor laser device 1000 includes the following layers each formed of a nitride semiconductor material: a substrate 11 (thickness: 30 μm to 300 μm) formed of n-GaN, a low temperature growth buffer layer 12 (thickness: 0 to 10 μm) formed of GaN, an n-GaN layer 13 (thickness: 0.1 μm to 10 μm), an n-buffer layer 14 (thickness: 0 to 200 nm) formed of n-$In_rGa_{1-r}N$ ($0 \leq r \leq 0.2$), a first n-cladding layer 101 formed of n-$Al_{x1}Ga_{1-x1}N$ ($0.05 \leq x1 \leq 0.2$), an n-buffer layer 102 (thickness: 0 to 0.02 μm) formed of n-$In_sGa_{1-s}N$ ($0 \leq s \leq 1$), a second n-cladding layer 103 formed of n-$Al_{x2}Ga_{1-x2}N$ ($0.05 \leq x2 \leq 0.2$), an n-optical waveguide layer 16 (thickness: 0 to 0.15 μm) formed of n-GaN, an active layer 17 having a multiple quantum well structure (oscillation wavelength: 370 nm to 430 nm; total thickness: 5 nm to 60 nm) including $In_wGa_{1-w}N$ ($v<w \leq 0.2$) well layers and n-$In_vGa_{1-v}N$ ($0 \leq v<w$) barrier layers which are alternately laminated, a p-carrier block layer 18 (thickness: 0 to 0.04 μm, preferably 0 to 0.02 μm) formed of p-$Al_zGa_{1-z}N$ ($0<z \leq 0.3$), a p-optical waveguide layer 19 (thickness: 0.05 μm to 0.15 μm) formed of p-GaN, a first p-cladding layer 20 (thickness: 0.02 μm to 0.15 μm) formed of p-$Al_{y1}Ga_{1-y1}N$ ($y2<y1<0.2$), a second p-cladding layer 21 (thickness: equal to or greater than the thickness of the first p-cladding layer 20; for example, 0.4 μm) formed of p-$Al_{y2}Ga_{1-y2}N$ ($0<y2<y1$), and a p-contact layer 22 (thickness: 0.01 μm to 10 μm) formed of p-GaN. The total thickness of the first n-cladding layer 101 and the n-buffer layer 102 and the second n-cladding layer 103 is 0.8 μm or more. The thickness of the first n-cladding layer 101 is 0.4 μm or more. The thickness of the second n-cladding layer 103 is 0.4 μm or more. The first n-cladding layer 101, the n-buffer layer 102, and the second n-cladding layer 103 will be collectively referred to as the "n-cladding layer assembly".

A ridge structure acting as a stripe waveguide of the nitride semiconductor laser device 1000 is provided by partially etching the p-contact layer 22, the second p-cladding layer 21, and the first p-cladding layer 20. Etching is stopped at a level in the first p-cladding layer 20. insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 10) act as mirrors, and thus form an optical resonator.

The nitride semiconductor laser device 1000 in the fifth example can be produced by substantially the same method as that of the nitride semiconductor laser device 200 in the first example except that the following step is added. During the growth of the n-cladding layer 101, the supply of TMG and TMA is stopped. The carrier gas is changed from $H_2$ to $N_2$. After the temperature is lowered to about 800° C., TMG is introduced at a flow rate of 15 μmol/min., TMI is introduced at a certain flow rate, and $SiH_4$ is introduced at a flowrate of 10 nmol/min. Thus, the n-buffer layer 102 formed of n-$In_sGa_{1-s}N$ ($0 \leq s \leq 1$) is grown to a thickness of 0 to 0.02 μm.

In the nitride semiconductor laser device 1000, the n-buffer layer 102 formed of n-$In_sGa_{1-s}N$ ($0 \leq s \leq 1$) and having a thickness of 0 to 0.02 μm is a part of the n-cladding layer assembly. AlN and GaN have a large difference in the grating constant. Therefore, when the n-cladding layer 101 formed of AlGaN, which is a mixture of AlN and GaN, is formed to a thickness of as great as 0.8 μm on the n-GaN layer 13, there generally occurs a problem in that many cracks occur in the n-cladding layer 101. In this example, two n-cladding layers 101 and 103 are grown with the n-buffer layer 102 interposed therebetween, and thus the total thickness of the n-cladding layers 101 and 103 is increased. However, since each of the n-cladding layers 101 and 103 is thinner, cracks are unlikely to occur. Since the n-buffer layer 102 inserted between the n-cladding layers 101 and 103 is as thin as 0.02 μm or less, the influence of the n-buffer layer 102 on the electric field in the perpendicular direction of the laser oscillation mode is insignificant. Thus, the effect of the present invention is sufficiently provided.

The nitride semiconductor laser device 1000 having the above-described structure has a slightly reduced threshold current density as compared to the nitride semiconductor laser device 200 in the first example. The nitride semiconductor laser device 1000 generates laser oscillation at 1.1 kA/$cm^2$, and has no ripple in the perpendicular FFP (in the nitride semiconductor laser device 200, there is a slight ripple in the perpendicular FFP). These differences occur since the provision of the n-cladding layer assembly, which has a total thickness (0.8 μm or more) larger than the thickness of a single n-cladding layer, improves the effect of confining light of the laser oscillation mode in the perpendicular direction.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

In this example, the first p-cladding layer 20 (having the lower refractive index) is on the first main surface of the p-cladding layer assembly (including the first p-cladding layer 20 and the second p-cladding layer 21). Alternatively, the first p-cladding layer 20 may be distanced from the first main surface of the p-cladding layer assembly. The distance between the second p-cladding layer 21 and the active layer 17 is 0.34 µm or less. The first p-cladding layer 20 is preferably provided as close as possible to the first main surface of the p-cladding layer assembly. More preferably, the first p-cladding layer 20 is provided in the p-cladding layer assembly and is distanced from the first main surface of the p-cladding layer assembly by 0.05 µm or less; i.e., is distanced from the active layer 17 by 0.24 µm or less. Still more preferably, the first p-cladding layer 20 is distanced from the active layer 17 by 0.05 µm or more. The thickness of the first p-cladding layer 20 is preferably in the range of 0.02 µm or more and 0.15 µm or less. The p-cladding layer assembly may include a layer having a thickness of 0.02 µm or less and formed of a material having a refractive index higher than an effective refractive index.

EXAMPLE 6

Figure 11:
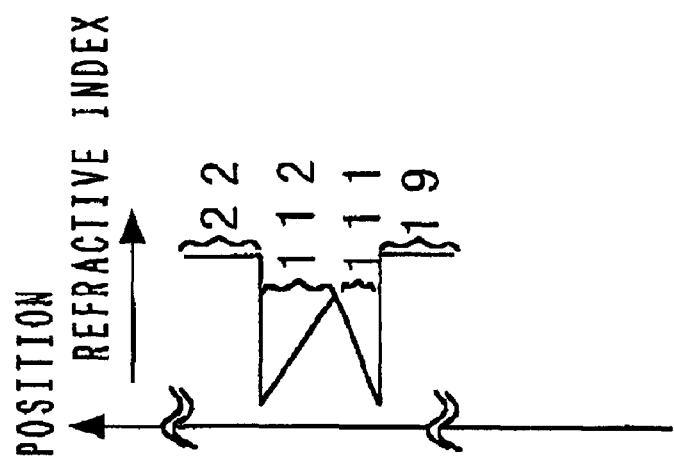
FIG. 11(a) is a schematic cross-sectional view illustrating a structure of a nitride semiconductor laser device according to a sixth example of the present invention.
FIG. 11(b) shows a refractive index distribution in a first p-cladding layer, a second p-cladding layer and the vicinity thereof of the nitride semiconductor laser device shown in FIG. 11(a)
Figure 11:
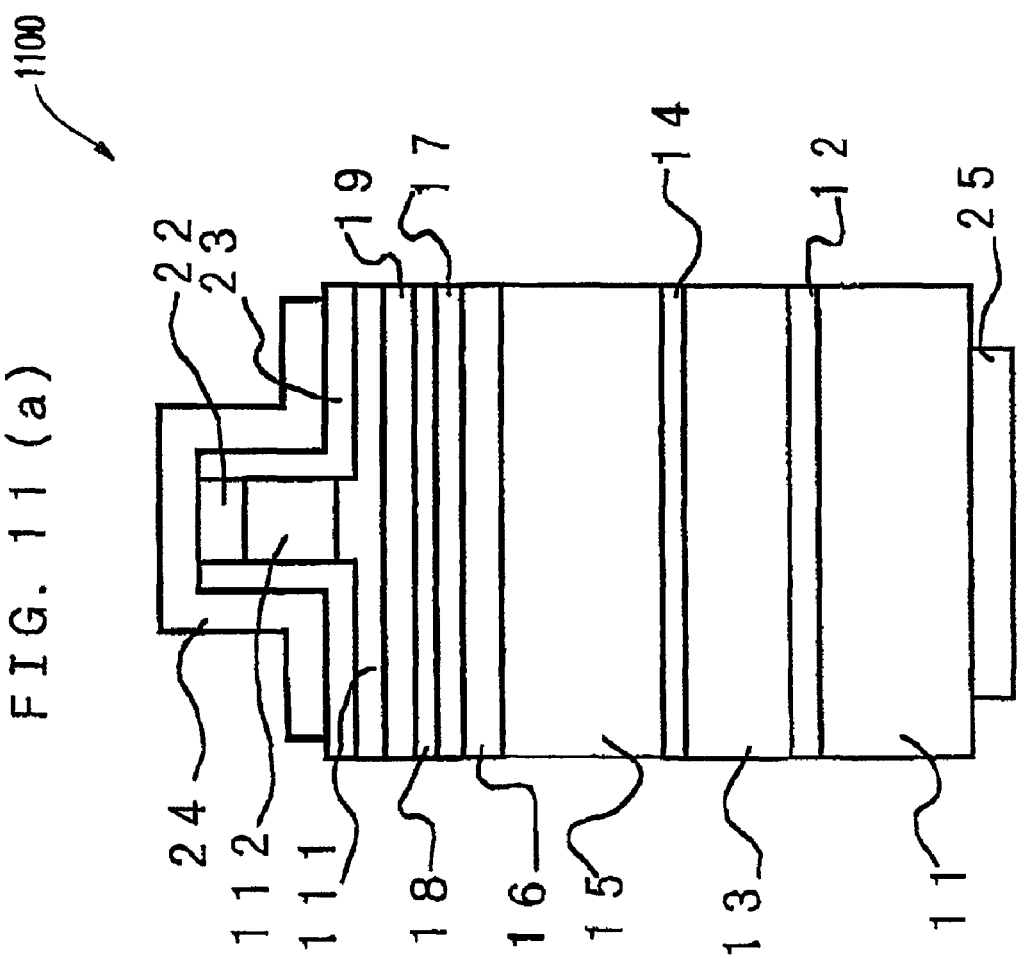

FIG. 11(a) is a schematic cross-sectional view illustrating a structure of a nitride semiconductor laser device 1100 according to a sixth example of the present invention. In the nitride semiconductor laser device 1100, a p-cladding layer is a graded layer. A resonator in the waveguide of the nitride semiconductor laser device 1100 has vertical faces.

As shown in FIG. 11(a), the nitride semiconductor laser device 1100 includes the following layers each formed of a nitride semiconductor material: a substrate 11 (thickness: 30 µm to 300 µm) formed of n-GaN, a low temperature growth buffer layer 12 (thickness: 0 to 10 µm) formed of GaN, an n-GaN layer 13 (thickness: 0.1 µm to 10 µm), an n-buffer layer 14 (thickness: 0 to 200 nm) formed of n-In$_r$Ga$_{1-r}$N ($0 \leq r \leq 0.2$), an n-cladding layer 15 formed of n-Al$_x$Ga$_{1-x}$N ($0.05 \leq x \leq 0.2$), an n-optical waveguide layer 16 (thickness: 0 to 0.15 µm) formed of n-GaN, an active layer 17 having a multiple quantum well structure (oscillation wavelength: 370 nm to 430 nm; total thickness: 5 nm to 60 nm) including In$_w$Ga$_{1-w}$N ($v<w \leq 0.2$) well layers and n-In$_v$Ga$_{1-v}$N ($0 \leq v<w$) barrier layers which are alternately laminated, a p-carrier block layer 18 (thickness: 0to 0.04 µm, preferably 0 to 0.02 µm) formed of p-Al$_z$Ga$_{1-z}$N ($0<z \leq 0.3$), a p-optical waveguide layer 19 (thickness: 0.05 µm to 0.15 µm) formed of p-GaN, a first p-cladding layer 111 (thickness: 0.02 µm to 0.15 µm) formed of p-Al$_{y1}$Ga$_{1-y1}$N (y2<y1) and having an Al content which generally continuously decreases toward a direction away from the p-optical waveguide layer 19, a second p-cladding layer 112 (thickness: equal to or greater than the thickness of the first p-cladding layer 111; for example, 0.4 µm) formed of p-Al$_{y2}$Ga$_{1-y2}$N (0<y2<y1) and having an Al content which generally continuously increases toward a direction away from the p-optical waveguide layer 19, and a p-contact layer 22 (thickness: 0.01 µm to 10 µm) formed of p-GaN. The first p-cladding layer 111 and the second p-cladding layer 112 will be collectively referred to as the "p-cladding layer assembly".

A ridge structure acting as a stripe waveguide of the nitride semiconductor laser device 1100 is provided by partially etching the p-contact layer 22, the second p-cladding layer 112, and the first p-cladding layer 111. Etching is stopped at a level in the first p-cladding layer 111. An insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 11(a)) act as mirrors, and thus form an optical resonator.

The nitride semiconductor laser device 100 in the sixth example can be produced by substantially the same method as that of the nitride semiconductor laser device 200 in the first example except that the following steps are added. While the first p-cladding layer 111 is grown, the Al content is generally continuously decreased. While the second p-cladding layer 112 is grown, the Al content is generally continuously increased.

In the nitride semiconductor laser device 1100, the Al content is generally continuously changed in the first p-cladding layer 111 and the second p-cladding layer 112. FIG. 11(b) shows the distribution of refractive indices in the vicinity of the first p-cladding layer 111 and the second p-cladding layer 112. The vertical axis represents the position in the vertical direction in the nitride semiconductor laser device 1100. An upper position along the vertical axis is closer to the top surface of the nitride semiconductor laser device 1100. The horizontal axis represents the refractive index. The refractive index increases from left to right. In FIG. 11(b), the reference numerals 19, 111, 112 and 22 represent the positions of the respective elements.

As can be seen from FIG. 11(b), the p-cladding layer assembly in the nitride semiconductor laser device 1100 includes a region having a refractive index which decreases toward the active layer 17. More specifically, the refractive index of the first p-cladding layer 111 (having the lower refractive index) decreases toward the active layer 17. Therefore, the nitride semiconductor laser device 1100 has a relationship between the FAHM value for the perpendicular FFP $\Theta \perp$ and the confinement factor for the active layer $\Gamma \perp$ similar to those shown in FIGS. 3 through 6.

The first p-cladding layer 111 (having the lower refractive index) may be provided anywhere in the p-cladding layer assembly. The distance between the second p-cladding layer 112 and the active layer 17 is 0.34 µm or less. The first p-cladding layer 111 is preferably distanced from the first main surface of the p-cladding layer assembly by 0.05 µm or less, i.e., is distanced from the active layer 17 by 0.24 µm or less. More preferably, the first p-cladding layer 111is distanced from the active layer 17 by 0.05 µm or more. The thickness of the first p-cladding layer 111 is preferably in the range of 0.02 µm or more and 0.15 µm or less.

The nitride semiconductor laser device 1100 having the above-described structure has substantially the same characteristics and effect of the nitride semiconductor laser device 200 in the first example.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

In this example, the first p-cladding layer 111 (having the lower refractive index) is on the first main surface of the p-cladding layer assembly. Alternatively, the first p-cladding layer 111 may be distanced from the first main surface of the p-cladding layer assembly. Still alternatively, the p-cladding layer assembly may include a layer having a thickness of 0.02 µm and formed of a material having a refractive index higher than an effective refractive index. The p-cladding layer assembly may include a layer having a thickness of 0.02 μm or less and containing InGaN or GaN. The n-cladding layer 15 may also include a layer having a thickness of 0.02 μm or less and containing InGaN or GaN.

EXAMPLE 7

Figure 12:
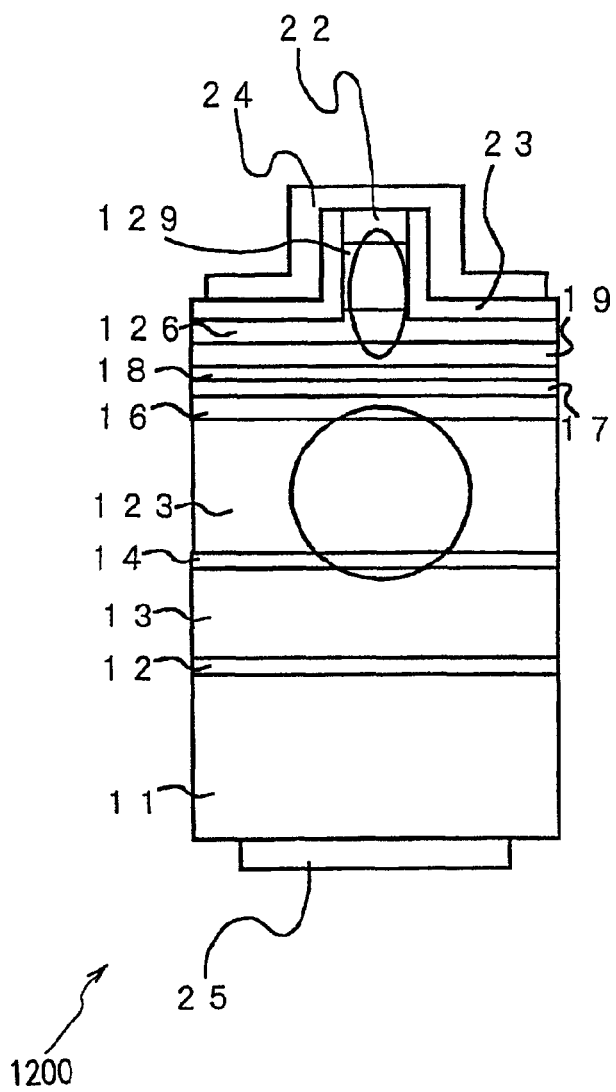
FIG. 12(a) is a schematic cross-sectional view illustrating a structure of a nitride semiconductor laser device according to a seventh example of the present invention.
FIG. 12(b) shows a structure of a p-cladding layer of the nitride semiconductor laser device shown in FIG. 12(a)
FIG. 12(c) shows a structure of an n-cladding layer of the nitride semiconductor laser device shown in FIG. 12(a)
Figure 12:
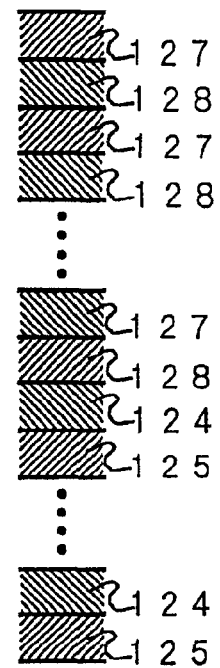
Figure 12:
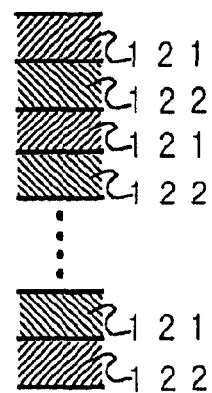

FIG. 12(a) is a schematic cross-sectional view illustrating a structure of a nitride semiconductor laser device 1200 according to a seventh example of the present invention. In the nitride semiconductor laser device 1200, an n-cladding layer and a p-cladding layer are each a superlattice layer. A resonator in the waveguide of the nitride semiconductor laser device 1200 has vertical faces.

As shown in FIG. 12(a), the nitride semiconductor laser device 1200 includes the following layers each formed of a nitride semiconductor material: a substrate 11 (thickness: 30 μm to 300 μm) formed of n-GaN, a low temperature growth buffer layer 12 (thickness: 0 to 10 μm) formed of GaN, an n-GaN layer 13 (thickness: 0.1 μm to 10 μm), an n-buffer layer 14 (thickness: 0 to 200 nm) formed of n-$In_rGa_{1-r}N$ ($0 \leq r \leq 0.2$), an n-superlattice cladding layer 123 (thickness: 0.8 μm or more), an n-optical waveguide layer 16 (thickness: 0 to 0.15 μm) formed of n-GaN, an active layer 17 having a multiple quantum well structure (oscillation wavelength: 370 nm to 430 nm; total thickness: 5 nm to 60 nm) including $In_wGa_{1-w}N$ ($v<w \leq 0.2$) well layers and n-$In_vGa_{1-v}N$ ($0 \leq v<w$) barrier layers which are alternately laminated, a p-carrier block layer 18 (thickness: 0 to 0.04 μm, preferably 0 to 0.02 μm) formed of p-$Al_zGa_{1-z}N$ ($0<z \leq 0.3$), a p-optical waveguide layer 19 (thickness: 0.05 μm to 0.15 μm) formed of p-GaN, a first p-superlattice cladding layer 126 (thickness: 0.02 μm to 0.15 μm), a second p-superlattice cladding layer 129 (thickness: equal to or greater than the thickness of the first p-superlattice cladding layer 126; for example, 0.8 μm), and a p-contact layer 22 (thickness: 0.01 μm to 10 μm) formed of p-GaN.

As shown in FIG. 12(c), the n-superlattice cladding layer 123 includes n-GaN layers 121 (thickness: 0 to 20 nm) and non-doped $Al_pGa_{1-p}N$ layers 122 ($0.05 \leq p \leq 0.2$; thickness: 0 to 20 nm) which are alternately laminated.

As shown in FIG. 12(b), the first p-superlattice cladding layer 126 includes p-GaN layers 124 (thickness: 0 to 20 nm) and non-doped AlGaN layers 125 (thickness: 0 to 20 nm) which are alternately laminated. The second p-superlattice cladding layer 129 includes p-GaN layers 127 (thickness: 0 to 20 nm) and non-doped AlGaN layers 128 (thickness: 0 to 20 nm) which are alternately laminated. The average Al content q of the first p-superlattice cladding layer 126 and the average Al content m of the second p-superlattice cladding layer 129 are expressed by $0<m<q$.

A ridge structure acting as a stripe waveguide of the nitride semiconductor laser device 1200 is provided by partially etching the p-contact layer 22, the second p-superlattice cladding layer 129, and the first p-superlattice cladding layer 126. Etching is stopped at a level in the first p-superlattice cladding layer 126. An insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 12(a)) act as mirrors, and thus form an optical resonator.

The nitride semiconductor laser device 1200 in the seventh example can be produced by substantially the same method as that of the nitride semiconductor laser device 200 in the first example except that the steps of forming the n-cladding layer, the first p-cladding layer and the second cladding layer are replaced with the steps of forming the n-superlattice cladding layer 123, the first p-superlattice cladding layer 126 and the second p-superlattice cladding layer 129. The superlattice cladding layers 123, 126 and 129 are formed by a known method, which will not be described herein.

In the nitride semiconductor laser device 1200, the n-cladding layer, the first p-cladding layer and the second p-cladding layer each have a superlattice structure. Due to the superlattice structure, the nitride semiconductor laser device 1200 have the following effects in addition to the effect provided by the nitride semiconductor laser device 200 in the first example. The n-superlattice cladding layer 123, the first p-superlattice cladding layer 126 and the second p-superlattice cladding layer 129 have a reduced layer resistance, which, in turn, reduces the driving voltage of the nitride semiconductor laser device 1200. The adoption of the superlattice structure reduces crystal defects, which would be otherwise caused by increasing the thickness of the cladding layers.

In the nitride semiconductor laser device 1200, the refractive index of each of the n-superlattice cladding layer 123, the first p-superlattice cladding layer 126 and the second p-superlattice cladding layer 129 is the average refractive index obtained from the refractive indices of the at least two layers having different compositions included in each superlattice cladding layer. Therefore, the nitride semiconductor laser device 1200 has a relationship between the FAHM value for the perpendicular FFP $\Theta\perp$ and the confinement factor for the active layer $\Gamma\perp$ similar to those shown in FIGS. 3 through 6.

The nitride semiconductor laser device 1200 having the above-described structure has a slightly reduced threshold current density generates laser oscillation at 1.1 kA/cm², and has no ripple in the perpendicular FFP (in the nitride semiconductor laser device 200, there is a slight ripple in the perpendicular FFP). These differences from the nitride semiconductor laser device 200 occur since the adoption of the superlattice structure for the cladding layers reduces the crystal defect which would be otherwise caused by increasing the thickness of the cladding layers. In addition, the nitride semiconductor laser device 1200 has a laser driving power of 0.2 W, which is a slight reduction from 0.3 W of the nitride semiconductor laser device 200 in the first example. This is caused by reduction in the threshold current and by reduction in the driving voltage.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

In this example, the first p-superlattice cladding layer 126 (having the lower refractive index) is on the first main surface of the p-superlattice cladding layer assembly (including the first p-superlattice cladding layer 126 and the second p-superlattice cladding layer 129). Alternatively, the first p-superlattice cladding layer 126 may be distanced from the first main surface of the p-superlattice cladding layer assembly. Still alternatively, the p-superlattice cladding layer assembly may include a layer having a thickness of 0.02 μm or less and formed of a material having a refractive index higher than an effective refractive index. The distance between the second p-superlattice cladding layer 129 and the active layer 17 is preferably 0.34 μm or less. The first p-superlattice cladding layer 126 is preferably as close as possible to the first main surface of the p-superlattice cladding layer assembly. More preferably, the first p-superlattice cladding layer 126 is distanced from the first main surface of the p-superlattice cladding layer assembly by 0.05 μm or less, i.e., is distanced from the active layer 17 by 0.24 μm or less. Still more preferably, the first p-superlattice cladding layer 126 is distanced from the active layer 17 by 0.05 μm or more. The thickness of the first p-superlattice cladding layer 126 is preferably in the range of 0.02 μm or more and 0.15 μm or less.

The p-superlattice cladding layer assembly may include a layer having a thickness of 0.02 μm or less and containing InGaN or GaN. The n-superlattice layer 123 may also include a layer having a thickness of 0.02 μm or less and containing InGaN or GaN.

In this example, the n-cladding layer and the two p-cladding layer all have a superlattice structure. A part of these three layers may be a single composition layer. In this example, each of the superlattice cladding layers includes an n- (or p-)GaN layer and a non-doped AlGaN layer. Combinations of other compositions may be used, as long as the Al contents of the materials are adjusted so that the average refractive index of the layers included in each superlattice cladding layer is a desirable value.

In this example, the superlattice structure includes two or more types of layers having different compositions alternately laminated. Alternatively, a superlattice structure in which the composition generally continuously changes as the thickness increases is usable. In this case, the average refractive index of each two adjacent layers is considered to be the refractive index of that position.

EXAMPLE 8

Figure 13:
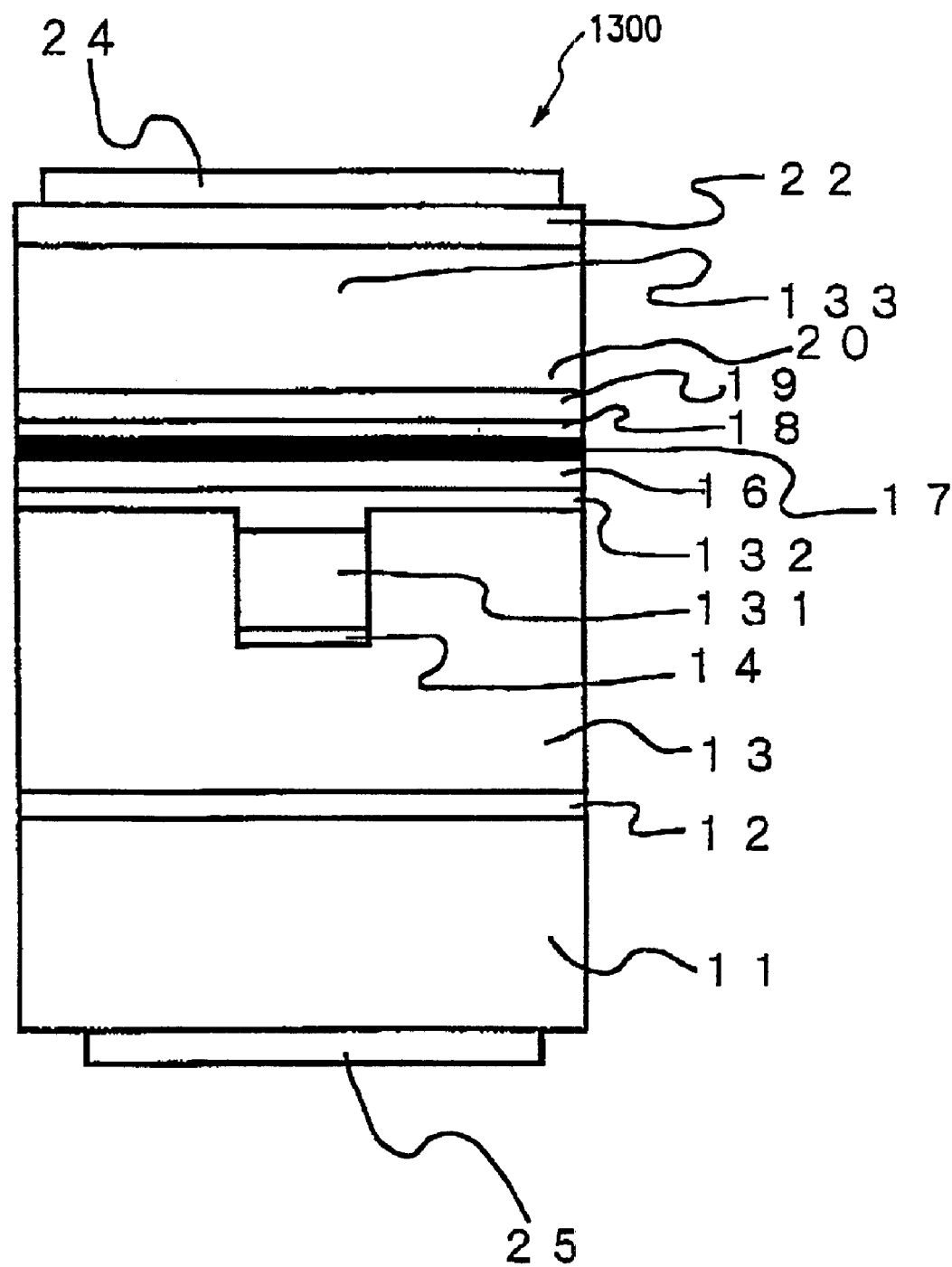
FIG. 13 is a schematic cross-sectional view illustrating a structure of a nitride semiconductor laser device according to an eighth example of the present invention.

FIG. 13 is a schematic cross-sectional view illustrating a structure of a nitride semiconductor laser device 1300 according to an eighth example of the present invention. The nitride semiconductor laser device 1300 includes a stripe ridge on the side of n-semiconductor layers, and also includes two n-cladding layers. The layer closer to the active layer has a lower refractive index than that of the other layer. A resonator in the waveguide of the nitride semiconductor laser device 1300 has vertical faces.

As shown in FIG. 13, the nitride semiconductor laser device 1300 includes the following layers each formed of a nitride semiconductor material: a substrate 11 (thickness: 30 μm to 300 μm) formed of n-GaN, a low temperature growth buffer layer 12 (thickness: 0 to 10 μm) formed of GaN, an n-GaN layer 13 (thickness: 0.1 μm to 10 μm), an n-buffer layer 14 (thickness: 0 to 200 nm) formed of n-In$_r$Ga$_{1-r}$N ($0 \leq r \leq 0.2$), a second n-cladding layer 131 (thickness: equal to or greater than the thickness of a first n-cladding layer 132; for example, 0.4 μm) formed of n-Al$_{x2}$Ga$_{1-x2}$N (x2<x1), the first n-cladding layer 132 (thickness: 0.02 μm to 0.15 μm) formed of n-Al$_{x1}$Ga$_{1-x1}$N ($0.05 \leq x2 < x1$), an n-optical waveguide layer 16 (thickness: 0.05 μm to 0.15 μm) formed of n-GaN, an active layer 17 having a multiple quantum well structure (oscillation wavelength: 370 nm to 430 nm; total thickness: 5 nm to 60 nm) including In$_w$Ga$_{1-w}$N ($v < w \leq 0.2$) well layers and n-In$_v$Ga$_{1-v}$N ($0 \leq v < w$) barrier layers which are alternately laminated, a p-carrier block layer 18 (thickness: 0 to 0.04 μm, preferably 0 to 0.02 μm) formed of p-Al$_z$Ga$_{1-z}$N ($0 < z \leq 0.3$), a p-optical waveguide layer 19 (thickness: 0 to 0.15 μm) formed of p-GaN, a p-cladding layer 133 (thickness: 0.4 μm or more) formed of p-Al$_y$Ga$_{1-y}$N (0.05<y 0.2), and a p-contact layer 22 (thickness: 0.01 m to 10 μm) formed of p-GaN. The first n-cladding layer 132 and the second n-cladding layer 131 will be collectively referred to as the "n-cladding layer assembly".

As shown in FIG. 13, the n-GaN layer 13 has a stripe recess provided by etching. The second n-cladding layer 131 is grown therein on the n-buffer layer 14. The sequentially formed semiconductor layers are substantially provided on the entirety of the surface of the n-GaN layer 13 so as to cover the second n-cladding layer 13. The positive electrode 24 is provided so as to substantially cover the entirety of the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 13) act as mirrors, and thus form an optical resonator.

The nitride semiconductor laser device 1300 in the eighth example can be produced, for example, as follows. The low temperature growth buffer layer 12 and the n-GaN layer 13 on the substrate 11 are formed in the same manner as that in the first example, and the description will be omitted here.

After the low temperature growth buffer layer 12 and the n-GaN layer 13 are grown, the supply of the gases is stopped and the temperature is lowered. At room temperature, the wafer is removed from the MOCVD apparatus. Then, known photolithography and known wet etching are used to form a mask substantially on the entirety of the n-GaN layer 13 except for the area where the stripe recess is to be formed. As a material for the mask, SiO$_2$, for example, is preferable. Then, dry etching is used to form the stripe recess in the unmasked area.

Next, the resultant wafer is again introduced into the MOCVD apparatus, and is treated in substantially the same manner as in the first example, thereby growing the n-buffer layer 14 and the second n-cladding layer 131.

The wafer is removed from the MOCVD apparatus, and the mask is removed by wet etching. The wafer is again introduced into the MOCVD apparatus, and treated in substantially the same manner as in the first example, thereby growing the first n-cladding layer 132 and the other semiconductor layers.

Then, the positive electrode 24 is formed substantially on the entirety of the top surface of the p-contact layer 22. As a material for the positive electrode 24, Au/Ni or Au/Pd, for example, is usable. The negative electrode 25 is formed substantially on the entirety of the n-substrate 11. As a material for the negative electrode 25, Al/Ti or Au/W, for example, is usable. surfaces acting as mirrors of the resonator. Thus, the nitride semiconductor laser device 1300 shown in FIG. 13 is completed.

In the nitride semiconductor laser device 1300, a structure for confining light of the laser oscillation mode in the horizontal direction is formed on the side of n-semiconductor layers. The first n-cladding layer 132 (having the lower refractive index) is provided as a part of the n-cladding layer assembly. In such a structure, the contact area of the positive electrode 24 and the p-contact layer 22 is increased, and therefore the contact resistance of the positive electrode 24 is significantly reduced. As a result, the driving voltage of the nitride semiconductor laser device 1300 is reduced.

The nitride semiconductor laser device 1300 having the above-described structure has the same characteristics as those shown in FIGS. 3 through 6, and provides the effect of the present invention. The nitride semiconductor laser device 1300 generates laser oscillation at 1.2 kA/cm², and has an operating power of 0.2 W for an output of 10 mW.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

In this example, the first n-cladding layer 132 (having the lower refractive index) is on the first main surface of the n-cladding layer assembly. Alternatively, the first n-cladding layer 132 may be distanced from the first main surface of the n-cladding layer assembly. Still alternatively, the n-cladding layer assembly may include a layer having a thickness of 0.02 μm or less and formed of a material having a refractive index higher than an effective refractive index. The distance between the second n-cladding layer 131 and the active layer 17 is preferably 0.34 μm or less. The first n-cladding layer 132 is preferably as close as possible to the first main surface of the n-cladding layer assembly. More preferably, the first n-cladding layer 132 is distanced from the first main surface of the n-cladding layer assembly by 0.05 μm or less, i.e., is distanced from the active layer 17 by 0.24 μm or less. Still more preferably, the first n-cladding layer 132 is distanced from the active layer 17 by 0.05 μm or more. The thickness of the first n-cladding layer 132 is preferably in the range of 0.02 μm or more and 0.15 μm or less.

The p-cladding layer 133 may include a layer having a thickness of 0.02 μm or less and containing InGaN or GaN. The n-cladding layer assembly may also include a layer having a thickness of 0.02 μm or less and containing InGaN or GaN.

In this example, the p-cladding layer and the two n-cladding layer are all formed of a single crystalline material. A part or all of the cladding layers may have a superlattice structure, or a structure in which the Al content gradually continuously changes as the thickness increases.

EXAMPLE 9

Figure 14:
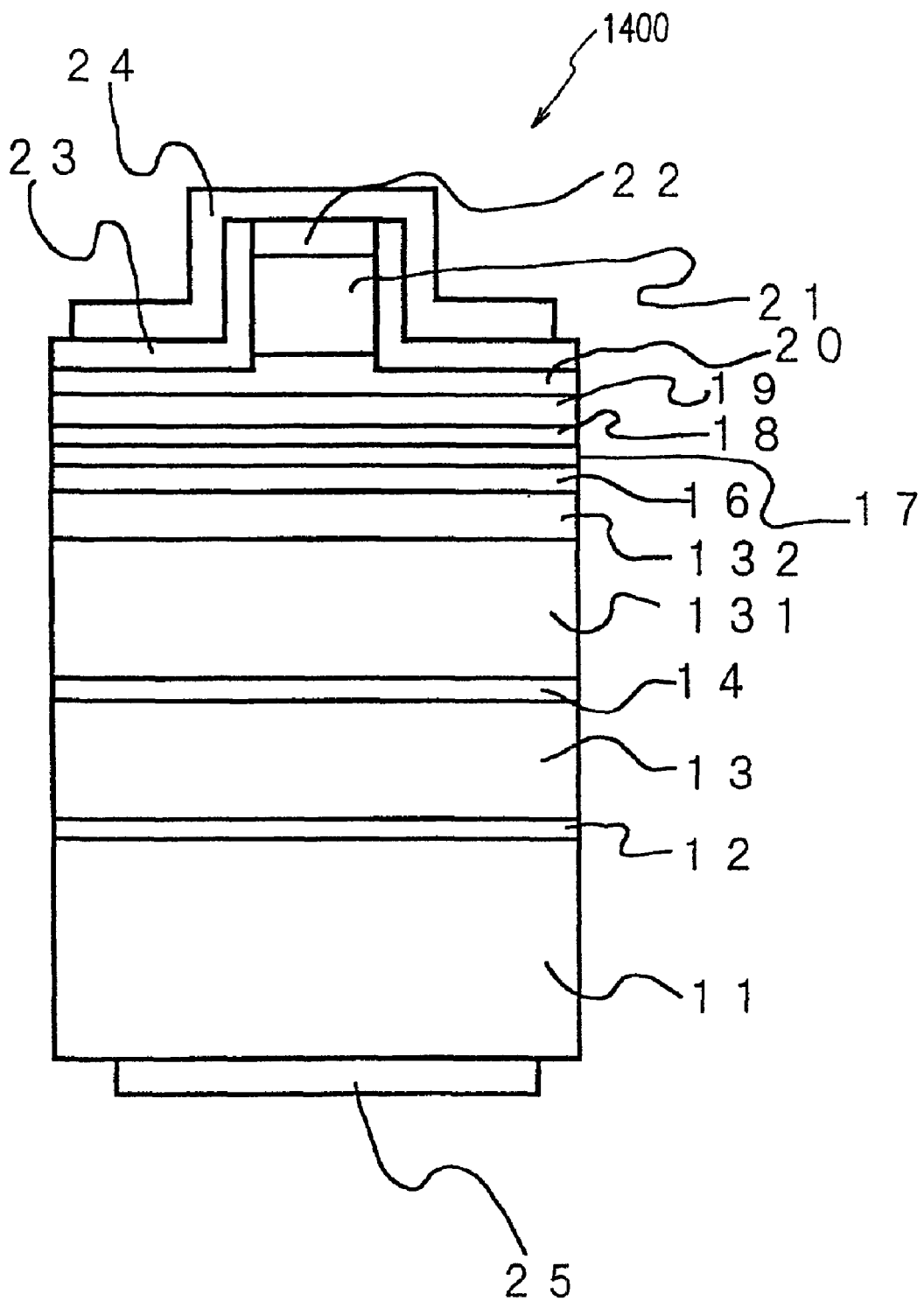
FIG. 14 is a schematic cross-sectional view illustrating a structure of a nitride semiconductor laser device according to a ninth example of the present invention.

FIG. 14 is a schematic cross-sectional view illustrating a structure of a nitride semiconductor laser device 1400 according to a ninth example of the present invention. The nitride semiconductor laser device 1400 includes two p-cladding layers and two n-cladding layers. One of the two p-cladding layers which is closer to the active layer has a lower refractive index than that of the other p-cladding layer. One of the two n-cladding layers which is closer to the active layer has a lower refractive index than that of the other n-cladding layer. A resonator in the waveguide of the nitride semiconductor laser device 1400 has vertical faces.

As shown in FIG. 14, the nitride semiconductor laser device 1400 includes the following layers each formed of a nitride semiconductor material: a substrate 11 (thickness: 30 μm to 300 μm) formed of n-GaN, a low temperature growth buffer layer 12 (thickness: 0 to 10 μm) formed of GaN, an n-GaN layer 13 (thickness: 0.1 μm to 10 μm), an n-buffer layer 14 (thickness: 0 to 200 nm) formed of n-$In_rGa_{1-r}N$ ($0 \leq r \leq 0.2$), a second n-cladding layer 131 (thickness: equal to or greater than the thickness of the first n-cladding layer 132; for example, 0.4 μm) formed of n-$Al_{x2}Ga_{1-x2}N$ (x2<x1), a first n-cladding layer 132 (thickness: 0.02 μm to 0.15 μm) formed of n-$Al_{x1}Ga_{1-x1}N$ ($0.05 \leq x2 < x1$), an n-optical waveguide layer 16 (thickness: 0.05 μm to 0.15 μm) formed of n-GaN, an active layer 17 having a multiple quantum well structure (oscillation wavelength: 370 nm to 430 nm; total thickness: 5 nm to 60 nm) including $In_wGa_{1-w}N$ ($v<w \leq 0.2$) well layers and n-$In_vGa_{1-v}N$ ($0 \leq v<w$) barrier layers which are alternately laminated, a p-carrier block layer 18 (thickness: 0 to 0.04 μm, preferably 0 to 0.02 μm) formed of p-$Al_zGa_{1-z}N$ ($0<z \leq 0.3$), a p-optical waveguide layer 19 (thickness: 0.05 μm to 0.15 μm) formed of p-GaN, a first p-cladding layer 20 (thickness: 0.02 μm to 0.15 μm) formed of p-$Al_{y1}Ga_{1-y1}N$ (y2<y1<0.2), a second p-cladding layer 21 (equal to or greater than the thickness of the first p-cladding layer 20; for example, 4.0 μm) formed of p-$Al_{y2}Ga_{1-y2}N$ (o<y2<y1), and a p-contact layer 22 (thickness: 0.01 μm to 10 μm) formed of p-GaN. The first n-cladding layer 132 and the second n-cladding layer 131 will be collectively referred to as the "n-cladding layer assembly". The first p-cladding layer 20 and the second p-cladding layer 21 will be collectively referred to as the "p-cladding layer assembly".

A ridge structure acting as a stripe waveguide of the nitride semiconductor laser device 1400 is provided by partially etching the p-contact layer 22, the second p-cladding layer 21 and the first p-cladding layer 20. Etching is stopped at a level in the first p-cladding layer 20. An insulating layer 23 is provided so as to cover the entirety of the surfaces exposed by etching except for a portion of the p-contact layer 22 which is to contact a positive electrode 24. The positive electrode 24 is provided so as to substantially cover the entirety of the insulating layer 23 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 14) act as mirrors, and thus form an optical resonator.

The nitride semiconductor laser device 1400 in the ninth example can be produced by substantially the same method as that of the nitride semiconductor laser device 200 in the first example except that the step of forming two n-cladding layers 131 and 132 having different compositions from each other is performed in accordance with a known method instead of forming one n-cladding layer.

In the nitride semiconductor laser device 1400, the n-cladding layer assembly includes a layer having the lower refractive index (first n-cladding layer 132), and the p-cladding layer assembly also includes a layer having the lower refractive index (first p-cladding layer 20). Due to such a structure, the effect of the present invention is enhanced; i.e., the Θ⊥ is further reduced while restricting the reduction in the confinement factor for the active layer in the perpendicular direction Γ⊥.

In the nitride semiconductor laser device 1400, laser oscillation is generated at 1.2 kA/cm². The FFP is almost circular with the FAHM value for the perpendicular FFP of 11 degrees and the ellipticity of 1.4.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

In this example, the first n-cladding layer 132 (having the lower refractive index) is on the first main surface of the n-cladding layer assembly, and the first p-cladding layer 20 (having the lower refractive index) is on the first main surface of the p-cladding layer assembly. Alternatively, the first n-cladding layer 132 and the first p-cladding layer 20 may respectively be distanced from the main surface of the n-cladding layer assembly and the main surface of the p-cladding layer assembly. Still alternatively, the n-cladding layer assembly and the p-cladding layer assembly may each include a layer having a thickness of 0.02 μm or less and formed of a material having a refractive index higher than an effective refractive index. The distance between the second n-cladding layer 131 and the active layer 17, and the distance between the second p-cladding layer 21 and the active layer 17, is each 0.34 μm or less. The first n-cladding layer 132 and the first p-cladding layer 20 are respectively preferably provided as close as possible to the first main surface of the n-cladding layer assembly and the first main surface of the p-cladding layer assembly. More preferably, the first n-cladding layer 132 and the first p-cladding layer 20 are respectively distanced from the first main surface of the n-cladding layer assembly and the first main surface of the p-cladding layer assembly by 0.05 μm or less, i.e., are each distanced from the active layer 17 by 0.24 μm or less. Still more preferably, the first n-cladding layer 132 and the first p-cladding layer 20 are each distanced from the active layer 17 by 0.05 μm or more. The thickness of each of the first n-cladding layer 132 and the first p-cladding layer 20 is preferably in the range of 0.02 μm or more and 0.15 μm or less.

The p-cladding layer assembly may include a layer having a thickness of 0.02 μm or less and containing InGaN or GaN. The n-cladding layer assembly may also include a layer having a thickness of 0.02 μm or less and containing InGaN or GaN.

In this example, the two n-cladding layers and the two p-cladding layers are all formed of a single crystalline material. A part or all of the cladding layers may have a superlattice structure, or a structure in which the Al content gradually continuously changes as the thickness increases.

EXAMPLE 10

Figure 15:
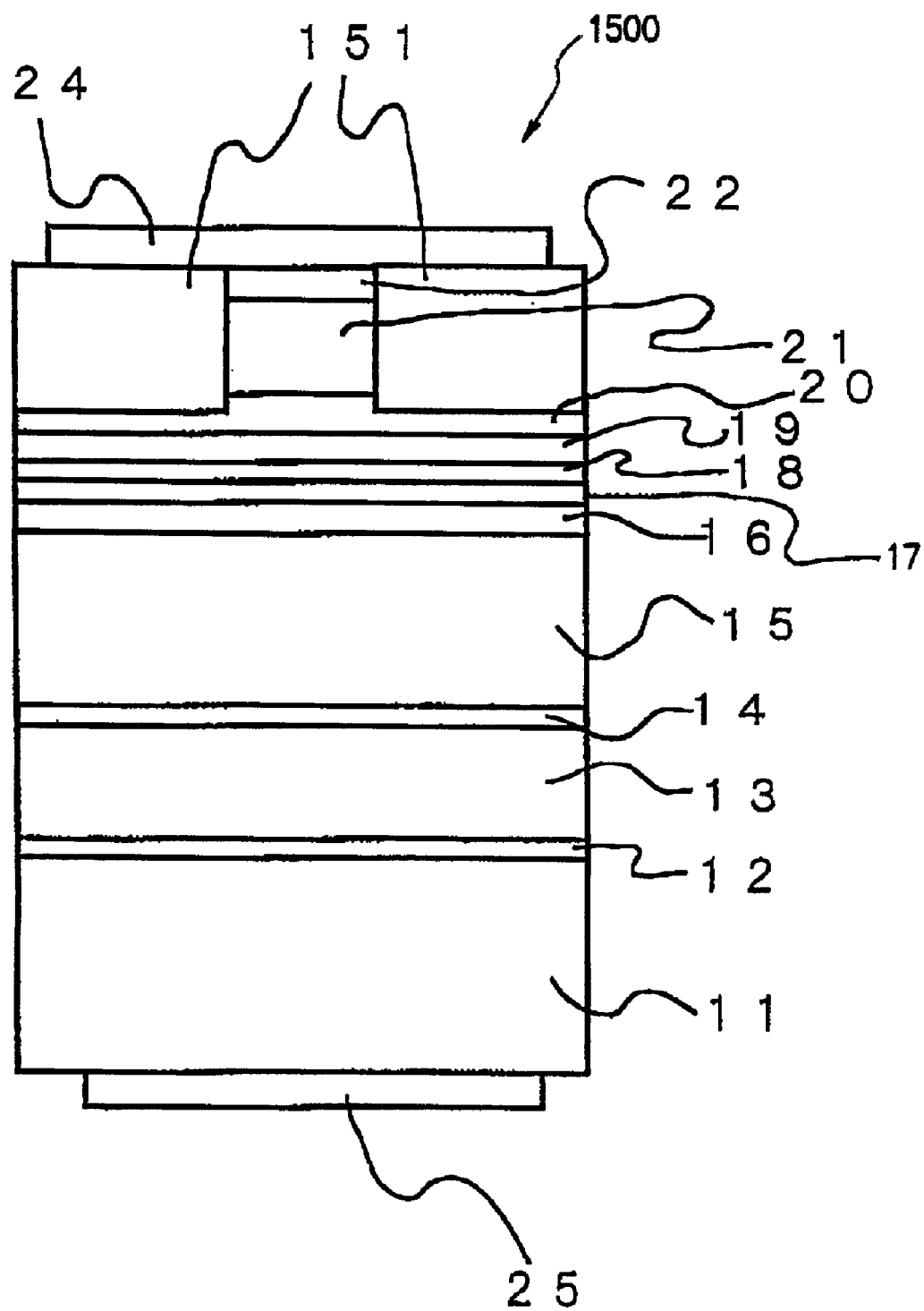
FIG. 15 is a schematic cross-sectional view illustrating a structure of a nitride semiconductor laser device according to a tenth example of the present invention.

FIG. 15 is a schematic cross-sectional view illustrating a structure of a nitride semiconductor laser device 1500 according to a tenth example of the present invention. The nitride semiconductor laser device 1500 includes a layer provided on side surfaces of the ridge and formed of a material having a refractive index which is close to that of the first p-cladding layer. A resonator in the waveguide of the nitride semiconductor laser device 1500 has vertical faces.

As shown in FIG. 15, the nitride semiconductor laser device 1500 includes the following layers each formed of a nitride semiconductor material: a substrate 11 (thickness: 30 μm to 300 μm) formed of n-GaN, a low temperature growth buffer layer 12 (thickness: 0 to 10 μm) formed of GaN, an n-GaN layer 13 (thickness: 0.1 μm to 10 μm), an n-buffer layer 14 (thickness: 0 to 200 nm) formed of n-In$_r$Ga$_{1-r}$N (0≦r≦0.2), an n-cladding layer 15 (thickness: 0.4 μm or more) formed of n-Al$_x$Ga$_{1-x}$N (0.05≦x≦0.2), an n-optical waveguide layer 16 (thickness: 0 to 0.15 μm) formed of n-GaN, an active layer 17 having a multiple quantum well structure (oscillation wavelength: 370 nm to 430 nm; total thickness: 5 nm to 60 nm) including In$_w$Ga$_{1-w}$N (v<w≦0.2) well layers and n-In$_v$Ga$_{1-v}$N (0≦v<w) barrier layers which are alternately laminated, a p-carrier block layer 18 (thickness: 0 to 0.04 μm, preferably 0 to 0.02 μm) formed of p-Al$_z$Ga$_{1-z}$N (0<z≦0.3), a p-optical waveguide layer 19 (thickness: 0.05 μm to 0.15 μm) formed of p-GaN, a first p-cladding layer 20 (thickness: 0.02 μm to 0.15 μm) formed of p-Al$_{y1}$Ga$_{1-y1}$N (y2<y1<0.2), a second p-cladding layer 21 (thickness: equal to or greater than the thickness of the first p-cladding layer 20; for example, 0.4 μm) formed of p-Al$_{y2}$Ga$_{1-y2}$N (0<y2<y1), and a p-contact layer 22 (thickness: 0.01 μm to 10 μm) formed of p-GaN.

A ridge structure acting as a stripe waveguide of the nitride semiconductor laser device 1500 is provided by partially etching the p-contact layer 22, the second p-cladding layer 21 and the first p-cladding layer 20. Etching is stopped at a level in the first p-cladding layer 20. A buried layer 151 is provided so as to substantially cover the entirety of the surfaces exposed by etching except for a portion of the p-contact layer 22 which is to contact a positive electrode 24. The buried layer 151 is formed of n-Al$_{y3}$Ga$_{1-y3}$N (0≦y3≦0.2). The positive electrode 24 is provided so as to substantially cover the entirety of the buried layer 151 and also cover the top surface of the p-contact layer 22. A negative electrode 25 is provided substantially on the entirety of a main surface of the n-substrate 11 which is opposite to the main surface having the nitride semiconductor layers thereon. End surfaces of the ridge (i.e., surfaces parallel to the sheet of FIG. 15) act as mirrors, and thus form an optical resonator.

The nitride semiconductor laser device 200 in the first example can be produced, for example, as follows. Until the p-contact layer 22 is formed, the process is the same as that in the first example and will not be described here.

After the p-contact layer 22 is grown, photolithography and wet etching is used to form a stripe mask for forming the ridge on the p-contact layer 22.

Then, reactive ion etching is used to partially etch the p-contact layer 22, the second p-cladding layer 21 and the first p-cladding layer 20, leaving a middle part thereof so as to have a width of 1 μm to 4 μm (for example, 2 μm). Etching is stopped at a level in the first p-cladding layer 20. Thus, the stripe ridge structure acting as an optical waveguide is formed.

Then, the resultant wafer is introduced into the MOCVD apparatus without removing the mask. The temperature is raise to about 750° C. While the carrier gas H$_2$ is caused to flow and the TMG is introduced at a flow rate of 50 μmol/min., the TMA at a certain flow rate, and SiH$_4$ at a flow rate of 10 nmol/min., the buried layer 151 formed of n-AlGaN (having an Al content which is, for example, equal to that of the first p-cladding layer 20) is formed on the entirety of the surfaces exposed by etching except for the portion of the p-contact layer 22 which is to contact the positive electrode 24. Then, the supply of all the gases is stopped, and the temperature is lowered. At room temperature, the wafer is removed from the MOCVD apparatus.

Next, wet etching is used to remove the mask. The positive electrode 24 is formed substantially on the entirety of the buried layer 151 and on the top surface of the p-contact layer 22. As a material for the positive electrode 24, Au/Ni or Au/Pd, for example, is usable. The negative electrode 25 is formed substantially on the entirety of the n-substrate 11. As a material for the negative electrode 25, Al/Ti or Au/W, for example, is usable.

Then, the wafer is cleaved so as to form end surfaces acting as mirrors of the resonator. Thus, the nitride semiconductor laser device 1500 shown in FIG. 15 is completed.

In the nitride semiconductor laser device 1500, the buried layer 151 is formed of a material having substantially the same refractive index as that of the first p-cladding layer 20. In the case of the conventional nitride semiconductor laser device 1700 (FIG. 17) and the nitride semiconductor laser device 200 (FIG. 2), it is difficult to control the depth of reactive ion etching with a sufficient precision when forming the strip ridge acting as the optical waveguide. A production error of ±0.05 μm is inevitable. As a result, the nitride semiconductor laser device has a variance of about ±2 degrees in the FAHM value for the horizontal FFP, which reduces the production yield.

By contrast, in the case of the nitride semiconductor laser device 1500 in this example, reactive ion etching is performed down to an intermediate level of the first p-cladding layer 20, and then the buried layer 151 is formed of a material having substantially the same refractive index as that of the first p-cladding layer 20. Due to such a structure, the influence of the production error in etching depth on the characteristics of the nitride semiconductor laser device is substantially eliminated.

In the nitride semiconductor laser device 1500 in this example, it is necessary to stop etching at a level in the first p-cladding layer 20 as an etching bottom. In the case where the thickness of the first p-cladding layer 20 is set to be 0.1 $\mu$m or more, the production error of ±0.05 $\mu$m in the depth direction can be permitted. When the positional error in etching bottom is allowed to be reduced by future improvements in etching technology, the thickness of the first p-cladding layer 20 can be set to be smaller. It should be noted that in order to provide a sufficient influence on the $\Gamma\perp$ and the $\Theta\perp$, the thickness of the first p-cladding layer 20 is preferably in the range of 0.02 $\mu$m or more and 0.15 $\mu$m or less.

Hereinafter, with reference to FIGS. 20 through 23, examples of designing the Al content of the first p-cladding layer 20 and the second p-cladding layer 21 will be described.

Figure 20:
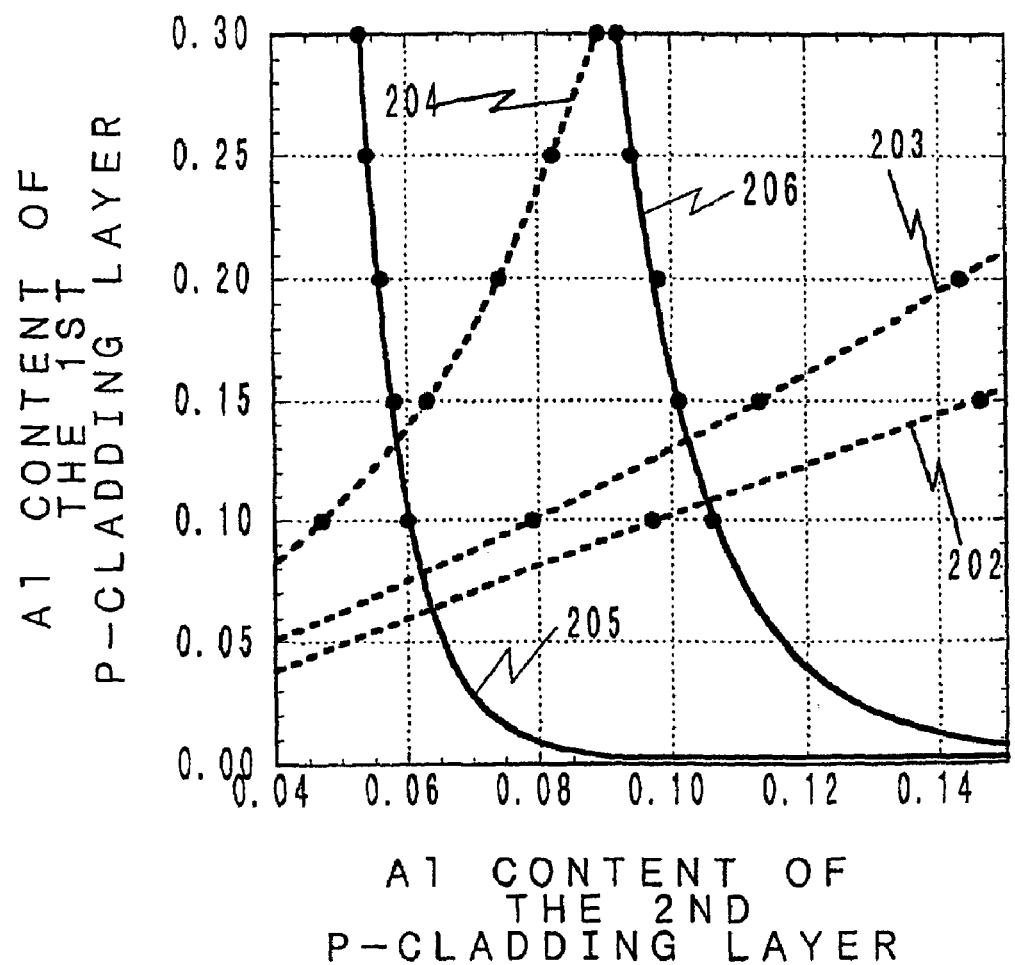
FIG. 20 is a graph illustrating the relationship among the Al content of the first p-cladding layer, the Al content of the second p-cladding layer, and each of the confinement factor for the active layer in the perpendicular direction ($\Gamma\perp$) and the confinement factor for the active layer in the horizontal direction ($\Gamma\parallel$) of a nitride semiconductor laser device according to the tenth example of the present invention when the thickness of the first p-cladding layer is 0.02 µm.

FIG. 20 shows the relationship among the Al content of the first p-cladding layer 20, the Al content of the second p-cladding layer 21, and each of the confinement factor for the active layer in the perpendicular direction ($\Gamma\perp$) and the confinement factor for the active layer in the horizontal direction ($\Gamma\|$) when the thickness of the first p-cladding layer 20 is 0.02 $\mu$m. The vertical axis represents the Al content of the first p-cladding layer 20, and the horizontal axis represents the Al content of the second p-cladding layer 21. Hereinafter, the confinement factor for the active layer in the perpendicular direction will be referred to as the $\Gamma\perp$, and the confinement factor for the active layer in the horizontal direction will be referred to as the $\Gamma\|$.

The relationship shown in FIG. 20 is found with an assumption that the structural parameters other than the Al contents of the first p-cladding layer 20 and the second p-cladding layer 21 are set to be the most preferable values for the first example.

In FIG. 20, curve 202 is obtained by plotting points at which the $\Gamma\|$ is 0.85 when the thickness of the first p-cladding layer 20 is 0.02 $\mu$m. Curve 203 is obtained by plotting points at which the $\Gamma\|$ is 0.90 when the thickness of the first p-cladding layer 20 is 0.02 $\mu$m. Curve 204 is obtained by plotting points at which the $\Gamma\|$ is 0.95 when the thickness of the first p-cladding layer 20 is 0.02 $\mu$m. In order to restrict the laser oscillation in the high order lateral mode, the $\Gamma\|$ is preferably set to a value in the range of 0.85 to 0.95, and more preferably to 0.90 and the vicinity thereof. In order to set the $\Gamma\|$ in the above-described range, the Al contents in the first p-cladding layer 20 and the second p-cladding layer 21 are preferably in an area which is above and left of curve 202 and below and right of curve 204, and more preferably on curve 203 and in the vicinity thereof.

As shown in FIG. 19, the Al content of the second p-cladding layer 20 is less than 0.04, the necessary thickness of the second p-cladding layer 21 increases. Therefore, the Al content of the second p-cladding layer 21 is preferably 0.04 or more. When the Al content of the second p-cladding layer 21 is more than 0.15, the layer resistance of the second p-cladding layer 21 rapidly increases. Therefore, the Al content of the second p-cladding layer 21 is preferably 0.15 or less.

In this example, the Al content of the first p-cladding layer 20 needs to be larger than the Al content of the second p-cladding layer 21 in order to provide a difference in the refractive index in the horizontal direction between the first p-cladding layer 20 and the second p-cladding layer 21. This condition is constantly fulfilled as long as the $\Gamma\|$ is 0.85 or more as shown in FIG. 20. When the Al content of the first p-cladding layer 20 is more than 0.30, the layer resistance of the first p-cladding layer 20 rapidly increases. Therefore, the Al content of the first p-cladding layer 20 is preferably 0.30 or less. Since the first p-cladding layer 20 is thinner than the second p-cladding layer 21, the upper limit of the Al content of the first p-cladding layer 20 is higher than that of the second p-cladding layer 21.

In FIG. 20, curve 205 is obtained by plotting points at which the $\Gamma\perp$ is 0.033 when the thickness of the first p-cladding layer 20 is 0.02 $\mu$m. Curve 206 is obtained by plotting points at which the $\Gamma\perp$ is 0.037 when the thickness of the first p-cladding layer 20 is 0.02 $\mu$m. In a conventional semiconductor laser device having the structure of the nitride semiconductor laser device 1500 in this example except that the p-cladding layers have a total thickness equal to the thickness of the n-cladding layer and has an Al content equal to that of the n-cladding layer, the $\Gamma\perp$ is 0.037. Curves 205 is obtained by plotting the points at which the $\Gamma\perp$ is 90%, and curve 206 is obtained by plotting the points at which the $\Gamma\perp$ is 100%. The values of 90% and 100% are relative values with respect to the value of 0.037.

The value of $\Gamma\perp$ itself is preferably as large as possible. However, when the $\Gamma\perp$ is increased, the required Al contents of the first p-cladding layer 20 and the second p-cladding layer 21 also increase. Therefore, cracks caused by the difference in the lattice constant between AlGaN and GaN are likely to occur. This lowers the reliability and production yield of nitride semiconductor laser devices. In order to prevent this, the $\Gamma\perp$ (relative value) is preferably set to a value in the range of 90% to 105%.

As described above, the Al content of the second p-cladding layer 21 is preferably in the range of 0.04 or more and 0.15 or less. The Al content of the first p-cladding layer 20 is preferably larger than that of the second p-cladding layer 21 and 0.30 or less. As shown in FIG. 20, the condition of the $\Gamma\perp$ (relative value) $\leq$105% is constantly fulfilled as long as the Al contents of the first p-cladding layer 20 and the second p-cladding layer 21 are respectively in these ranges.

Where the Al content of the first p-cladding layer 20 is y1 and the Al content of the second p-cladding layer 21 is y2, curve 202 is approximately represented by:

$$y2=0.0036+0.90169 \times y1.$$

Curve 203 is approximately represented by:

$$y2=-0.0099995+1.095 \times y1 \leq -2.5833 \times y1^2+5.9997 \times y1^3-6.6663 \times y1^4.$$

Curve 204 is approximately represented by:

$$y2=-0.008+0.74333 \times y1-2.2 \times y1^2+2.6667 \times y1^3-0.000044879 \times y1^4.$$

Curve 205 is approximately represented by:

$$y2=0.046185 \times y1^{(-0.11622)}.$$

Curve 206 is approximately represented by:

$$y2=0.078855xy1^{(-0.012984)}.$$

Figure 21:
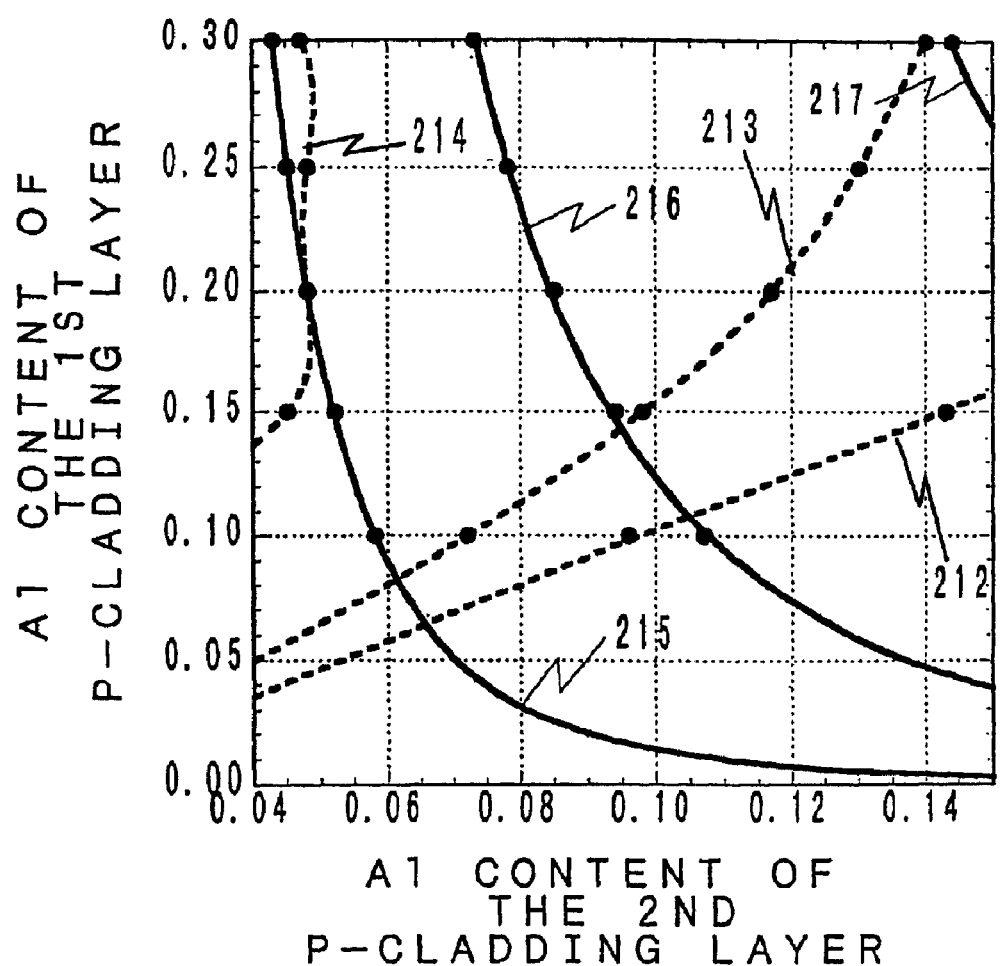
FIG. 21 is a graph illustrating the relationship among the Al content of the first p-cladding layer, the Al content of the second p-cladding layer, and each of the confinement factor for the active layer in the perpendicular direction ($\Gamma\perp$) and the confinement factor for the active layer in the horizontal direction ($\Gamma\parallel$) of a nitride semiconductor laser device according to the tenth example of the present invention when the thickness of the first p-cladding layer is 0.05 µm.

FIG. 21 shows the relationship among the Al content of the first p-cladding layer 20, the Al content of the second p-cladding layer 21, and each of the confinement factor for the active layer in the perpendicular direction ($\Gamma\perp$) and the confinement factor for the active layer in the horizontal direction ($\Gamma\|$) when the thickness of the first p-cladding layer 20 is 0.05 µm. The vertical axis represents the Al content of the first p-cladding layer 20, and the horizontal axis represents the Al content of the second p-cladding layer 21.

The relationship shown in FIG. 21 is found with an assumption that the structural parameters other than the Al contents of the first p-cladding layer 20 and the second p-cladding layer 21 are set to be the most preferable values for the first example.

In FIG. 21, curves 212, 213 and 214 are respectively obtained by plotting points at which the $\Gamma\|$ is 0.85, 0.90, and 0.95 when the thickness of the first p-cladding layer 20 is 0.05 µm. In order to restrict the laser oscillation in the high order lateral mode, the $\Gamma\|$ is preferably set to a value in the range of 0.85 to 0.95, and more preferably to 0.90 and the vicinity thereof. In order to set the $\Gamma\|$ in the above-described range, the Al contents in the first p-cladding layer 20 and the second p-cladding layer 21 are preferably above and left of curve 212, and more preferably on and in the vicinity of curve 213.

As described above with reference to FIG. 20, the Al content of the second p-cladding layer 21 is preferably 0.04 or more and 0.15 or less. The Al content of the first p-cladding layer 20 is preferably larger than that of the second p-cladding layer 21 and 0.30 or less.

In FIG. 21, curves 215, 216 and 217 are respectively obtained by plotting points at which the $\Gamma\perp$ is 0.033, 0.037 and 0.039 when the thickness of the first p-cladding layer 20 is 0.05 µm. Like in FIG. 20, curves 215, 216 and 217 are respectively obtained by plotting the points at which the relative value of $\Gamma\perp$ is 90%, 100% and 105%.

The value of $\Gamma\perp$ itself is preferably as large as possible. However, when the $\Gamma\perp$ is increased, the required Al contents of the first p-cladding layer 20 and the second p-cladding layer 21 also increase. Therefore, cracks caused by the difference in the lattice constant between AlGaN and GaN are likely to occur. This lowers the reliability and production yield of nitride semiconductor laser devices. In order to prevent this, the $\Gamma\perp$ (relative value) is preferably set to a value in the range of 90% to 105%.

Where the Al content of the first p-cladding layer 20 is y1 and the Al content of the second p-cladding layer 21 is y2, curve 212 is approximately represented by:

$$y2=0.0086+0.89xy1.$$

Curve 213 is approximately represented by:

$$y2=0.0050002+0.7xy1+0.3667xy1^2-8.0001xy1^3+13.333xy1^4.$$

Curve 214 is approximately represented by:

$$y2=-0.557+11.128xy1-75.583xy1^2+224.67xy1^3-246.67xy1^4.$$

Curve 215 is approximately represented by:

$$y2=0.030851xy1^{(-0.27442)}.$$

Curve 216 is approximately represented by:

$$y2=0.048157xy1^{(-0.34927)}.$$

Curve 217 is approximately represented by:

$$y2=0.094234xy1^{(-0.35119)}.$$

Figure 22:
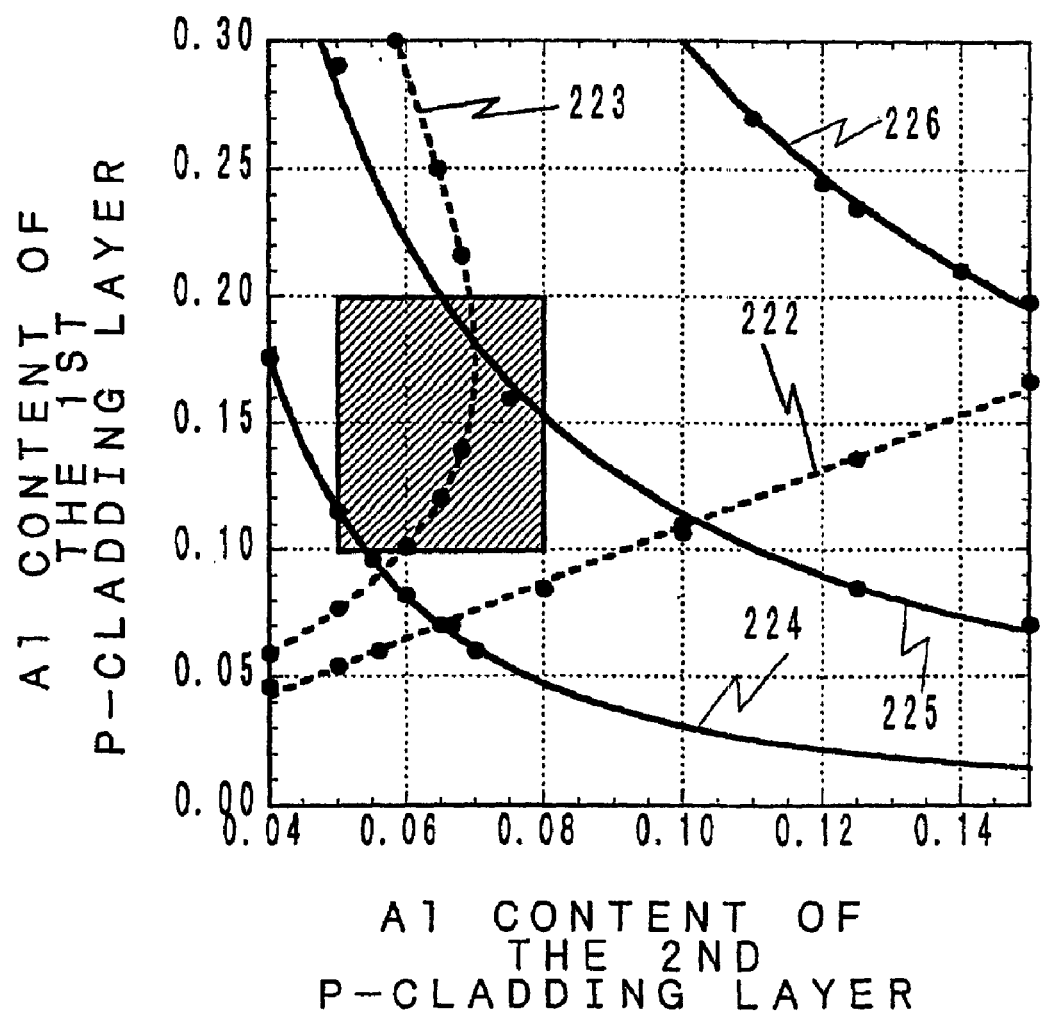
FIG. 22 is a graph illustrating the relationship among the Al content of the first p-cladding layer, the Al content of the second p-cladding layer, and each of the confinement factor for the active layer in the perpendicular direction ($\Gamma\perp$) and the confinement factor for the active layer in the horizontal direction ($\Gamma\parallel$) of a nitride semiconductor laser device according to the tenth example of the present invention when the thickness of the first p-cladding layer is 0.10 µm.

FIG. 22 shows the relationship among the Al content of the first p-cladding layer 20, the Al content of the second p-cladding layer 21, and each of the confinement factor for the active layer in the perpendicular direction ($\Gamma\perp$) and the confinement factor for the active layer in the horizontal direction ($\Gamma\|$) when the thickness of the first p-cladding layer 20 is 0.10 µm. The vertical axis represents the Al content of the first p-cladding layer 20, and the horizontal axis represents the Al content of the second p-cladding layer 21.

The relationship shown in FIG. 22 is found with an assumption that the structural parameters other than the Al contents of the first p-cladding layer 20 and the second p-cladding layer 21 are set to be the most preferable values for the first example.

In FIG. 22, curves 222 and 223 are respectively obtained by plotting points at which the $\Gamma\perp$ is 0.85 and 0.90 when the thickness of the first p-cladding layer 20 is 0.10 µm. In order to restrict the laser oscillation in the high order lateral mode, the $\Gamma\|$ is preferably set to a value in the range of 0.85 to 0.95, and more preferably to 0.90 and the vicinity thereof. In order to set the $\Gamma\|$ in the above-described range, the Al contents in the first p-cladding layer 20 and the second p-cladding layer 21 are preferably above and left of curve 222, and more preferably on and in the vicinity of curve 223.

As described above with reference to FIG. 20, the Al content of the second p-cladding layer 21 is preferably 0.04 or more and 0.15 or less. The Al content of the first p-cladding layer 20 is preferably larger than that of the second p-cladding layer 21 and 0.30 or less. As shown in FIG. 22, the condition of the $\Gamma\|$ 0.95 is constantly fulfilled as long as the Al contents of the first p-cladding layer 20 and the second p-cladding layer 21 are respectively in these ranges.

In FIG. 22, curves 224, 225 and 226 are respectively obtained by plotting points at which the $\Gamma\perp$ is 0.033, 0.037 and 0.039 when the thickness of the first p-cladding layer 20 is 0.10 µm. Like in FIG. 20, curves 224, 225 and 226 are respectively obtained by plotting the points at which the relative value of $\Gamma\perp$ is 90%, 100% and 105%.

The value of $\Gamma\perp$ itself is preferably as large as possible. However, when the $\Gamma\perp$ is increased, the required Al contents of the first p-cladding layer 20 and the second p-cladding layer 21 also increase. Therefore, cracks caused by the difference in the lattice constant between AlGaN and GaN are likely to occur. This lowers the reliability and production yield of nitride semiconductor laser devices. In order to prevent this, the $\Gamma\perp$ (relative value) is preferably set to a value in the range of 90% to 105%.

Where the Al content of the first p-cladding layer 20 is y1 and the Al content of the second p-cladding layer 21 is y2, curve 222 is approximately represented by:

$$y2=0.017974+0.90169xy1.$$

Curve 223 is approximately represented by:

$$y2=-0.016415+1.3098xy1-6.8072xy1^2+14.144xy1^3+10.773xy1^4.$$

Curve 224 is approximately represented by:

$$y2=0.016137xy1^{(-0.76812)}.$$

Curve 225 is approximately represented by:

$$y2=0.018854xy1^{(-0.95084)}.$$

Curve 226 is approximately represented by:

$$y2=0.031792xy1^{(-0.95084)}.$$

Figure 23:
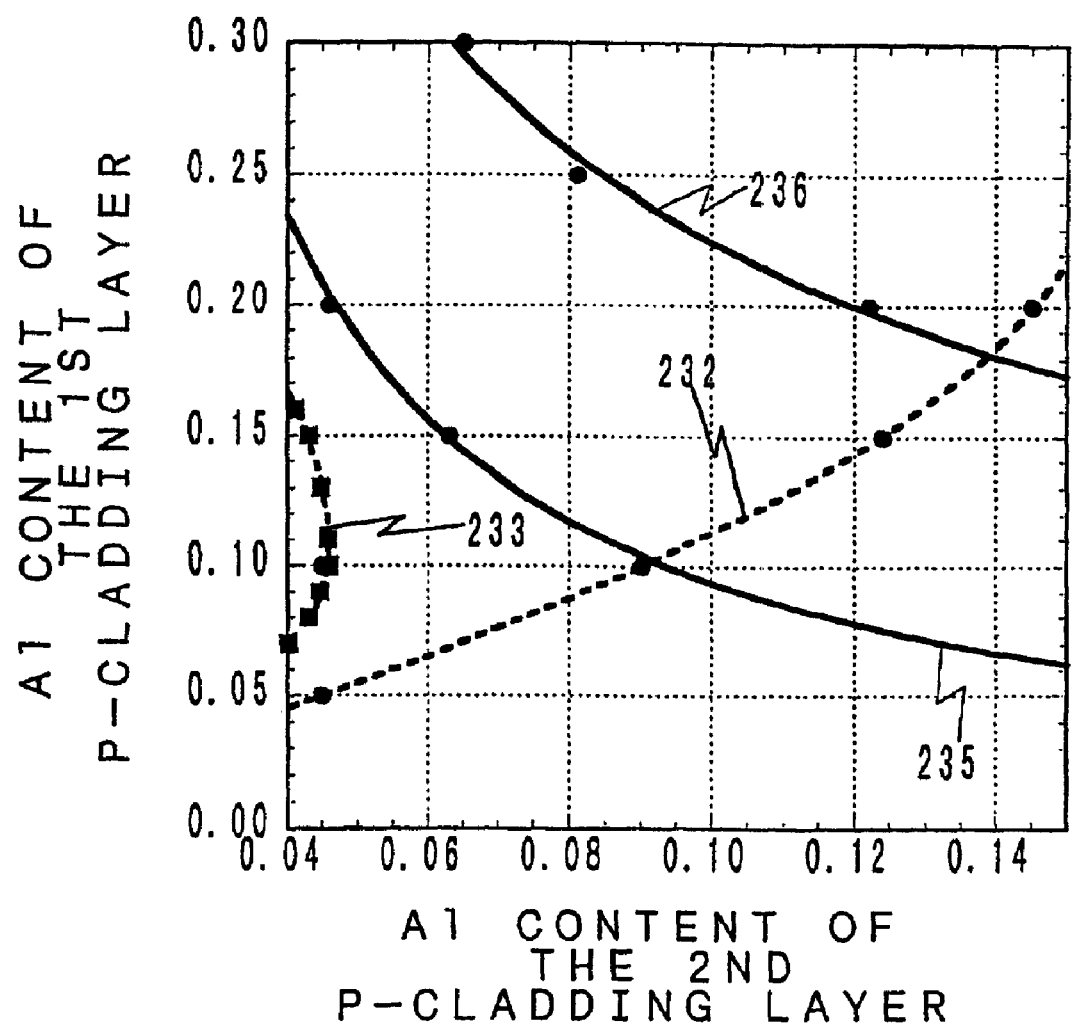
FIG. 23 is a graph illustrating the relationship among the Al content of the first p-cladding layer, the Al content of the second p-cladding layer, and each of the confinement factor for the active layer in the perpendicular direction ($\Gamma\perp$) and the confinement factor for the active layer in the horizontal direction ($\Gamma\parallel$) of a nitride semiconductor laser device according to the tenth example of the present invention when the thickness of the first p-cladding layer is 0.15 µm.

FIG. 23 shows the relationship among the Al content of the first p-cladding layer 20, the Al content of the second p-cladding layer 21, each of the contours regarding the confinement factor for the active layer in the perpendicular direction ($\Gamma\bot$) and the confinement factor for the active layer in the horizontal direction ($\Gamma\|$) when the thickness of the first p-cladding layer 20 is 0.15 μm. The vertical axis represents the Al content of the first p-cladding layer 20, and the horizontal axis represents the Al content of the second p-cladding layer 21.

The relationship shown in FIG. 23 is found with an assumption that the structural parameters other than the Al contents of the first p-cladding layer 20 and the second p-cladding layer 21 are set to be the most preferable values for the first example.

In FIG. 23, curves 232 and 233 are respectively obtained by plotting points at which the $\Gamma\|$ is 0.85 and 0.90 when the thickness of the first p-cladding layer 20 is 0.15 μm. In order to restrict the laser oscillation in the high order lateral mode, the $\Gamma\|$ is preferably set to a value in the range of 0.85 to 0.95, and more preferably to 0.90 and the vicinity thereof. In order to set the $\Gamma\|$ in the above-described range, the Al contents in the first p-cladding layer 20 and the second p-cladding layer 21 are preferably above and left of curve 232, and more preferably on and in the vicinity of curve 233.

As described above with reference to FIG. 20, the Al content of the second p-cladding layer 21 is preferably 0.04 or more and 0.15 or less. The Al content of the first p-cladding layer 20 is preferably larger than that of the second p-cladding layer 21 and 0.30 or less. As shown in FIG. 23, the condition of the $\Gamma\| \leq 5$ 0.95 is constantly fulfilled as long as the Al contents of the first p-cladding layer 20 and the second p-cladding layer 21 are respectively in these ranges.

In FIG. 23, curves 235 and 236 are respectively obtained by plotting points at which the $\Gamma\bot$ is 0.037 and 0.039 when the thickness of the first p-cladding layer 20 is 0.15 μm. Like in FIG. 20, curves 235 and 236 are respectively obtained by plotting the points at which the relative value of $\Gamma\bot$ is 100% and 105%.

The value of $\Gamma\bot$ itself is preferably as large as possible. However, when the $\Gamma\bot$ is increased, the required Al contents of the first p-cladding layer 20 and the second p-cladding layer 21 also increase. Therefore, cracks caused by the difference in the lattice constant between AlGaN and GaN are likely to occur. This lowers the reliability and production yield of nitride semiconductor laser devices. In order to prevent this, the $\Gamma\bot$ (relative value) is preferably set to a value in the range of 90% to 105%.

As described above with reference to FIG. 20, the Al content of the second p-cladding layer 21 is preferably 0.04 or more and 0.15 or less. The Al content of the first p-cladding layer 20 is preferably larger than that of the second p-cladding layer 21 and 0.30 or less. As shown in FIG. 23, the condition of the $\Gamma\bot$ (relative value) $\geq 90\%$ is constantly fulfilled as long as the Al contents of the first p-cladding layer 20 and the second p-cladding layer 21 are respectively in these ranges.

Where the Al content of the first p-cladding layer 20 is y1$\leq$ and the Al content of the second p-cladding layer 21 is y2, curve 232 is approximately represented by:

$$y2=-0.010417+1.1914xy1-1.5286xy1^2-3.9518xy1^3+6.3332xy1^4.$$

Curve 233 is approximately represented by:

$$y2=-0.053801+2.8079xy1-29.349xy1^2+137.53xy1^3-253.58xy1^4.$$

Curve 235 is approximately represented by:

$$y2=0.0094661xy1^{(-0.99455)}.$$

Curve 236 is approximately represented by:

$$y2=0.0096716xy1^{(-1.5633)}.$$

The $\Gamma\bot$ has a larger influence on the threshold current of a semiconductor laser device than the $\Gamma\|$. Where the bulk gain of an area of the active layer corresponding to the stripe ridge is g, the bulk absorption of an area of the active layer not corresponding to the stripe waveguide is α, and the resonator loss is α0, the oscillation condition of the semiconductor laser device is represented by the following expression.

$$\Gamma_\bot(\Gamma_\| g - (1-\Gamma_{81})\alpha) = \alpha_0$$

Assuming that g linearly relies on the injected current, g is represented by the following expression.

$$g = \beta\left(\frac{J_{th}\eta}{d1} - J_0\right)$$

where β and J0 are constants, d1 is the total thickness of the well layer, and η is the coupling efficiency of naturally released light. The threshold current density Jth is represented by:

$$J_{th} = \frac{d_1}{\eta}\left(J_0 + \frac{\alpha_0}{\Gamma_\bot \Gamma_\| \beta} + \left(\frac{1}{\Gamma_\|} - 1\right) \cdot \frac{\alpha}{\beta}\right)$$

According to this expression, when the $\Gamma\bot$ decreases, only the second term increases and thus Jth increases. When the $\Gamma\|$ decreases, the second term and also the third term contribute to the increase of Jth. Usually, the resonator loss α0 is on the order of several tens per centimeter, whereas the bulk absorption α of an area of the active layer not corresponding to the stripe waveguide is on the order of several thousands to several tens of thousands per centimeter. Therefore, the contribution of the third term is significant. Thus, the $\Gamma\|$ has a larger influence on the threshold current of a semiconductor laser device than the $\Gamma\bot$. Consequently, the nitride semiconductor laser device 1500 in this example is preferably designed so as not to decrease the $\Gamma\|$.

In consideration of the above, in the nitride semiconductor laser device 1500 in this example, the $\Gamma\|$ is preferably 0.85 or more and 0.95 or less. This condition can be fulfilled as follows.

(1) When the thickness d [μm] of the first p-cladding layer 20 is $0.02 \leq d \leq 0.05$, the Al content y1 of the first p-cladding layer 20 and the Al content y2 of the second p-cladding layer 21 are preferably in an area held between curve 202 (FIG. 20) and curve 214 (FIG. 21). Therefore, the following conditions are preferably fulfilled.

$-0.557+11.128xy1-75.583xy1^2+224.67xy1^3-246.67xy1^4 \leq y2 \leq 0.0036+0.90169xy1;$ $y2 < y1 \leq 0.30;$ and $0.04 \leq y2 \leq 0.15.$ More preferably, the Al content y1 of the first p-cladding layer 20 and the Al content y2 of the second p-cladding layer 21 are in an area held between curve 204 (FIG. 20) and curve 212 (FIG. 21). Therefore, the following conditions are preferably fulfilled.

$$-0.008 + 0.74333 x y1 - \leq 2.2 x y1^2 + 2.6667 x y1^3 - 0.000044879 \times y1^4 \leq y2 \leq 0.0086 + 0.89 \times y1;$$

$$y2 < y1 \leq 0.30; \text{ and}$$

$$0.04 \leq y2 \leq 0.15.$$

(2) When the thickness d [μm] of the first p-cladding layer 20 is $0.05 \leq d \leq 0.10$, the Al content y1 of the first p-cladding layer 20 and the Al content y2 of the second p-cladding layer 21 are preferably in an area above and left of curve 212 (FIG. 21). Therefore, the following conditions are preferably fulfilled.

$$y2 \leq 0.0086 + 0.89 \times y1;$$

$$y2 < y1 \leq 0.30; \text{ and}$$

$$0.04 \leq y2 \leq 0.15.$$

More preferably, the Al content y1 of the first p-cladding layer 20 and the Al content y2 of the second p-cladding layer 21 are in an area held between curve 222 (FIG. 22) and curve 214 (FIG. 21). Therefore, the following conditions are preferably fulfilled.

$$-0.557 + 11.128 x y1 - 75.583 x y1^2 + 224.67 x y1^3 - 246.67 \times y1^4 \leq y2 \leq 0.017974 + 0.90169 x y1;$$

$$y2 < y1 \leq 0.30; \text{ and}$$

$$0.04 \leq y2 \leq 0.15.$$

(3) When the thickness d [μm] of the first p-cladding layer 20 is $0.10 \leq d \leq 0.15$, the Al content y1 of the first p-cladding layer 20 and the Al content y2 of the second p-cladding layer 21 are preferably in an area above and left of curve 222 (FIG. 22). Therefore, the following conditions are preferably fulfilled.

$$y2 \leq 0.017974 + 0.90169 x y1,$$

$$y2 < y1 \leq 0.30; \text{ and}$$

$$0.04 \leq y2 \leq 0.15.$$

More preferably, the Al content y1 of the first p-cladding layer 20 and the Al content y2 of the second p-cladding layer 21 are in an area above and left of curve 232 (FIG. 23). Therefore, the following conditions are preferably fulfilled.

$$y2 \leq -0.053801 + 2.8079 x y1 - 29.349 x y1^2 + 137.53 x y1^3 - 253.58 x y1^4;$$

$$y2 < y1 \leq 0.30; \text{ and}$$

$$0.04 \leq y2 \leq 0.15.$$

In the nitride semiconductor laser device 1500 in this example, the Γ⊥ (relative value) is equal to that of the conventional semiconductor laser device, i.e., 90% or more and 105% or less. This condition can be fulfilled as follows.

(1) When the thickness d [μm] of the first p-cladding layer 20 is $0.02 \leq d \leq 0.05$, the Al content y1 of the first p-cladding layer 20 and the Al content y2 of the second p-cladding layer 21 are preferably in an area above and right of curve 215 (FIG. 21). Therefore, the following conditions are preferably fulfilled.

$$0.030851 x y1^{(-0.27442)} \leq y2;$$

$$y2 < y1 \leq 0.30; \text{ and}$$

$$0.04 \leq y2 \leq 0.15.$$

More preferably, the Al content y1 of the first p-cladding layer 20 and the Al content y2 of the second p-cladding layer 21 are in an area held between curve 205 (FIG. 20) and curve 217 (FIG. 21). Therefore, the following conditions are preferably fulfilled.

$$0.046185 x y1^{(-0.11622)} \leq y2 \leq 0.094234 x y1^{(-0.35119)};$$

$$y < y1 \leq 0.30; \text{ and}$$

$$0.04 \leq y2 \leq 0.15.$$

(2) When d the thickness d [μm] of the first p-cladding layer 20 is $0.05 \leq d \leq 0.10$, the Al content y1 of the first p-cladding layer 20 and the Al content y2 of the second p-cladding layer 21 are preferably in an area held between curve 224 (FIG. 22) and curve 217 (FIG. 21). Therefore, the following conditions are preferably fulfilled.

$$0.016137 x y1^{(-0.52323)} \leq y2 \leq 0.094234 x y1^{(-0.35119)};$$

$$y2 < y1 \leq 0.30; \text{ and}$$

$$0.04 \leq y2 \leq 0.15.$$

More preferably, the Al content y1 of the first p-cladding layer 20 and the Al content y2 of the second p-cladding layer 21 are in an area held between curve 215 (FIG. 21) and curve 226 (FIG. 22). Therefore, the following conditions are preferably fulfilled.

$$0.030851 x y1^{(-0.27442)} \leq y2 \leq 0.031792 x y1^{(-0.95084)};$$

$$y2 < y1 \leq 0.30; \text{ and}$$

$$0.04 \leq y2 \leq 0.15.$$

(3) When the thickness d [μm] of the first p-cladding layer 20 is $0.10 \leq d \leq 0.15$, the Al content y1 of the first p-cladding layer 20 and the Al content y2 of the second p-cladding layer 21 are preferably in an area below and left of curve 226 (FIG. 22). Therefore, the following conditions are preferably fulfilled.

$$y2 \leq 0.031792 x y1^{(-0.95084)};$$

$$y2 < y1 \leq 0.30; \text{ and}$$

$$0.04 \leq y2 \leq 0.15.$$

More preferably, the Al content y1 of the first p-cladding layer 20 and the Al content y2 of the second p-cladding layer 21 are in an area held between curve 224 (FIG. 22) and curve 236 (FIG. 23). Therefore, the following conditions are preferably fulfilled.

$$0.016137 x y1^{(-0.52323)} \leq y2 \leq 0.0096716 x y1^{(-1.5633)};$$

$$y2 < y1 \leq 0.30; \text{ and}$$

$$0.04 \leq y2 \leq 0.15.$$

Assuming that the variance of the position of the etching bottom by the general etching technology is about ±0.05 μm in consideration of both the Γ⊥ and the Γ∥, the Al content y1 of the first p-cladding layer 20 and the Al content y2 of the second p-cladding layer 21 are preferably set in the following range hatched in FIG. 22.

$0.05 \leq d \leq 0.15;$ $0.04 \leq y1 \leq 0.08;$ and $0.10 \leq y2 \leq 0.20.$ The relationships shown in FIGS. 20 through 23 do not significantly change even when the other structural parameters change in the range according to the present invention and the laser oscillation wavelengths change in accordance with the change in the other structural parameters. The relationships shown in FIGS. 20 through 23 remain substantially the same when the nitride semiconductor laser device includes two n-cladding layers and the layer closer to the active layer has a lower refractive index than the other layer as in the eighth example. The relationships also remain substantially the same when the nitride semiconductor laser device includes two p-cladding layers and two n-cladding layers, and the p-cladding layer and the n-cladding closer to the active layer have a lower refractive index than the other layers as in the ninth example.

In the nitride semiconductor laser device 1500 in this example, the width of the stripe ridge is adjusted so that FAHM value for the horizontal FFP Θ∥ is 6 degrees to 10 degrees. For example, referring to FIG. 15, in the case where x=0.10, y1=0.15, y2=0.05 and the thickness of the p-optical waveguide layer 19 and the thickness of the n-optical waveguide layer 16 are each 0.1 μm, the Θ∥ is 8 degrees when the width of the stripe ridge is 2 μm. When the composition of a part or all of the semiconductor layers is changed, the width of the stripe ridge is set so that Θ∥ is a desired value. After that, the nitride semiconductor laser devices 1500 can be produced in the same manner with a high production yield with very little variance in the Θ∥. Regarding the width of the stripe ridge, there is a production error of about ±0.1 μm. However, the production error in the width of the stripe ridge has a much smaller influence on the Θ∥ and thus on the variance in the characteristics than the production error in the etching depth. Therefore, the adjustment of the width of the stripe ridge can improve the production yield of the semiconductor laser device.

The nitride semiconductor laser device 1500 having the above-described structure has substantially the same characteristics and effect of the nitride semiconductor laser device 200 in the first example.

In this example, the substrate 11 is formed of n-GaN. Alternatively, the substrate may be formed of a single crystal of sapphire ($Al_2O_3$), spinel 111 plane ($MgAl_2O_4$), SiC, MgO, Si, ZnO or the like.

In this example, the first p-cladding layer 20 (having the lower refractive index) is on the first main surface of the p-cladding layer assembly (including the first p-cladding layer 20 and the second p-cladding layer 21). Alternatively, the first p-cladding layer 20 may be distanced from the first main surface of the p-cladding layer assembly. Still alternatively, the p-cladding layer assembly may include a layer having a thickness of 0.02 μm or less and formed of a material having a refractive index higher than an effective refractive index. The distance between the second p-cladding layer 21 and the active layer 17 is preferably 0.34 μm or less. The first p-cladding layer 20 is preferably as close as possible to the first main surface of the p-cladding layer assembly. More preferably, the first p-cladding layer 20 is distanced from the first main surface of the p-cladding layer assembly by 0.05 μm or less, i.e., is distanced from the active layer 17 by 0.24 μm or less. Still more preferably, the first p-cladding layer 20 is distanced from the active layer 17 by 0.05 μm or more. The thickness of the first p-cladding layer 20 is preferably in the range of 0.02 μm or more and 0.15 μm or less.

The p-cladding layer assembly may include a layer having a thickness of 0.02 μm or less and containing InGaN or GaN. The n-cladding layer 15 may also include a layer having a thickness of 0.02 μm or less and containing InGaN or GaN.

In this example, the two p-cladding layers and the n-cladding layer are all formed of a single crystalline material. A part or all of the cladding layers may have a superlattice structure, or a structure in which the Al content gradually continuously changes as the thickness increases.

In this example, the buried layer 151 is formed of n-$Al_{y3}Ga_{1-y3}N$ having substantially the same Al content as that of the first p-cladding layer 20. Alternatively, the buried layer 151 may be non-doped or formed of non-doped n-$Al_{y3}Ga_{1-y3}N$ having substantially the same Al content as that of the first p-cladding layer 20. The buried layer 151 may also contain In. The buried layer 151 may be formed of an insulating material having substantially the same refractive index as that of the first p-cladding layer 20 (for example, $TiO_2$, $ZrO_2$, $HfO_2$, $CeO_2$, $In_2O_3$, $Nd_2O_3$, $Sb_2O_3$, $SnO_2$, $Ta_2O_5$, ZnO, or ZnMgCdSSe compound semiconductor). The buried layer 151 may have a lamination structure including two or more types of layers having different compositions from each other, which are alternately laminated (the thickness of each layer is 0.02 μm or less). In this case, the composition of the materials is adjusted so that the average refractive index is substantially the same as that of the first p-cladding layer 20.

EXAMPLE 11

Figure 16:
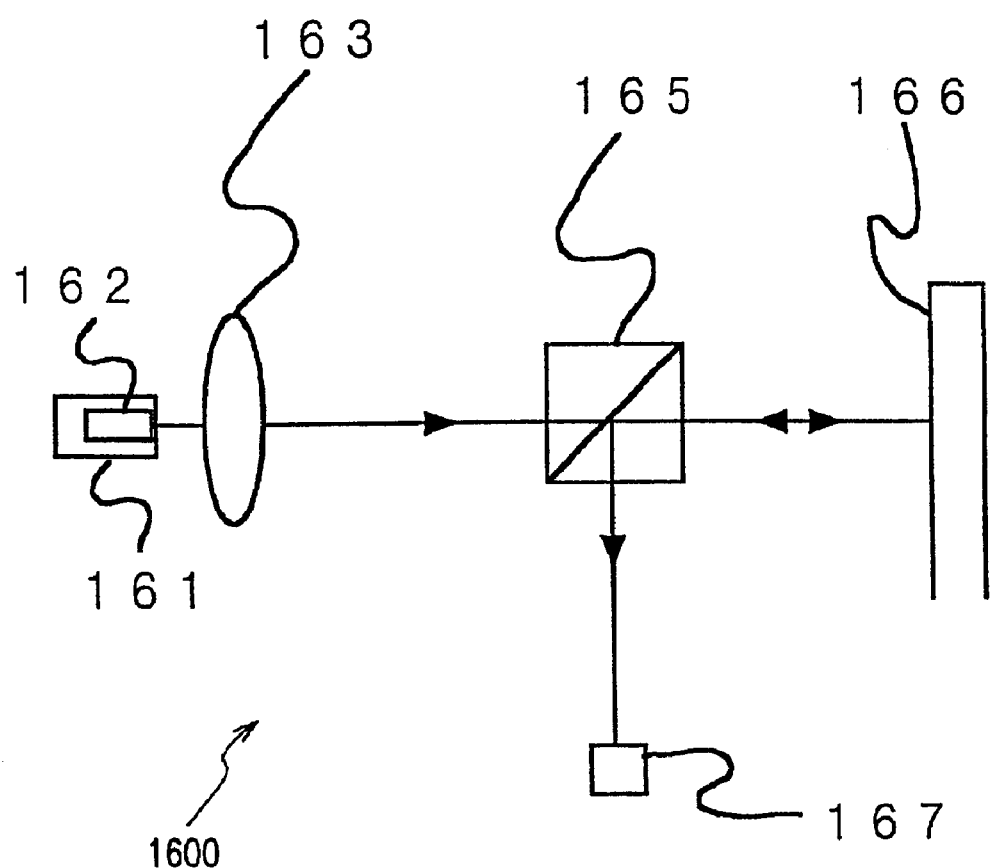
FIG. 16 is a schematic view illustrating a structure of an optical information reproduction apparatus according to an eleventh example of the present invention.

In an eleventh example, an optical information reproduction apparatus 1600 according to the present invention will be described. FIG. 16 is a schematic view illustrating a structure of the optical information reproduction apparatus 1600. It should be noted that FIG. 16 excludes parts which are not necessary for this explanation for the sake of simplicity.

The optical information reproduction apparatus 1600 includes a base table 161, a semiconductor laser device 162 according to the present invention which is set on the base table 161, a coupling lens 163, a beam splitter 165, a disc 166, and a photodetector 167 for detecting collected light. The optical information reproduction apparatus 1600 operates as follows. Laser light emitted by the semiconductor laser device 162 is converted into parallel light or generally parallel light by the coupling lens 163 and then collected on an information recording face of the disc 166 through the beam splitter 165. The information recording face of the disc 166 has bit information written thereon in the form of concave and convex portions, by magnetic modulation, or refractive index modulation. The collected laser light is reflected by the disc 166, branched by the beam splitter 165 and collected by the photodetector 167. The photodetector 167 converts a signal optically detected into an electric signal. Thus, the recorded information is read.

The optical information reproduction apparatus 1600 can eliminate the shaping prism which is necessary in the conventional optical information reproduction apparatus for converting the elliptical spot of a light beam into a circular spot. Thus, the optical information reproduction apparatus 1600 is reduced in size.

In the conventional optical information reproduction apparatus including the shaping prism, when the light is transmitted through the shaping prism, the light is also reflected by the incident surface of the shaping prism. This causes a loss in strength of the laser light. Since the strength of light required by the photodetector is constant, the driving power of the semiconductor laser device is increased to compensate for the loss. By contrast, the optical information reproduction apparatus 1600 can eliminate the shaping prism and therefore can reduce the required driving power.

The present invention has been described with reference to the illustrative examples, but the present invention is not limited to these examples. In the above examples, the semiconductor laser devices include a low temperature growth buffer layer formed of n-GaN. Alternatively, the low temperature growth buffer layer may be formed of GaN deposited by introducing $SiH_4$ at a flow rate of 0 mol. Still alternatively, the low temperature growth buffer layer may be formed of AlGaInN containing Al or In.

In the above examples, the n-buffer layer is formed of $n\text{-}In_rGa_{1-r}N$, but may instead be formed of another material.

In the above examples, the semiconductor laser device includes an n-GaN layer, an n-optical waveguide layer, a p-carrier block layer, and a p-optical waveguide layer. These layers may be replaced with layers formed of other nitride semiconductor materials.

In the above examples, the stripe ridge for confining light in the horizontal direction is formed by performing etching to a level in the first p-cladding layer. Depending on the combination of the compositions of the nitride semiconductor layers, the stripe ridge may be formed by performing etching until a level in the second p-cladding layer or a level in the p-optical waveguide layer, as long as the FAHM value for the horizontal FFP $\Theta\|$ is 6 degrees to 10 degrees.

In the above examples, each semiconductor layer is not limited to be formed of the above-described material. Usable materials instead of $Al_xIn_yGa_{1-x-y}N$ ($0 \leq x, y \leq 1$) may have, for example, a hexagonal crystal structure in which a part (about 20% or less) of the group III element is replaced with B, Cr, V, Ti, Nb, Ta, Zr, Sc, Tl, Gd, La or the like; or a hexagonal crystal structure in which a part (about 20% or less) of the N element is replaced with P, As, Sb or the like. Alternatively, a multiple layer structure formed of the hexagonal crystal structure may include a layer formed of a material having a different structure. Still alternatively, each semiconductor layer may contain B, Al, In, Tl, P, As, Sb, Be, Mg, Cd, Zn, C, Si, Ge, Sn, O, S, Se, Te, H, Sc, Cu, Fe, Ti, V, Cr, Y, Zr, Nb, lanthanoide or the like.

The semiconductor layers in each example of the present invention preferably have a hexagonal crystal structure which can be stably grown, but are not limited to this.

As described above, according to the present invention, the full angle of half maximum in the perpendicular direction $\Theta\perp$ can be decreased without decreasing the confinement factor for the active layer in the perpendicular direction $\Gamma\perp$. Therefore, a nitride semiconductor laser device improving the ellipticity of the light spot while suppressing the increase in the driving power is provided.

In one embodiment of the present invention, the variance in the full angle of half maximum in the perpendicular direction $\Theta\perp$ and the driving power is restricted, and thus the production yield of the nitride semiconductor laser devices is improved.

In another embodiment of the present invention, when a cladding layer contains AlGaN, the reliability and the production yield of the nitride semiconductor laser devices are improved, without increasing the driving power by setting the confinement factor for the active layer in the perpendicular direction $\Gamma\perp$ and the confinement factor for the active layer in the horizontal direction $\Gamma\|$ at desirable values.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride semiconductor laser device, comprising:
   a first-conductivity-type cladding layer formed of a nitride semiconductor material;
   an active layer formed of a nitride semiconductor material; and
   a second-conductivity-type cladding layer formed of a nitride semiconductor material,
   wherein:
   the first-conductivity-type cladding layer includes a layer having a total thickness having a range larger than 0.4 $\mu$m and less than 1.15 $\mu$m and formed of a material having a refractive index lower than at least an effective refractive index of a laser oscillation mode,
   the layer having a total thickness having a range larger than 0.4 $\mu$m and less than 1.15 $\mu$m in the first-conductivity-type cladding layer includes at least a first-conductivity-type first cladding layer and a first-conductivity-type second cladding layer which have different compositions from each other, and
   the first-conductivity-type first cladding layer has a refractive index lower than the refractive index of the first-conductivity-type second cladding layer.

2. A nitride semiconductor laser device according to claim 1, wherein a distance between the first-conductivity-type first cladding layer and the active layer is 0.05 $\mu$m or more and 0.24 $\mu$m or less in a thickness direction of the nitride semiconductor laser device.

3. A nitride semiconductor laser device according to claim 2, further comprising a first-conductivity-type contact layer formed of a nitride semiconductor material provided on the second main surface of the first-conductivity-type cladding layer, wherein the first-conductivity-type contact layer has a refractive index higher than the effective refractive index of the laser oscillation mode and is formed of a material which is transmissive with respect to light having a laser oscillation wavelength of the laser oscillation mode.

4. A nitride semiconductor laser device according to claim 2, wherein a distance between the first-conductivity-type second cladding layer and the active layer is 0.34 $\mu$m or less in a thickness direction of the nitride semiconductor laser device.

5. A nitride semiconductor laser device according to claim 2, wherein the first-conductivity-type first cladding layer has a thickness of 0.02 $\mu$m or more and 0.15 $\mu$m or less.

6. A nitride semiconductor laser device according to claim 2, wherein the first-conductivity-type second cladding layer has an Al content which is 0.03 or more and 0.10 or less.

7. A nitride semiconductor laser device according to claim 2, comprising a horizontal direction light confinement ridge structure on the side of the first-conductivity-type cladding layer with respect to the active layer.

8. A nitride semiconductor laser device according to claim 7, wherein the first-conductivity-type first cladding layer has a flat portion and a stripe convex portion, and at least the first-conductivity-type second cladding layer is provided substantially on the entirety of a top surface of the stripe convex portion.

9. A nitride semiconductor laser device according to claim 8, further comprising a buried layer of a second conductivity type or of a high resistance so as to cover a top surface of the flat portion, side surfaces of the stripe convex portion and side surfaces of the first-conductivity-type second cladding layer, wherein the buried layer has a refractive index which is substantially equal to that of the first-conductivity-type first cladding layer.

10. A nitride semiconductor laser device according to claim 9, wherein the buried layer is formed of InGaAlN or AlGaN having substantially an equal composition of that of the first-conductivity-type first cladding layer.

11. A nitride semiconductor laser device according to claim 10, wherein the first-conductivity-type first cladding layer and first-conductivity-type second cladding layer each contain at least AlGaN.

12. A nitride semiconductor laser device according to claim 11, wherein an Al content of the first-conductivity-type first cladding layer y1, an Al content of the first-conductivity-type second cladding layer y2, and a thickness of the first-conductivity-type first cladding layer d [μm] are in the ranges of:

$0.02 \leq d \leq 0.05$; and $-0.557+11.128 \times y1-75.583 \times y1^2+224.67 \times y1^3-246.67 \times y1^4 \leq y2 \leq 0.0036+0.90169 \times y1$; and $y2 < y1 \leq 0.30$; and $0.04 \leq y2 \leq 0.15$, or $0.05 \leq d \leq 0.10$; and $y2 \leq 0.0086+0.89 \times y1$; and $y2 < y1 \leq 0.30$; and $0.04 \leq y2 \leq 0.15$, or $0.10 \leq d \leq 0.15$; and $y2 \leq 0.017974+0.90169 \times y1$; and $y2 < y1 \leq 0.30$; and $0.04 \leq y2 \leq 0.15$.

13. A nitride semiconductor laser device according to claim 12, wherein an Al content of the first-conductivity-type first cladding layer y1, an Al content of the first-conductivity-type second cladding layer y2, and a thickness of the first-conductivity-type first cladding layer d [μm] are in the ranges of:

$0.02 \leq d \leq 0.05$; and $0.030851 \times y1^{(-0.27442)} \leq y2$; and $y2 < y1 \leq 0.30$; and $0.04 \leq y2 \leq 0.15$, or $0.05 \leq d \leq 0.10$, and $0.016137 \times y1^{(-0.52323)} \leq y2 \leq 0.094234 \times y1^{(-0.35119)}$; and $y2 < y1 \leq 0.30$; and $0.04 \leq y2 \leq 0.15$, or $0.10 \leq d \leq 0.15$; and $y2 \leq 0.031792 \times y1^{(-0.95084)}$; and $y2 < y1 \leq 0.30$; and $0.04 \leq y2 \leq 0.15$.

14. A nitride semiconductor laser device according to claim 12, wherein an Al content of the first-conductivity-type first cladding layer y1, an Al content of the first-conductivity-type second cladding layer y2, and a thickness of the first-conductivity-type first cladding layer d are in the ranges of:

$0.05 \leq d \leq 0.15$; and $0.04 \leq y1 \leq 0.08$; and $0.10 \leq y2 \leq 0.20$.

15. A nitride semiconductor laser device according to claim 2, wherein:

the second-conductivity-type cladding layer has a third main surface and a fourth main surface, the third main surface being closer to the active layer than the fourth main surface, and includes a second-conductivity-type first cladding layer and a second-conductivity-type second cladding layer having a different composition from that of the second-conductivity-type first cladding layer, which are provided in this order from the third main surface of the second-conductivity-type cladding layer, and the second-conductivity-type first cladding layer has a refractive index lower than that of the second-conductivity-type second cladding layer.

16. A nitride semiconductor laser device according to claim 15, wherein a distance between the second-conductivity-type first cladding layer and the active layer is 0.05 μm or more and 0.24 μm or less in a thickness direction of the nitride semiconductor laser device.

17. A nitride semiconductor laser device according to claim 16, wherein a distance between the second-conductivity-type second cladding layer and the active layer is 0.34 μm or less in a thickness direction of the nitride semiconductor laser device.

18. A nitride semiconductor laser device according to claim 16, wherein the second-conductivity-type first cladding layer has a thickness of 0.02 μm or more and 0.15 μm or less.

19. A nitride semiconductor laser device according to claim 16, wherein the second-conductivity-type first cladding layer and the second-conductivity-type second cladding layer each contain at least AlGaN.

20. A nitride semiconductor laser device according to claim 19, wherein an Al content of the second-conductivity-type first cladding layer x1, an Al content of the second-conductivity-type second cladding layer x2, and a thickness of the second-conductivity-type first cladding layer d' are in the ranges of:

$0.02 \leq d' \leq 0.05$; and $-0.557+11.128 \times x1-75.583 \times x1^2$; and $+224.67 \times x1^3-246.67 \times x1^4 \leq x2 \leq 0.0036+0.90169 \times x1$; and $x2 < x1 \times 0.30$; and $0.04 \leq x2 \leq 0.15$, or $0.05 \leq d' \leq 0.10$; and $x2 \leq 0.0086 + 0.89 \times x1$; and $x2 < x1 \leq 0.30$; and $0.04 \leq x2 \leq 0.15$, or $0.10 \leq d' \leq 0.15$; and $x2 \leq 0.017974 + 0.90169 \times x1$; and $x2 < x1 \leq 0.30$; and $0.04 \leq x2 \leq 0.15$.

21. A nitride semiconductor laser device according to claim 20, wherein an Al content of the second-conductivity-type first cladding layer x1, an Al content of the second-conductivity-type second cladding layer x2, and a thickness of the second-conductivity-type first cladding layer d' are in the ranges of:

$0.02 \leq d' \leq 0.05$; and $0.030851 \times x1^{(-0.27442)} \times x2$; and $x2 < x1 \leq 0.30$; and $0.04 \leq x2 \leq 0.15$, or $0.05 \leq d' \leq 0.10$; and $0.016137 \times x1^{(-0.52323)} \leq x2 \leq 0.094234 \times x1^{(-0.35119)}$; and $x2 < x1 \leq 0.30$; and $0.04 \leq x2 \leq 0.15$, or $0.10 \leq d' \leq 0.15$; and $x2 \leq 0.031792 \times x1^{(-0.95084)}$; and $x2 < x1 \leq 0.30$; and $0.04 \leq x2 \leq 0.15$.

22. A nitride semiconductor laser device according to claim 20, wherein an Al content of the second-conductivity-type first cladding layer x1, an Al content of the second-conductivity-type second cladding layer x2, and a thickness of the second-conductivity-type first cladding layer d' are in the ranges of:

$0.05 \leq d' \leq 0.15$; and $0.04 \leq x1 \leq 0.08$; and $0.10 \leq x2 \leq 0.20$.

23. An optical information reproduction apparatus for reproducing information recorded on an optical disc having an information recording surface, by converting light which is emitted by a light source to the optical disc and then reflected by the optical disc, the optical information reproduction apparatus comprising a nitride semiconductor laser device according to claim 1 as a light source.

24. A nitride semiconductor laser device, comprising:
a first-conductivity-type cladding layer formed of a nitride semiconductor material;
an active layer formed of a nitride semiconductor material; and
a second-conductivity-type cladding layer formed of a nitride semiconductor material,
wherein:
the first-conductivity-type cladding layer includes a layer having a total thickness having a range larger than 0.4 μm and less than 1.15 μm and formed of a material having a refractive index lower than at least an effective refractive index of a laser oscillation mode, and
the second-conductivity-type cladding layer includes an area having a refractive index which decreases continuously towards the active layer.

25. A nitride semiconductor laser device, comprising:
a first-conductivity-type cladding layer formed of a nitride semiconductor material;
an active layer formed of a nitride semiconductor material; and
a second-conductivity-type cladding layer formed of a nitride semiconductor material,
wherein:
the first-conductivity-type cladding layer includes a layer having a total thickness having a range larger than 0.4 μm and less than 1.15 μm and formed of a material having a refractive index lower than at least an effective refractive index of a laser oscillation mode, and
a portion disposed within the first-conductivity-type cladding layer or the whole portion of the first-conductivity-type cladding layer is formed as a super-lattice construction, and within boundary planes of multi-layer films constituting the super-lattice construction, there exists a combination of two planes in which a first plane has an average value of refractive index of upper and lower layers disposed in the boundary planes which is smaller than a refractive index of a second plane which is farther from the active layer than the first plane.

* * * * *